United States Patent
Kim et al.

(10) Patent No.: US 9,634,259 B2
(45) Date of Patent: Apr. 25, 2017

(54) CONDENSED CYCLIC COMPOUND AND ORGANIC LIGHT-EMITTING DEVICE INCLUDING THE SAME

(71) Applicants: SAMSUNG DISPLAY CO., LTD., Yongin, Gyeonggi-Do (KR); PUSAN NATIONAL UNIVERSITY INDUSTRY-UNIVERSITY COOPERATION FOUNDATION, Busan (KR)

(72) Inventors: Sung-Wook Kim, Yongin (KR); Myeong-Suk Kim, Yongin (KR); Jin-Soo Hwang, Yongin (KR); Sam-Il Kho, Yongin (KR); Hong-Suk Suh, Busan (KR)

(73) Assignees: Samsung Display Co., Ltd., Yongin-si (KR); Pusan National University Industry—University Cooperation Foundation, Busan (KR)

( * ) Notice: Subject to any disclaimer, the term of this patent is extended or adjusted under 35 U.S.C. 154(b) by 249 days.

(21) Appl. No.: 14/444,895

(22) Filed: Jul. 28, 2014

(65) Prior Publication Data

US 2015/0263289 A1 Sep. 17, 2015

(30) Foreign Application Priority Data

Mar. 11, 2014 (KR) ........................ 10-2014-0028597

(51) Int. Cl.
*H01L 51/00* (2006.01)
*H01L 51/50* (2006.01)

(52) U.S. Cl.
CPC ...... *H01L 51/0071* (2013.01); *H01L 51/0072* (2013.01); *H01L 51/006* (2013.01); *H01L 51/5056* (2013.01)

(58) Field of Classification Search
None
See application file for complete search history.

(56) References Cited

U.S. PATENT DOCUMENTS

| | | |
|---|---|---|
| 2008/0262183 A1 | 10/2008 | Lehmann |
| 2010/0117520 A1 | 5/2010 | Begley et al. |
| 2011/0177007 A1 | 7/2011 | Rajagopalan et al. |
| 2012/0080670 A1 | 4/2012 | Park et al. |
| 2012/0305082 A1 | 12/2012 | Moon et al. |

FOREIGN PATENT DOCUMENTS

| | | |
|---|---|---|
| JP | 2013-512985 A | 4/2013 |
| KR | 10-2010-0122798 A | 11/2010 |
| KR | 10-2013-0067177 A | 6/2013 |
| KR | 10-2013-0079237 A | 7/2013 |
| KR | 10-2013-0086757 A | 8/2013 |

*Primary Examiner* — J. L. Yang
(74) *Attorney, Agent, or Firm* — Lewis Roca Rothgerber Christie LLP

(57) ABSTRACT

A condensed cyclic compound is represented by Formula 1, and an organic light-emitting device includes the condensed cyclic compound. The organic light-emitting device includes a first electrode, a second electrode facing the first electrode, and an organic layer. The organic layer includes an emission layer and the condensed-cyclic compound.

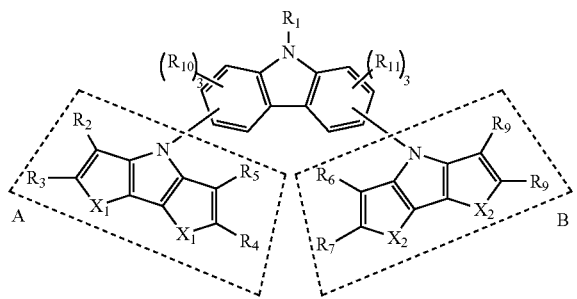

Formula 1

20 Claims, 1 Drawing Sheet

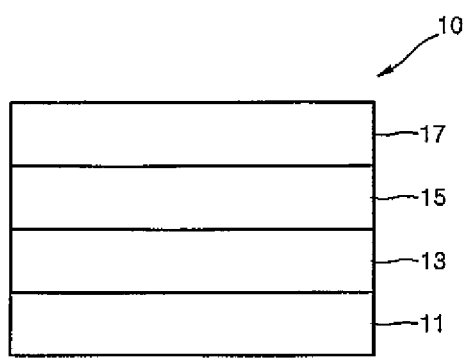

CONDENSED CYCLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2014-0028597, filed on Mar. 11, 2014, in the Korean Intellectual Property Office, the entire content of which is incorporated herein by reference.

BACKGROUND

1. Field

One or more embodiments of the present invention relate to a condensed cyclic compound and an organic light-emitting device including the same.

2. Description of the Related Art

Organic light-emitting devices (OLEDs) are self-emission devices that have wide viewing angles, high contrast ratios, short response times, and good brightness, driving voltage, and response speed characteristics. Also, OLEDs can produce full-color images.

An organic light-emitting device may include a first electrode disposed on a substrate, and a hole transport region, an emission layer, an electron transport region, and a second electrode sequentially disposed on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light. used (utilized)

SUMMARY

Aspects according to one or more embodiments of the present invention are directed toward a novel condensed cyclic compound and an organic light-emitting device including the same.

According to an embodiment of the present invention, a condensed cyclic compound is represented by Formula 1:

Formula 1

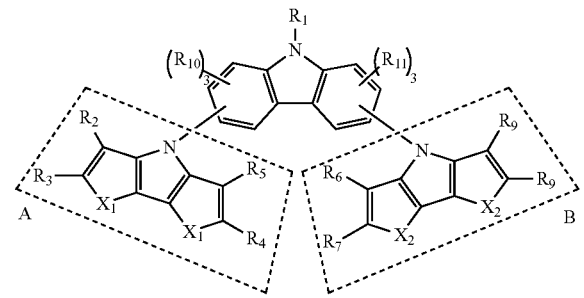

In Formula 1, $X_1$ and $X_2$ are each independently an oxygen (O) atom or a sulfur (S) atom;

$R_1$ is a $C_6$-$C_{10}$ aryl group or a $C_3$-$C_{10}$ heteroaryl group; and $R_2$ to $R_{11}$ are each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_2$-$C_{30}$ heteroaryl group, a substituted or unsubstituted $C_6$-$C_{30}$ aryloxy group, a substituted or unsubstituted $C_6$-$C_{30}$ arylthio group, or a monovalent $C_6$-$C_{30}$ non-aromatic condensed polycyclic group.

Each of the plurality of $R_{10}$s and each of the plurality of $R_{11}$s may be the same or different.

$R_2$ and $R_3$, $R_4$ and $R_5$, $R_6$ and $R_7$, $R_5$ and $R_9$, or two $R_{10}$s may optionally combine to form a substituted or unsubstituted $C_4$-$C_{10}$ ring, which may be condensed.

At least one substituent of the substituted $C_1$-$C_{10}$ alkyl group, substituted $C_2$-$C_{10}$ alkenyl group, substituted $C_2$-$C_{10}$ alkynyl group, substituted $C_1$-$C_{10}$ alkoxy group, substituted $C_3$-$C_{10}$ cycloalkyl group, substituted $C_3$-$C_{10}$ cycloalkenyl group, substituted $C_3$-$C_{10}$ heterocycloalkyl group, substituted $C_3$-$C_{10}$ heterocycloalkenyl group, substituted $C_6$-$C_{30}$ aryl group, substituted $C_2$-$C_{30}$ heteroaryl group, substituted $C_6$-$C_{30}$ aryloxy group, and substituted $C_6$-$C_{30}$ arylthio group may be:

a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, or a $C_1$-$C_{10}$ alkoxy group; or a $C_1$-$C_{10}$ alkyl group, a $C_2$-$C_{10}$ alkenyl group, a $C_2$-$C_{10}$ alkynyl group, or a $C_1$-$C_{10}$ alkoxy group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, $C_6$-$C_{30}$ arylthio group, a monovalent $C_6$-$C_{30}$ non-aromatic condensed polycyclic group, —N($Q_{11}$)($Q_{12}$), —Si($Q_{13}$)($Q_{14}$)($Q_{15}$), or —B($Q_{16}$)($Q_{17}$); or a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, or a monovalent $C_2$-$C_{30}$ non-aromatic condensed polycyclic group; or a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, or a monovalent $C_6$-$C_{30}$ non-aromatic condensed polycyclic group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, a monovalent $C_6$-$C_{30}$ non-aromatic condensed polycyclic group, —N($Q_{21}$)($Q_{22}$), —Si($Q_{23}$)($Q_{24}$)($Q_{25}$), or —B($Q_{26}$)($Q_{27}$); or —Si($Q_{31}$)($Q_{32}$)($Q_{33}$) or —B($Q_{34}$)($Q_{35}$).

In the above substituents, $Q_{11}$ to $Q_{17}$, $Q_{21}$ to $Q_{27}$, and $Q_{31}$ to $Q_{35}$ are each independently a hydrogen, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, or a monovalent $C_6$-$C_{30}$ non-aromatic condensed polycyclic group.

According to another embodiment of the present invention, an organic light-emitting device includes: a first electrode; a second electrode facing the first electrode; and an organic layer between the first and second electrodes and including an emission layer. The organic layer includes at least one condensed cyclic compound described above.

BRIEF DESCRIPTION OF THE DRAWING

These and/or other aspects will become apparent and more readily appreciated from the following description of the embodiments, taken in conjunction with the drawing, which is a schematic view of an organic light-emitting device according to an embodiment of the present invention.

DETAILED DESCRIPTION

Reference will now be made to certain embodiments, examples of which are illustrated in the accompanying drawing, where like reference numerals refer to like elements throughout. In this regard, the presented embodiments may take different forms and should not be construed as being limited to the descriptions set forth herein. Accordingly, the presented embodiments are described below by reference to the drawing to explain certain aspects of the present description. Expressions such as "at least one of," when preceding a list of elements, modify the entire list of elements and do not modify the individual elements of the list. Further, the use of "may" when describing embodiments of the present invention refers to "one or more embodiments of the present invention."

A condensed compound according to an embodiment of the present invention is represented by Formula 1 below:

Formula 1

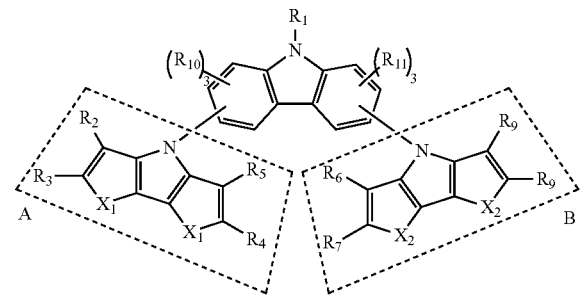

In Formula 1, $X_1$ and $X_2$ are each independently an oxygen atom (O) or a sulfur (S) atom;

$R_1$ is a $C_6$-$C_{10}$ aryl group or a $C_3$-$C_{10}$ heteroaryl group; and $R_2$ to $R_{11}$ are each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_2$-$C_{30}$ heteroaryl group, a substituted or unsubstituted $C_6$-$C_{30}$ aryloxy group, a substituted or unsubstituted $C_6$-$C_{30}$ arylthio group, or a monovalent $C_6$-$C_{30}$ non-aromatic condensed polycyclic group.

Each of the plurality of $R_{10}$s and each of the plurality of $R_{11}$s may be the same or different;

$R_2$ and $R_3$, $R_4$ and $R_5$, $R_6$ and $R_7$, $R_8$ and $R_9$, or two $R_{10}$s may optionally combine to form a substituted or unsubstituted $C_4$-$C_{10}$ ring, which may be condensed.

At least one substituent of the substituted $C_1$-$C_{10}$ alkyl group, substituted $C_2$-$C_{10}$ alkenyl group, substituted $C_2$-$C_{10}$ alkynyl group, substituted $C_1$-$C_{10}$ alkoxy group, substituted $C_3$-$C_{10}$ cycloalkyl group, substituted $C_3$-$C_{10}$ cycloalkenyl group, substituted $C_3$-$C_{10}$ heterocycloalkyl group, substituted $C_3$-$C_{10}$ heterocycloalkenyl group, substituted $C_6$-$C_{30}$ aryl group, substituted $C_2$-$C_{30}$ heteroaryl group, substituted $C_6$-$C_{30}$ aryloxy group, or substituted $C_6$-$C_{30}$ arylthio group may be:

a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, or a $C_1$-$C_{10}$ alkoxy group; or a $C_1$-$C_{10}$ alkyl group, a $C_2$-$C_{10}$ alkenyl group, a $C_2$-$C_{10}$ alkynyl group, or a $C_1$-$C_{10}$ alkoxy group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_5$-$C_{30}$ aryl group, a $C_2$-$C_{30}$ heteroaryl group, a $C_6$-$C_{30}$ aryloxy group, a $C_6$-$C_{30}$ arylthio group, a monovalent $C_6$-$C_{30}$ non-aromatic condensed polycyclic group, —N($Q_{11}$)($Q_{12}$), —Si($Q_{13}$)($Q_{14}$)($Q_{15}$), or —B($Q_{16}$)($Q_{17}$); or a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, or a monovalent $C_2$-$C_{30}$ non-aromatic condensed polycyclic group; or a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, or a monovalent $C_6$-$C_{30}$ non-aromatic condensed polycyclic group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, a alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, a monovalent $C_6$-$C_{30}$ non-aromatic condensed polycyclic group, —N($Q_{21}$)($Q_{22}$), —Si($Q_{23}$)($Q_{24}$)($Q_{25}$), or —B($Q_{26}$)($Q_{27}$); or —Si($Q_{31}$)($Q_{32}$)($Q_{33}$) Or —B($Q_{34}$)($Q_{35}$).

In the above substituents, $Q_{11}$ to $Q_{17}$, $Q_{21}$ to $Q_{27}$, and $Q_{31}$ to $Q_{35}$ are each independently a hydrogen, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, or a monovalent $C_6$-$C_{30}$ non-aromatic condensed polycyclic group.

In the above substituents, $R_1$ may be a phenyl group, a naphthyl group, a pyridyl group, or a triazinyl group.

For example, in some embodiments, $R_1$ may be represented by one of Formulae 2A to 2E below:

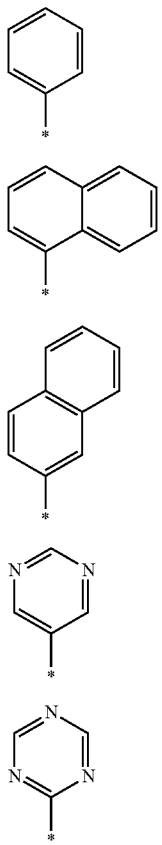

In some embodiments, $R_2$ to $R_{11}$ may be each independently:
a hydrogen, a methyl group, an ethyl group, a propyl group, a butyl group, a pentyl group, a hexyl group, a heptyl group, an octyl group, a nonyl group, a decyl group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a pyridoindolyl group, a dibenzofuryl group, a phenanthridinyl group, a benzoquinolyl group, a phenazinyl group, a dibenzosilolyl group, a dibenzothiophenyl group, a benzocarbazolyl group, or a dibenzacridinyl group; or a methyl group, an ethyl group, a propyl group, a butyl group, a pentyl group, a hexyl group, a heptyl group, an octyl group, a nonyl group or a decyl group, substituted with at least one of a deuterium, a halogen atom, a hydroxyl group, a cyano group, a nitro group, or an amino group; or a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group, each substituted with at least one of a deuterium, a halogen atom, a hydroxyl group, a cyano group, a nitro group, an amino group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_4$-$C_{30}$ heteroaryl group, a $C_6$-$C_{30}$ aryloxy group, a $C_6$-$C_{30}$ arylthio group, or —Si($Q_{31}$)($Q_{32}$)($Q_{33}$) (where, $Q_{31}$ to $Q_{33}$ are each independently a hydrogen, a $C_1$-$C_{10}$ alkyl group, a $C_1$-$C_{10}$ alkoxy group, or a $C_6$-$C_{20}$ aryl group).

For example, in some embodiments, $R_2$ to $R_{11}$ may be each independently:

a hydrogen, a methyl group, an ethyl group, a propyl group, a butyl group, a phenyl group, a naphthyl group, a fluorenyl group, an anthryl group, a pyrenyl group, a chrysenyl group or a triphenylenyl group; or a methyl group, an ethyl group, a propyl group, a butyl group, a phenyl group, a naphthyl group, a fluorenyl group, an anthryl group, a pyrenyl group, a chrysenyl group or a triphenylenyl group, substituted with at least one of a deuterium, a halogen atom, a hydroxyl group, a cyano group, a nitro group, or an amino group. In some embodiments, $R_2$ and $R_3$, $R_4$ and $R_5$, $R_6$ and $R_7$, $R_8$ and $R_9$, or two $R_{10}$s may optionally combine to form a substituted or unsubstituted benzene ring.

In Formula 1, Substituent A and Substituent B (represented by the dotted lines) may be each independently represented by one of Formulae 3A to 3E below:

3A
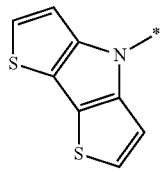

3B
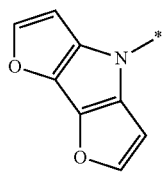

3C
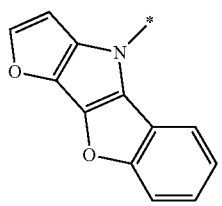

3D
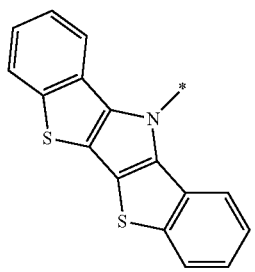

3E
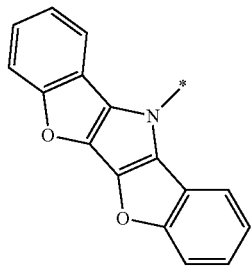

In some embodiments, $X_1$ and $X_2$ may be identical to each other.

In some embodiments, the condensed cyclic compound represented by Formula 1 may be represented by one of Formulae 1-1 to 1-3 below:

Formula 1-1
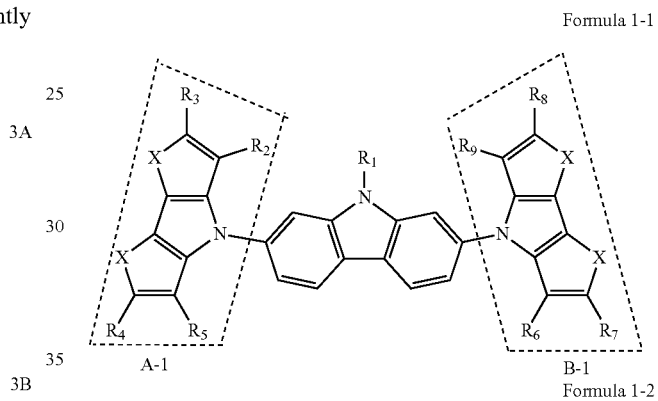

Formula 1-2
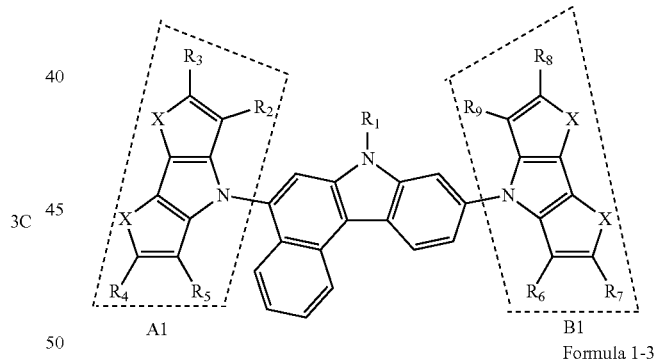

Formula 1-3
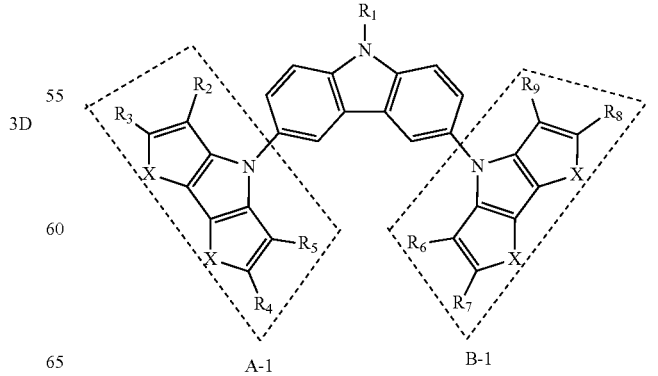

In Formulae 1-1 to 1-3, X is an oxygen (O) atom or a sulfur (S) atom, and $R_1$ to $R_9$ are the same as defined above with respect to Formula 1.

For example, in some embodiments, $R_1$ may be a phenyl group, a naphthyl group, a pyridyl group, or a triazinyl group. For example, $R_1$ may be represented by one of Formulae 2A to 2E below:

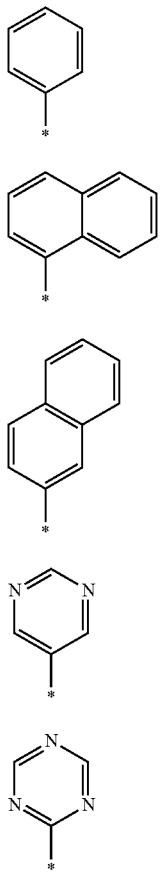

2A

2B

2C

2D

2E

In some embodiments, $R_2$ to $R_9$ may be each independently:

a hydrogen, a methyl group, an ethyl group, a propyl group, a butyl group, a phenyl group, a naphthyl group, a fluorenyl group, an anthryl group, a pyrenyl group, a chrysenyl group or a triphenylenyl group; or a methyl group, an ethyl group, a propyl group, a butyl group, a phenyl group, a naphthyl group, a fluorenyl group, an anthryl group, a pyrenyl group, a chrysenyl group, or a triphenylenyl group, substituted with at least one of a deuterium, a halogen atom, a hydroxyl group, a cyano group, a nitro group, or an amino group. In some embodiments, $R_2$ and $R_3$, $R_4$ and $R_5$, $R_6$ and $R_7$, or $R_8$ and $R_9$ may optionally combine to form a substituted or unsubstituted benzene ring.

In Formulae 1-1 to 1-3, Substituent A1 and Substituent B1 (represented by the dotted lines) may be each independently represented by one of Formulae 3A to 3E below:

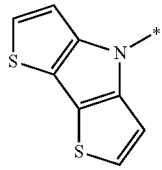

3A

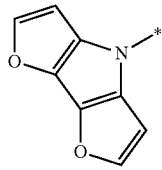

3B

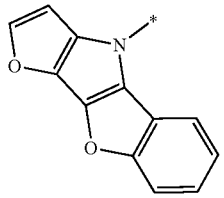

3C

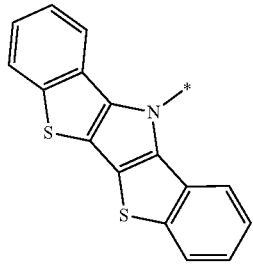

3D

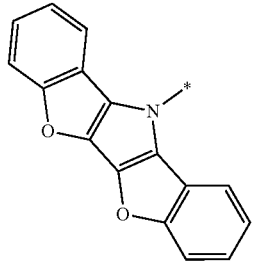

3E

In some embodiments, the condensed cyclic compound represented by Formula 1 may be one of compounds 101 to 148 below:

101

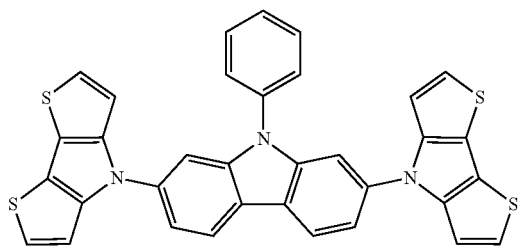

102
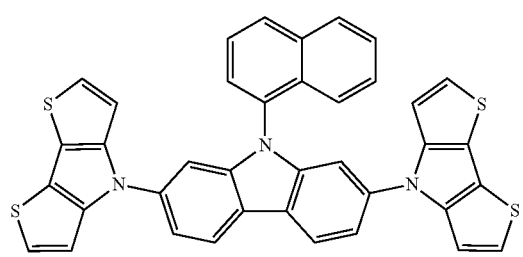
103
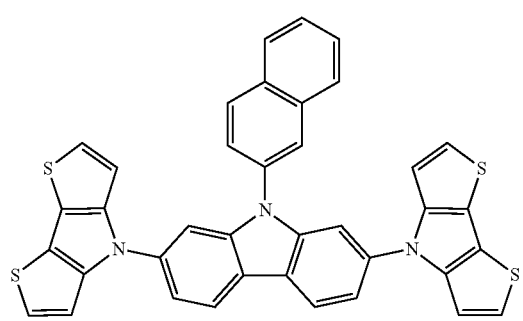
104
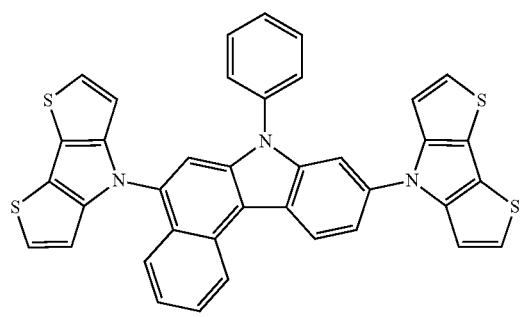
105
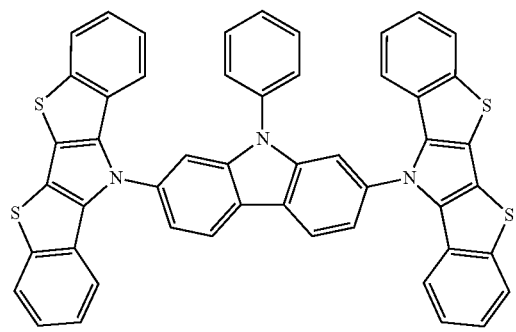
106
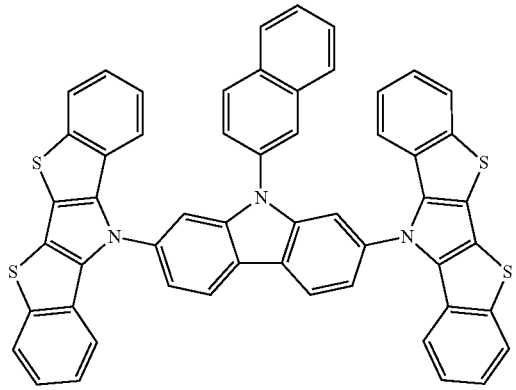
107
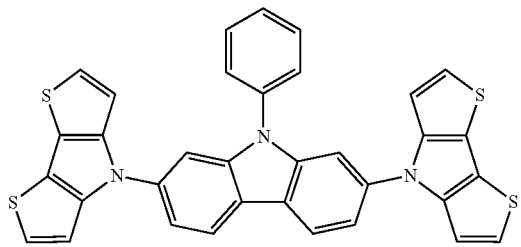
108
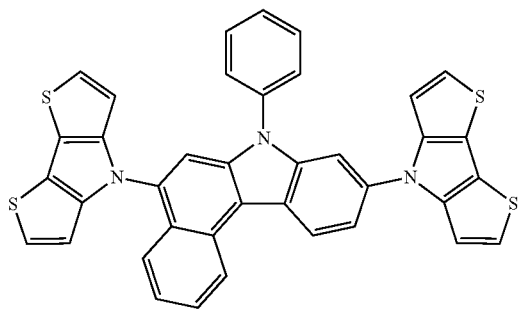
109
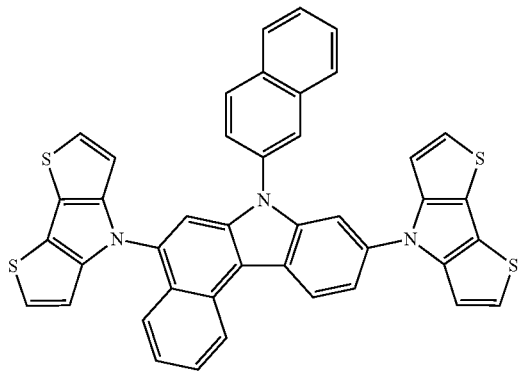

110
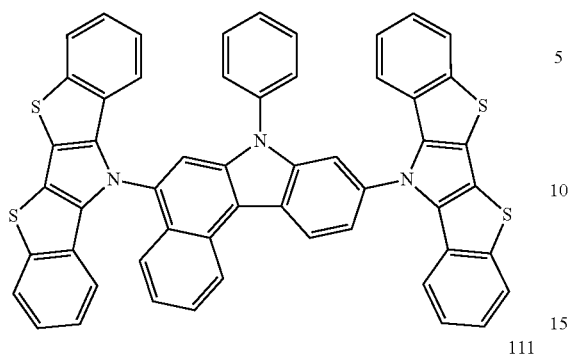
111
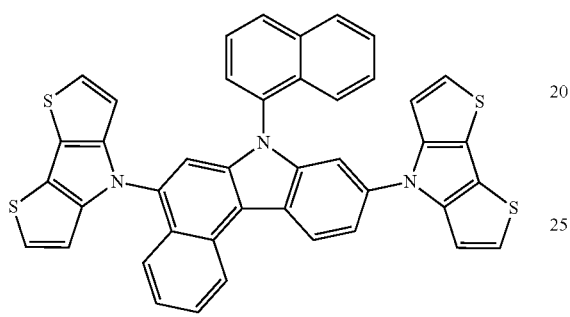
112
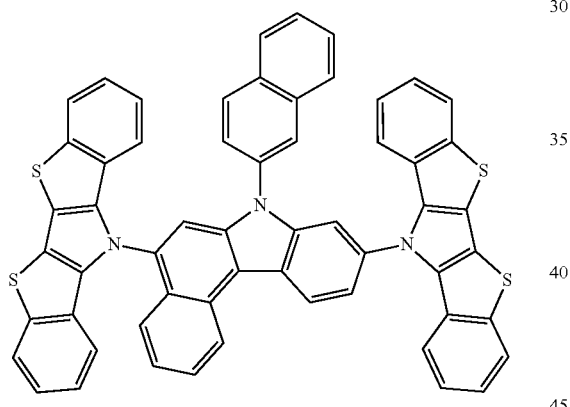
113
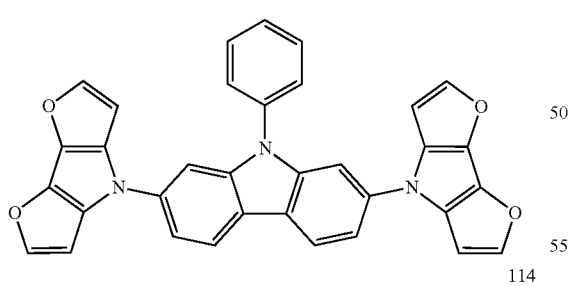
114
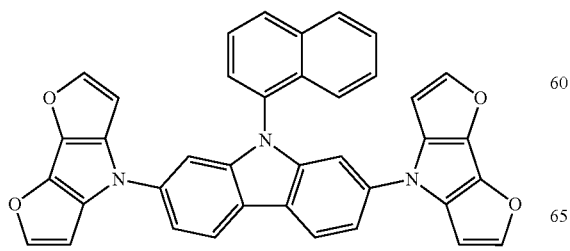
115
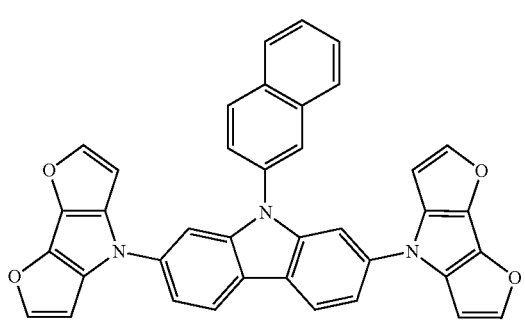
116
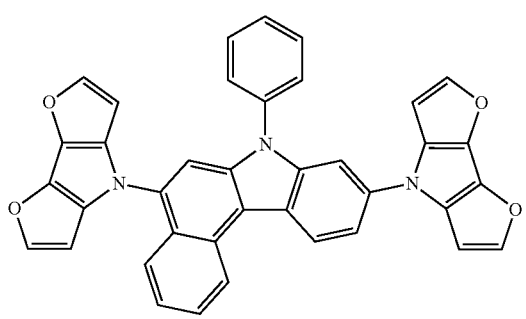
117
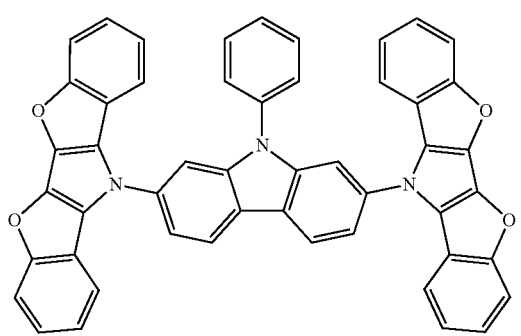
118
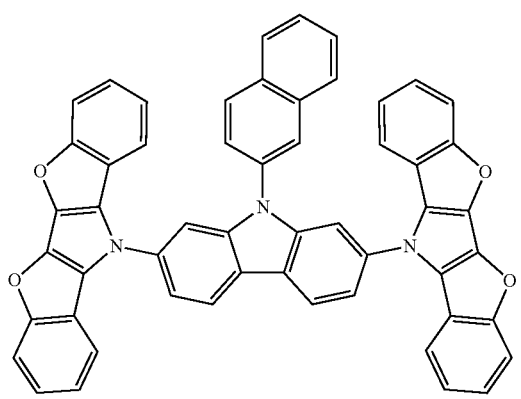

119
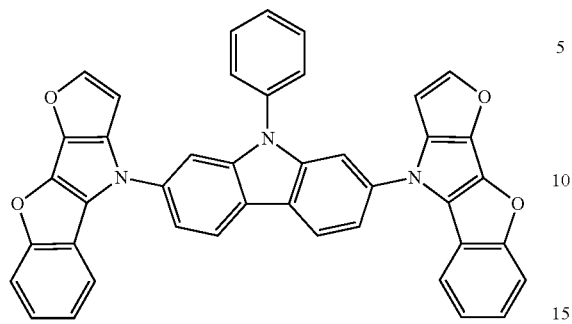
120
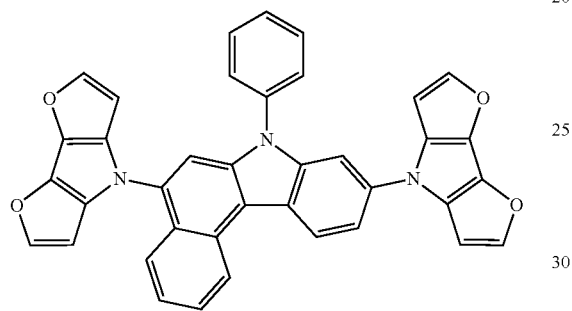
121
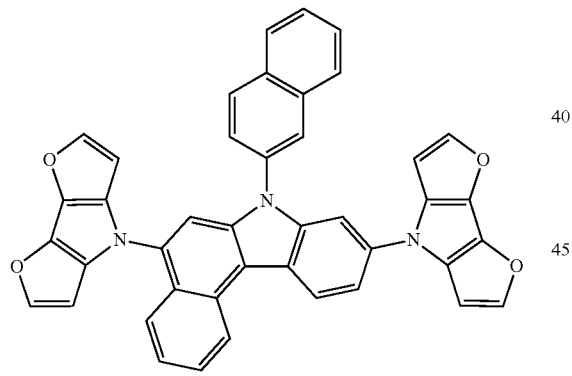
122
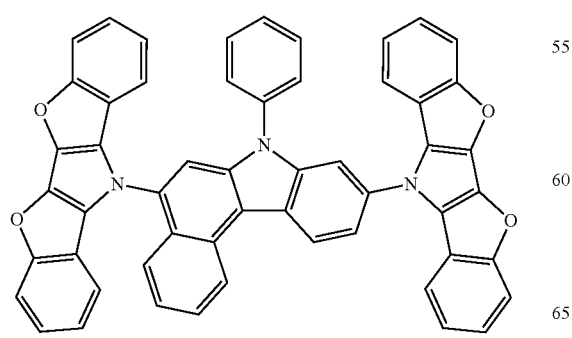
123
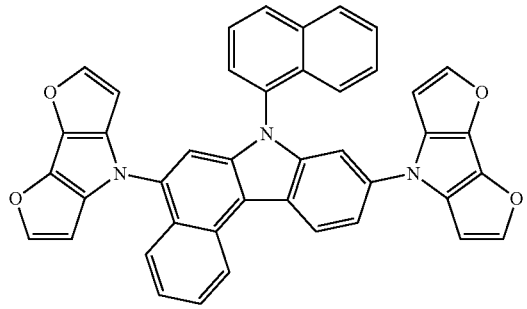
124
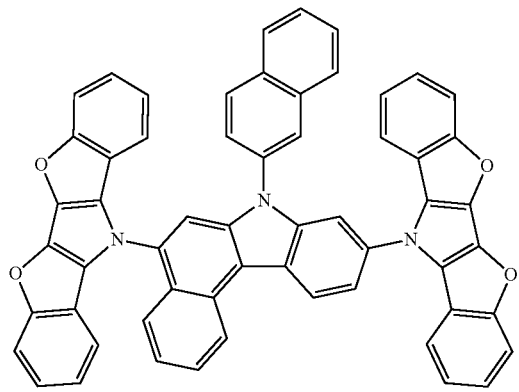
125
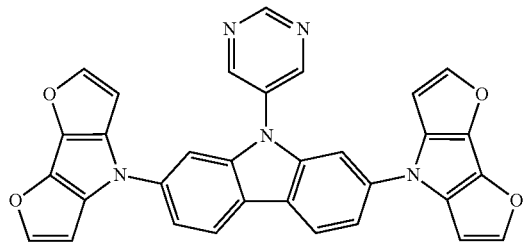
126
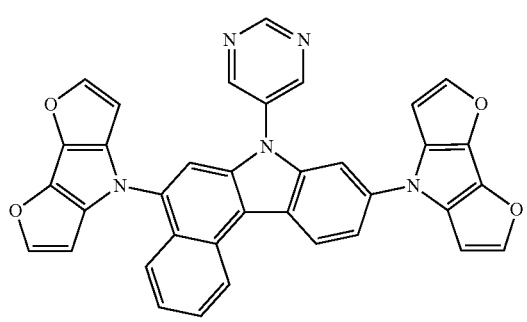
127
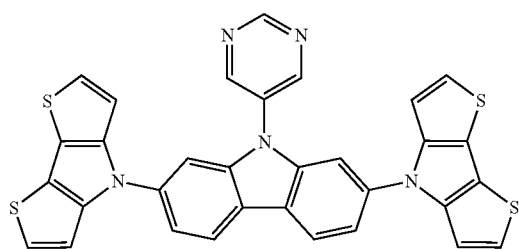

-continued
128
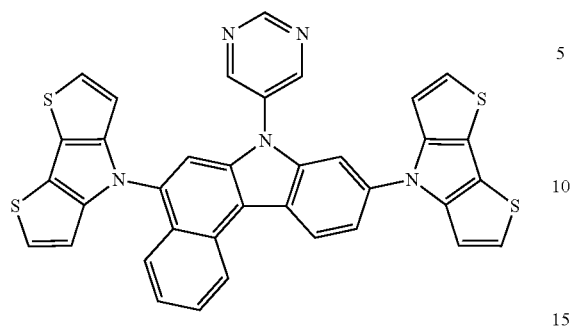
129
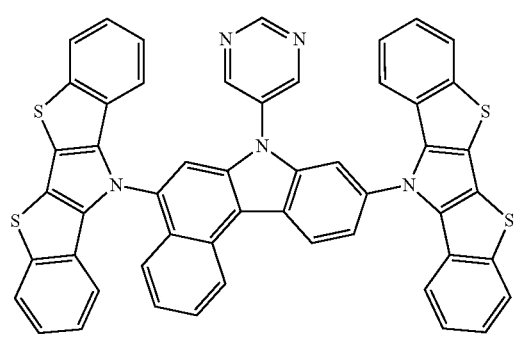
130
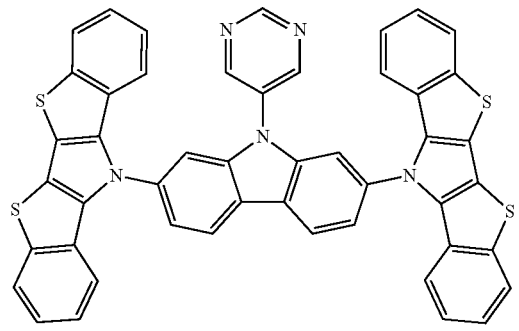
131
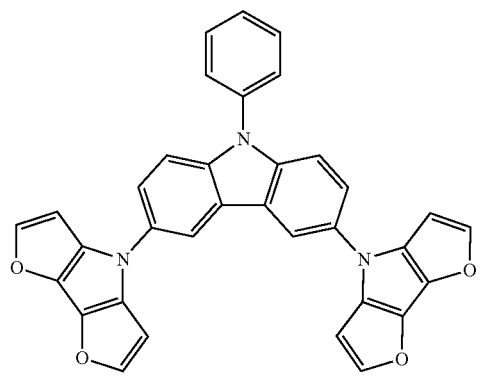
132
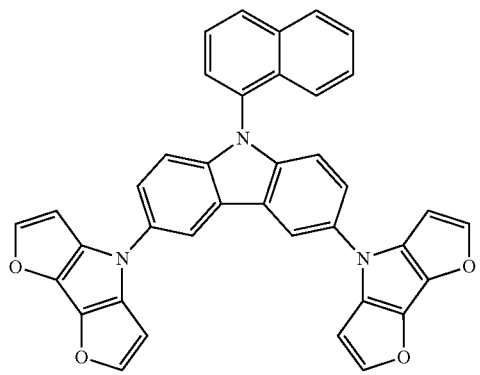
133
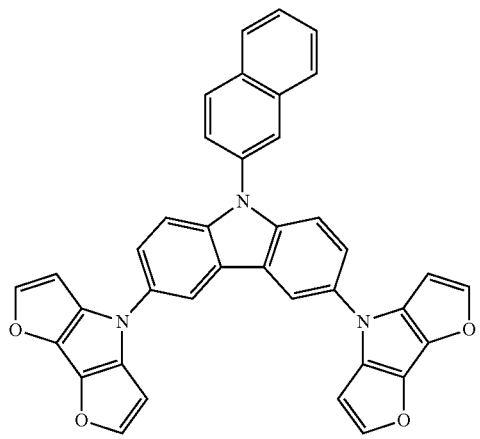
134
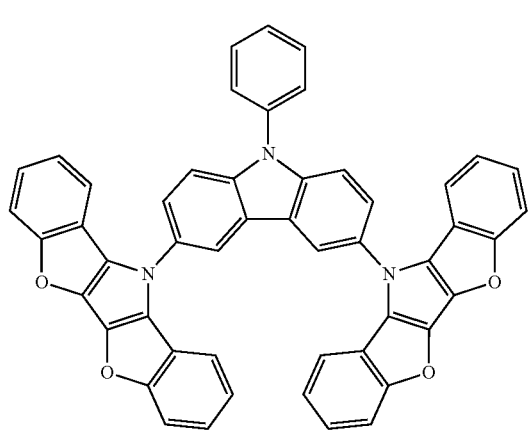
135
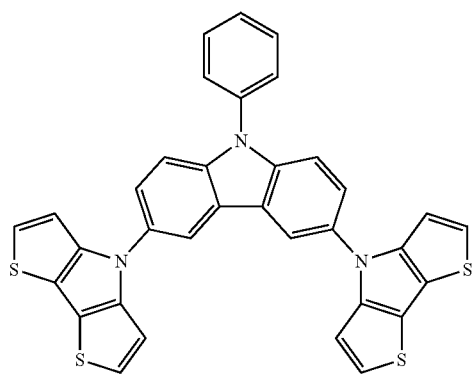

-continued
136
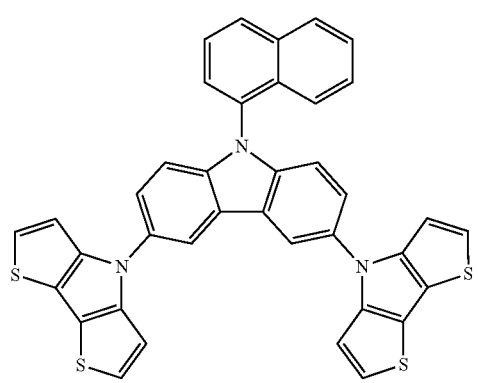
137
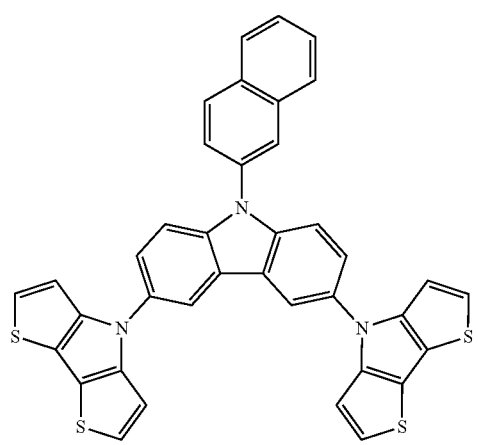
138
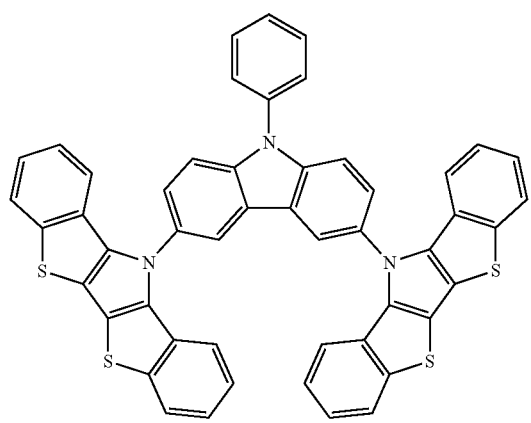
139
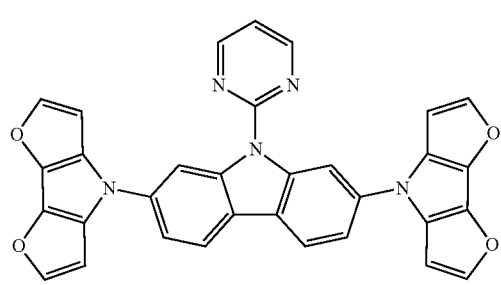
-continued
140
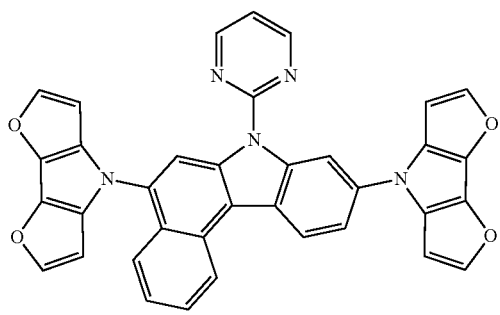
141
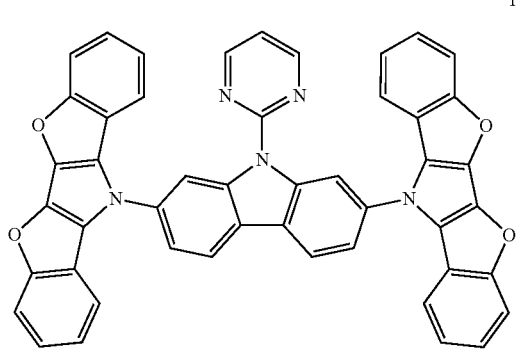
142
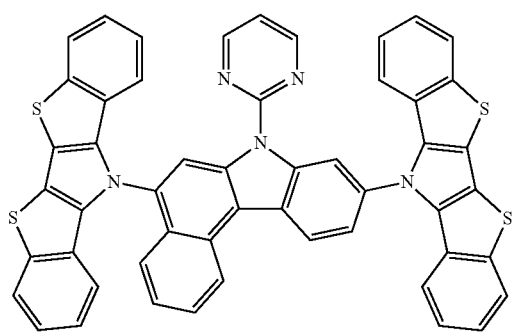
143
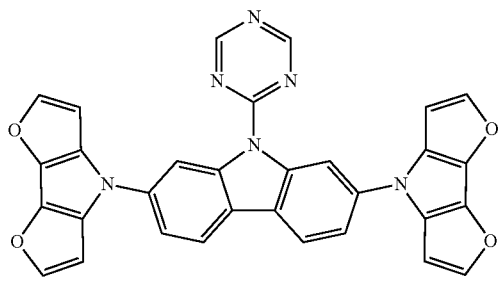

144

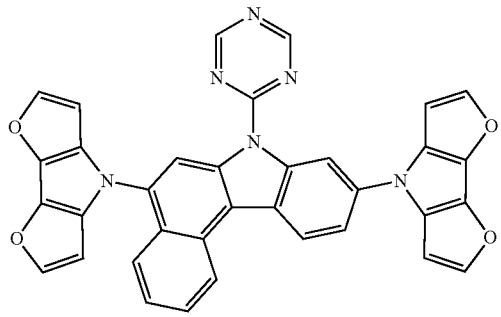

145

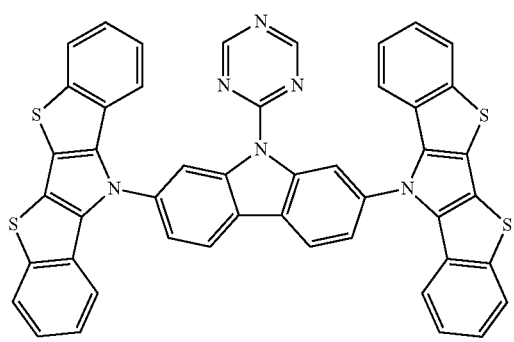

146

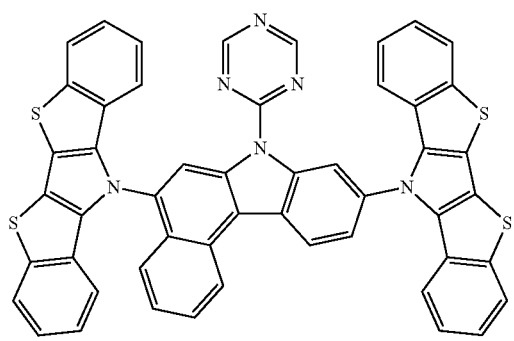

147

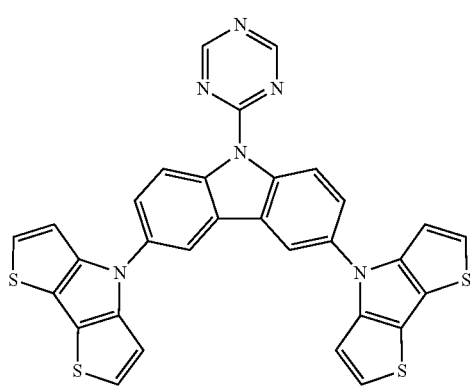

148

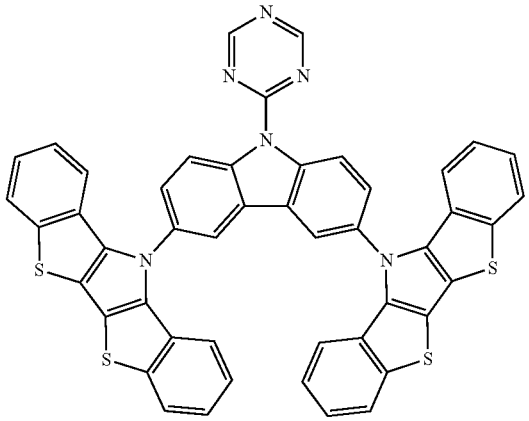

The compound represented by Formula 1 improves the transportation of holes or electrons to an emission layer due to the substituted carbazole structure, and thus may increase exciton formation efficiency as the electrons and holes bind to each other in the emission layer. At the same time, the stability and efficiency of a thin layer may be increased by inhibiting crystallization due to the inclusion of a substituent at the number 9 location of the carbazole. Thus, an organic light-emitting device including the condensed cyclic compound represented by Formula 1 may have low driving voltage, high efficiency, high brightness, and a long lifespan.

The condensed cyclic compound represented by Formula 1 may be synthesized using (utilizing) any suitable organic synthesis method. Synthesis methods for the condensed compounds represented by Formula 1 would be discernible by those of ordinary skill in the art in view of the Synthesis Examples detailed later in this disclosure.

The condensed compound of Formula 1 may be used (utilized) between a pair of electrodes of an organic light-emitting device. For example, the condensed cyclic compound may be included in an electron transport region, for example, an electron transport layer. Accordingly, an organic light-emitting device according to an embodiment of the present invention includes: a first electrode; a second electrode facing the first electrode; and an organic layer between the first and second electrodes and including an emission layer. The organic layer includes at least one of the condensed cyclic compounds represented by Formula 1 described above.

The organic layer may further include: a hole transport region between the first electrode and the emission layer; and an electron transport region between the emission layer and the second electrode. The electron transport region may include at least one of a hole blocking layer, an electron transport layer, and an electron injection layer. The hole transport region may include at least one of an electron blocking layer, a hole transport layer, and a hole injection layer.

The expression "(an organic layer) includes at least one condensed cyclic compound," as used herein, refers to the inclusion of one condensed cyclic compound (of Formula 1) in the organic layer, and the inclusion of two or more different condensed cyclic compounds (of Formula 1) in the organic layer.

For example, the organic layer may include only one type of condensed cyclic compound. Here, the one type of the compound may be included in one of the emission layer, the electron transport layer, or the hole transport layer of the organic light-emitting device. Alternatively, for example, the organic layer may include two different types of the condensed cyclic compound. Here, the two different types of the compound may be included in the same layer (for example, the two different types of the condensed cyclic compound may both be in the emission layer), or different layers (for example, one type of the compound may be in the hole transport layer, and the other type of the compound may be in the electron transport layer).

The emission layer, the hole transport region, and/or the electron transport region may include the condensed cyclic compound represented by Formula 1.

For example, the electron transport region may include the electron transport layer, and the electron transport layer may include the condensed cyclic compound represented by Formula 1.

The expression "organic layer," as used herein, refers to a single layer and/or a plurality of layers disposed between the first and second electrodes of an organic light-emitting device. A material included in the "organic layer" is not limited to an organic material.

The drawing is a schematic view of an organic light-emitting device 10 according to an embodiment of the present invention. The organic light-emitting device 10 includes a substrate 11, a first electrode 13, an organic layer 15, and a second electrode 17.

Hereinafter, the structure of an organic light-emitting device according to an embodiment of the present invention, and a method of manufacturing an organic light-emitting device according to an embodiment of the present invention, will be described by reference to the drawing.

The substrate 11 may be a glass substrate or a transparent plastic substrate, having good mechanical strength, thermal stability, transparency, surface smoothness, ease of handling, and water resistance.

The first electrode 13 may be formed by depositing or sputtering a material for forming the first electrode on the substrate 11. When the first electrode 13 is an anode, the material for the first electrode 13 may be a material with a high work function to more easily inject holes. The first electrode 13 may be a reflective electrode or a transmissive electrode. The material for the first electrode 13 may be a transparent and highly conductive material, and non-limiting examples of such a material include indium tin oxide (ITO), indium zinc oxide (IZO), tin oxide ($SnO_2$), and zinc oxide (ZnO). When the first electrode 13 is a semi-transmissive electrode or a reflective electrode, the material for forming the first electrode 13 may include at least one of magnesium (Mg), aluminum (Al), aluminum-lithium (Al—Li), calcium (Ca), magnesium-indium (Mg—In), or magnesium-silver (Mg—Ag).

The first electrode 13 may have a single-layered structure, or a multi-layered structure including two or more layers. For example, the first electrode 13 may have a three-layered structure of ITO/Ag/ITO, but the structure of the first electrode 13 is not limited thereto.

The organic layer 15 is disposed on the first electrode 13. The organic layer 15 may include an emission layer.

The organic layer 15 may further include a hole transport region between the first electrode 13 and the emission layer, and an electron transport region between the emission layer and the second electrode 17.

The hole transport region may include at least one of a hole injection layer (HIL), a hole transport layer (HTL), a buffer layer, or an electron blocking layer (EBL); and the electron transport region may include at least one of a hole blocking layer (HBL), an electron transport layer (ETL), or an electron injection layer (EIL), but the hole transport region and the electron transport region are not limited thereto.

The hole transport region may have a single-layered structure formed of a single material, a single-layered structure formed of different materials, or a multi-layered structure having a plurality of layers formed of different materials.

For example, the hole transport region may have a single-layered structure formed of different materials, a hole injection layer/hole transport layer structure, a hole injection layer/hole transport layer/buffer layer structure, a hole injection layer/buffer layer structure, a hole injection layer/buffer layer/hole transport layer structure, a hole transport layer/buffer layer structure, or a hole injection layer/hole transport layer/electron blocking layer structure, where the layers of each structure are sequentially stacked from the first electrode 13 in the stated order, but are not limited thereto.

When the hole transport region includes a hole injection layer, the hole injection layer may be formed on the first electrode 13 using (utilizing) various suitable methods, such as vacuum deposition, spin coating, casting, a Langmuir-Blodgett (LB) method, ink-jet printing, laser-printing, or laser-induced thermal imaging.

When the hole injection layer is formed by vacuum deposition, for example, the vacuum deposition may be performed at a deposition temperature of about 100 to about 500° C., at a vacuum degree of about $10^{-8}$ to about $10^{-3}$ Torr, and at a deposition rate of about 0.01 to about 100 Å/sec in consideration of the compound used for the hole injection layer, and the structure of the hole injection layer to be formed.

When the hole injection layer is formed by spin coating, the spin coating may be performed, for example, at a coating rate of about 2,000 rpm to about 5,000 rpm, and at a temperature of about 80° C. to 200° C. in consideration of the compound used for the hole injection layer, and the structure of the hole injection layer to be formed.

When the hole transport region includes a hole transport layer, the hole transport layer may be formed on the first electrode 13 or the hole injection layer using (utilizing) various suitable methods, such as vacuum deposition, spin coating, casting, an LB method, ink-jet printing, laser-printing, or laser-induced thermal imaging (LITI). When the hole transport layer is formed by vacuum deposition or spin coating, the deposition or coating conditions for the hole transport layer may be similar to the deposition or coating conditions described above for the hole injection layer.

The hole transport region may include at least one of a compound represented by Formula 1, m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (Pani/CSA), polyaniline/poly(4-styrenesulfonate) (PANI/PSS), a compound represented by Formula 201 below, or a compound represented by Formula 202 below:

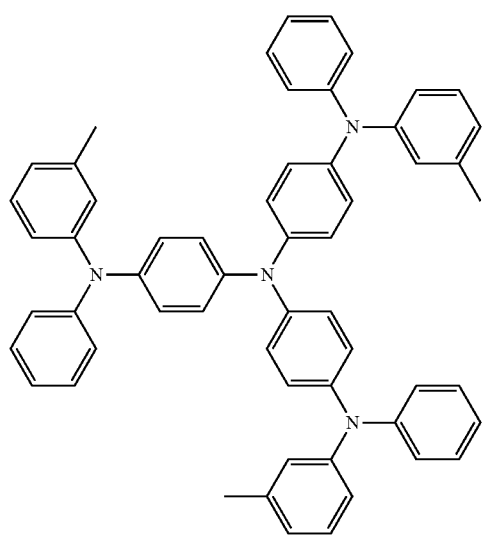
m-MTDATA
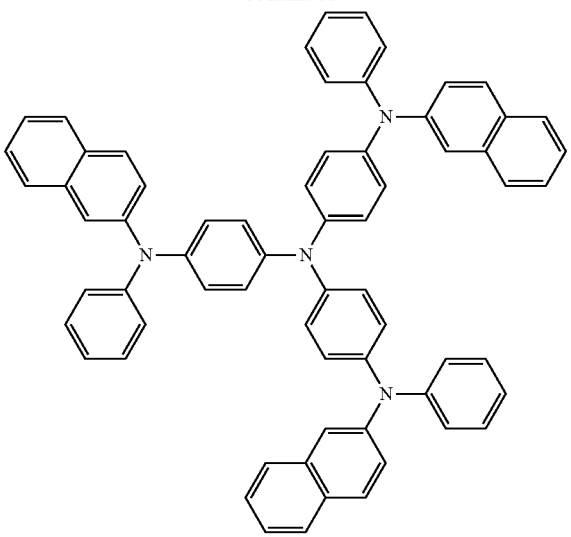
2-TNATA
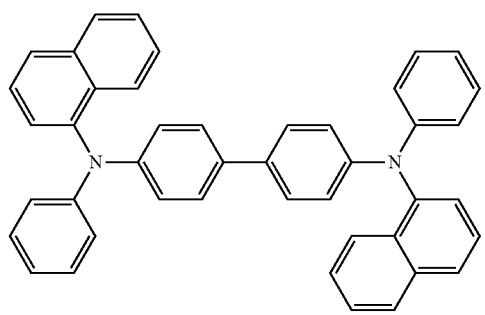
NPB
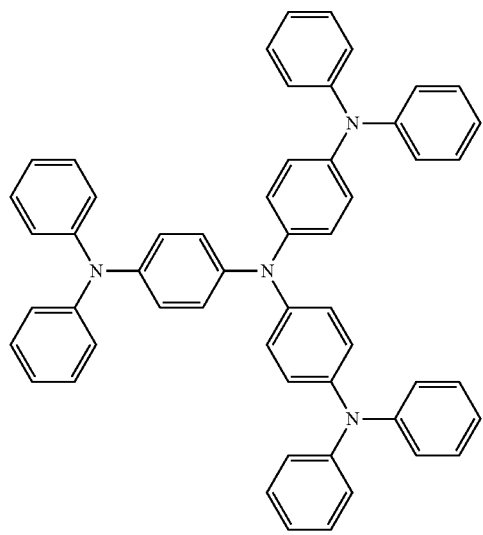
TDATA
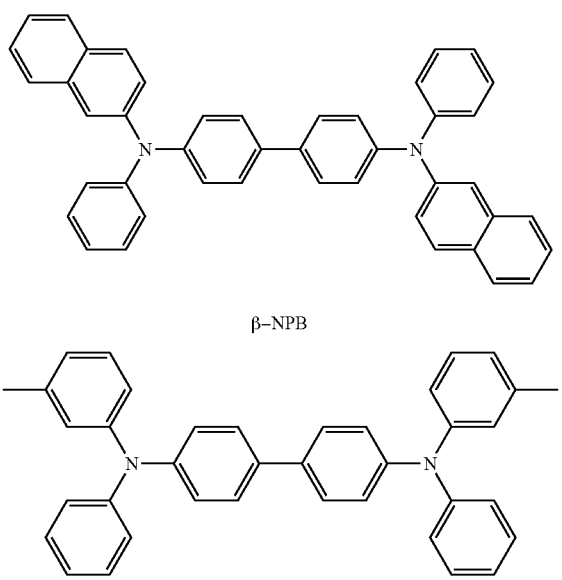
β–NPB
TPD

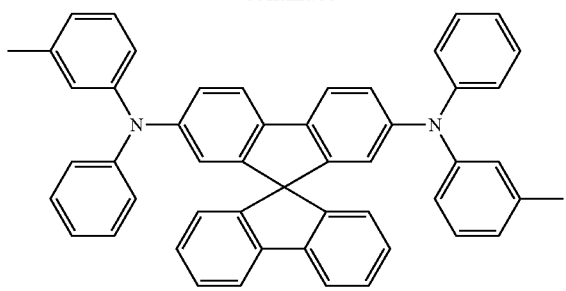
spiro-TPD
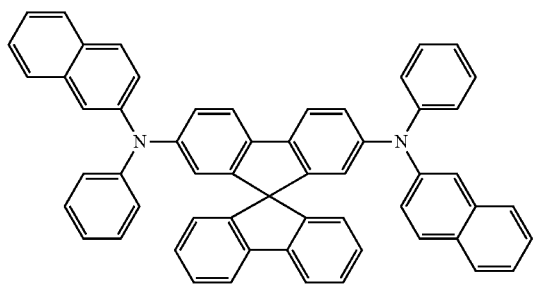
spiro-NPB
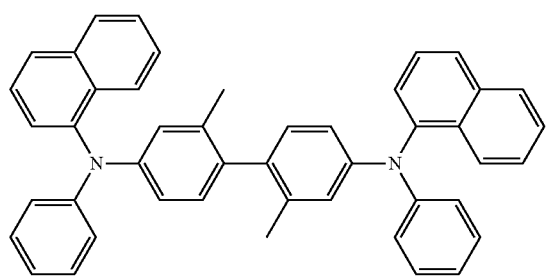
α-NPD
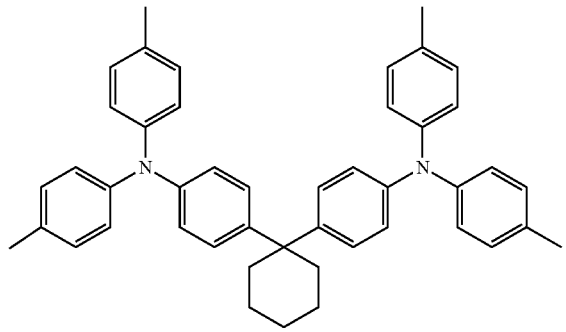
TAPC
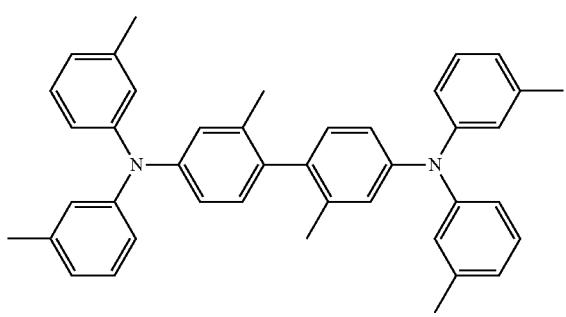
HMTPD
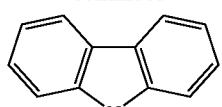
TCTA
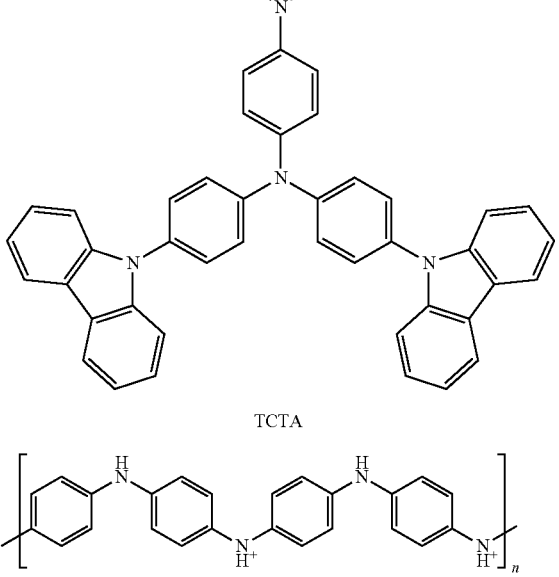
PANI/DBSA
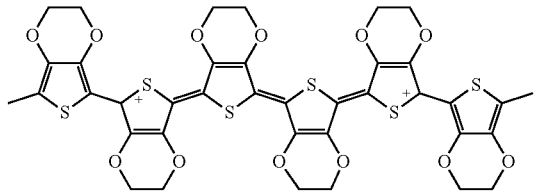
PEDOT/PSS
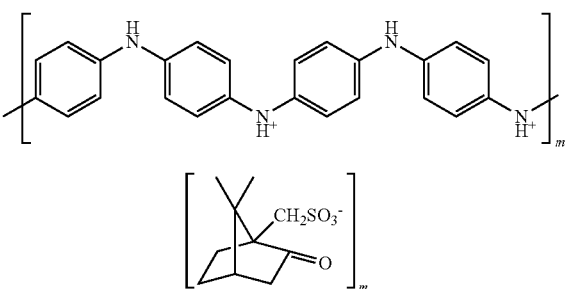
PANI/CSA -continued

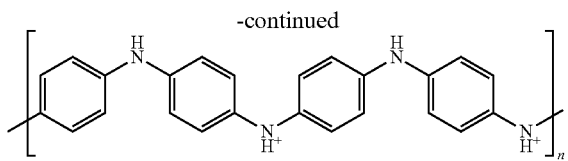

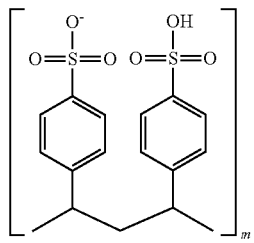

PANI/PSS

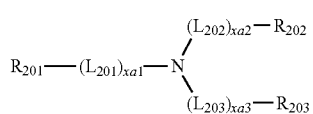
Formula 201

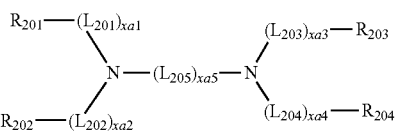
Formula 202

In Formulae 201 and 202, $L_{201}$ to $L_{205}$ may be each independently a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$ arylene group, a substituted or unsubstituted $C_2$-$C_{60}$ heteroarylene group, or a substituted or unsubstituted divalent $C_6$-$C_{60}$ non-aromatic condensed polycyclic group;

xa1 to xa4 may be each independently 0, 1, 2 or 3;

xa5 may be 1, 2, 3, 4 or 5; and $R_{201}$ to $R_{205}$ may be each independently a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_2$-$C_{60}$ heteroaryl group, or a substituted or unsubstituted monovalent $C_6$-$C_{30}$ non-aromatic condensed polycyclic group.

For example, in some embodiments, in Formulae 201 and 202, $L_{201}$ to $L_{205}$ may be each independently:

a phenylene group, a naphthylene group, a fluorenylene group, a spiro-fluorenylene group, a benzofluoenylene group, a dibenzofluoenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group; or a phenylene group, a naphthylene group, a fluorenylene group, a spiro-fluorenylene group, a benzofluoenylene group, a dibenzofluoenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, or a triazinyl group.

In some embodiments, xa1 to xa4 may each independently be 0, 1, or 2.

In some embodiments, xa5 may be 1, 2, or 3.

In some embodiments, $R_{201}$ to $R_{205}$ may be each independently:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group.

For example, in some embodiments, the compound represented by Formula 201 may be represented by Formula 201A below:

Formula 201A

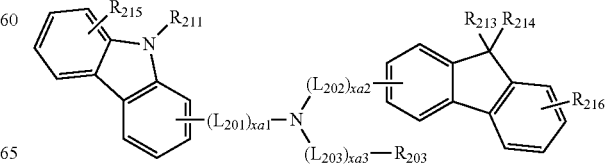

For example, the compound represented by Formula 201 may be represented by Formula 201A-1 below, but the compound represented by Formula 201 is not limited thereto.

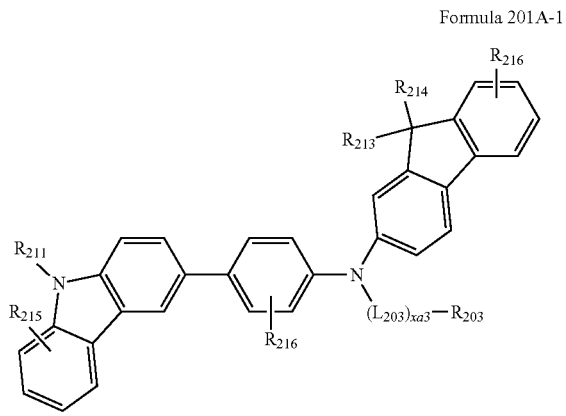

Formula 201A-1

The compound represented by Formula 202 may be represented by Formula 202A below, but is not limited thereto.

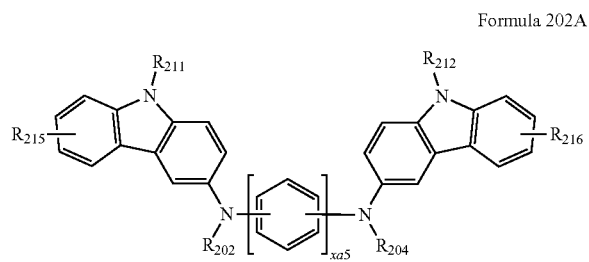

Formula 202A

In Formulae 201A, 201A-1, and 202A, $L_{201}$ to $L_{203}$, xa1 to xa3, xa5, and $R_{202}$ to $R_{204}$ are the same as defined above with respect to Formulae 201 and 202. $R_{211}$ and $R_{212}$ may be the same as $R_{203}$, defined above with respect to Formulae 201 and 202. $R_{213}$ to $R_{216}$ may be each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or a $C_6$-$C_{60}$ non-aromatic condensed polycyclic group.

For example, in Formulae 201A, 201A-1, and 202A, $L_{201}$ to $L_{203}$ may be each independently:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group; or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, or a triazinylene group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyi group, an isoquinolinyl group, a quinoxalinyl group, a quinazolinyl group, a carbazolyl group, or a triazinyl group;

xa1 to xa3 may be each independently 0 or 1;

$R_{203}$, $R_{211}$, and $R_{212}$ may be each independently:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyi group, or a triazinyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$R_{213}$ and $R_{214}$ may be each independently:

a $C_1$-$C_{20}$ alkyl group or a $C_1$-$C_{20}$ alkoxy group; or a $C_1$-$C_{20}$ alkyl group or a $C_1$-$C_{20}$ alkoxy group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

$R_{215}$ and $R_{216}$ may be each independently:

a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof; or a $C_1$-$C_{20}$ alkyl group or a $C_1$-$C_{20}$ alkoxy group; or a $C_1$-$C_{20}$ alkyl group or a $C_1$-$C_{20}$ alkoxy group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; and xa5 may be 1 or 2.

In Formulae 201A and 201A-1, $R_{213}$ and $R_{214}$ may optionally combine to form a saturated or unsaturated ring.

Non-limiting examples of the compound represented by Formula 201 and the compound represented by Formula 202 include compounds HT1 to HT20 illustrated below.

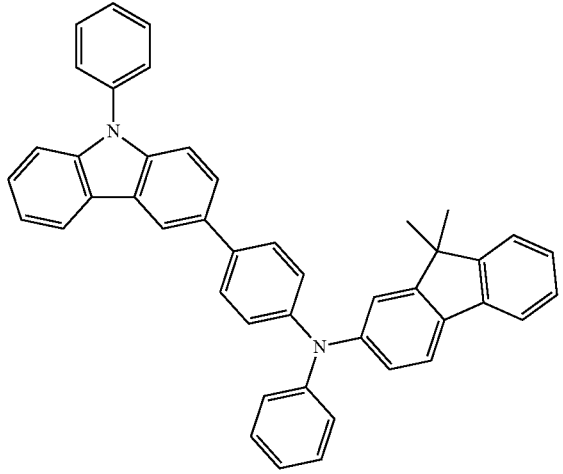

HT1

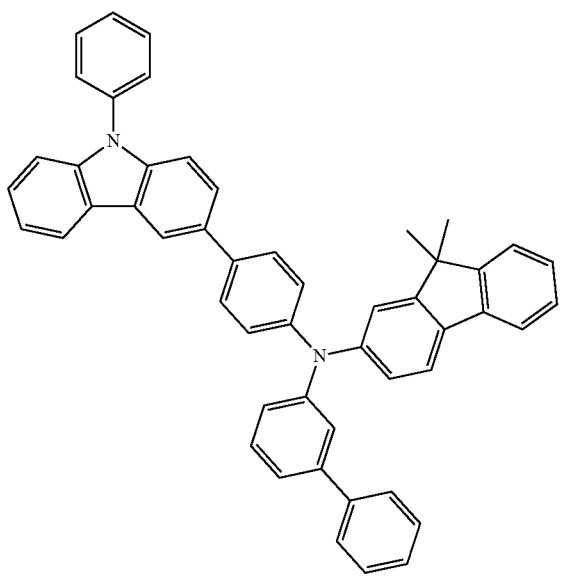

HT2

HT3
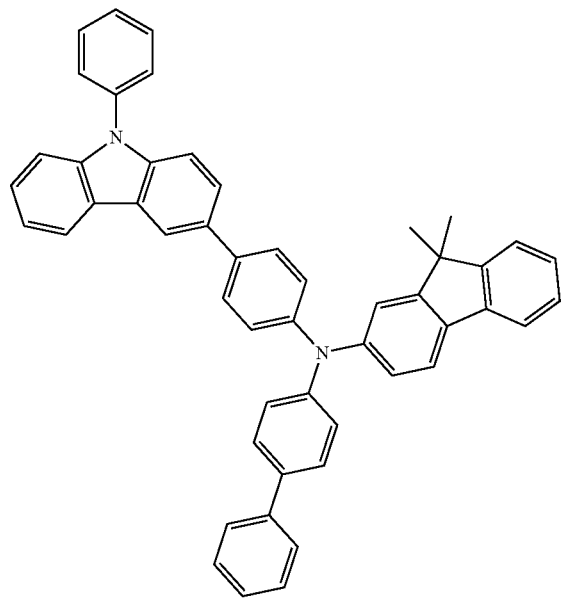
HT5
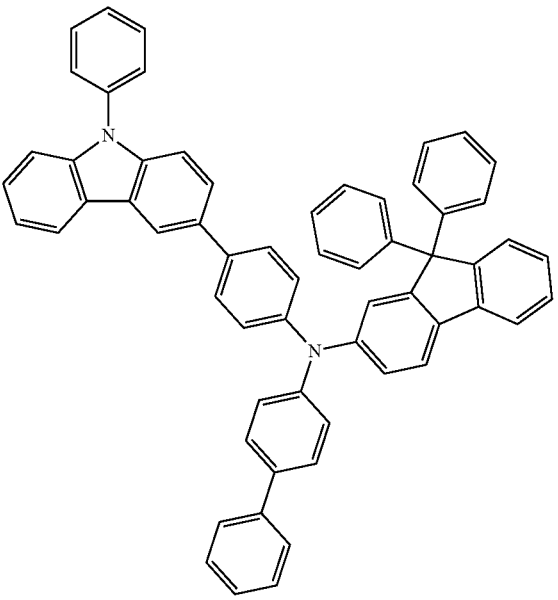
HT4
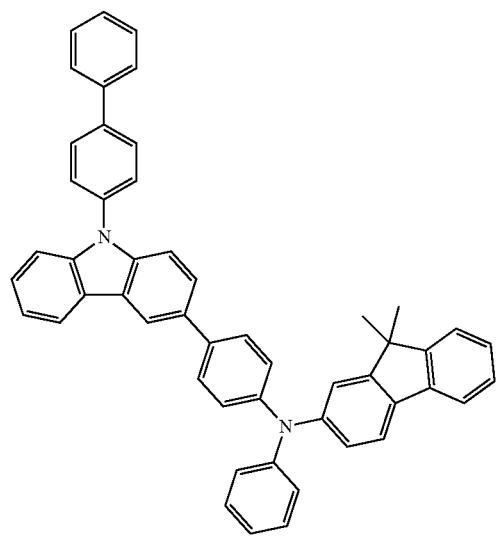
HT6
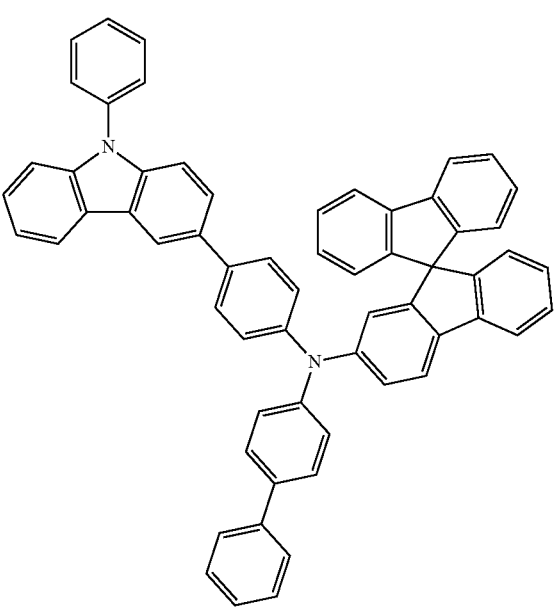

HT7
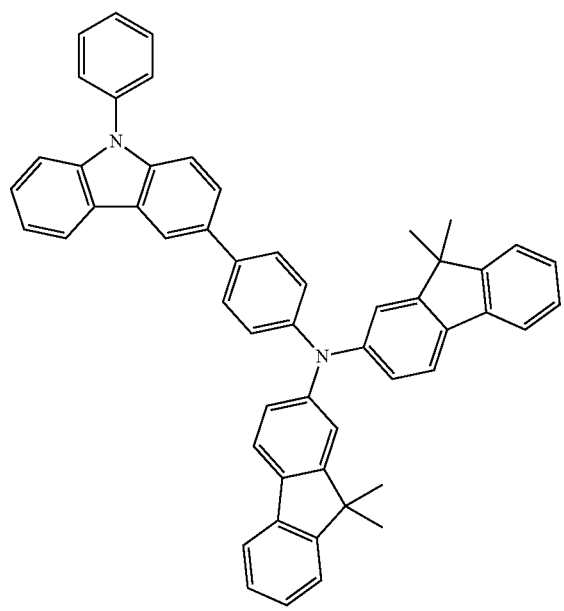
HT9
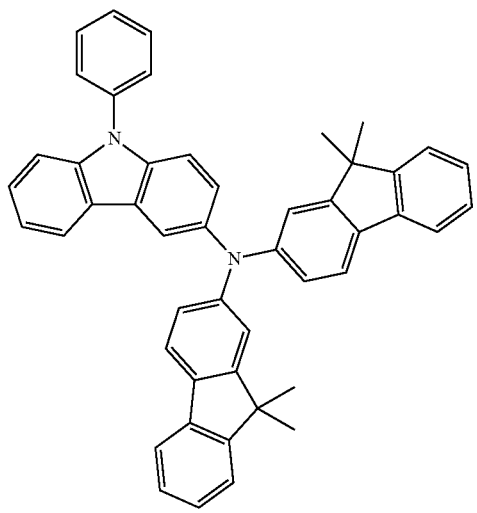
HT8
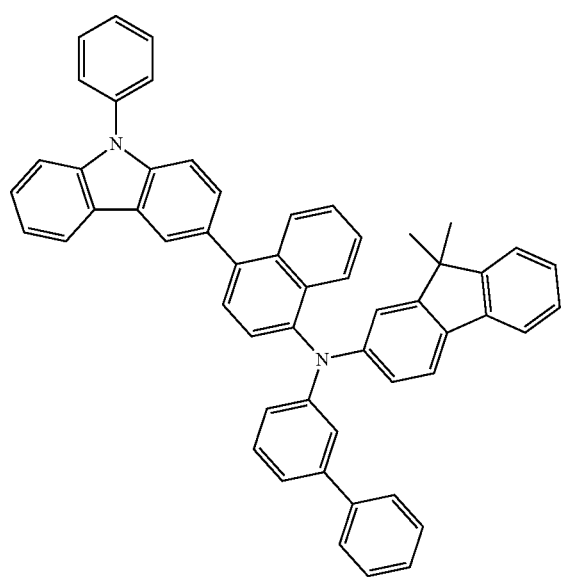
HT10
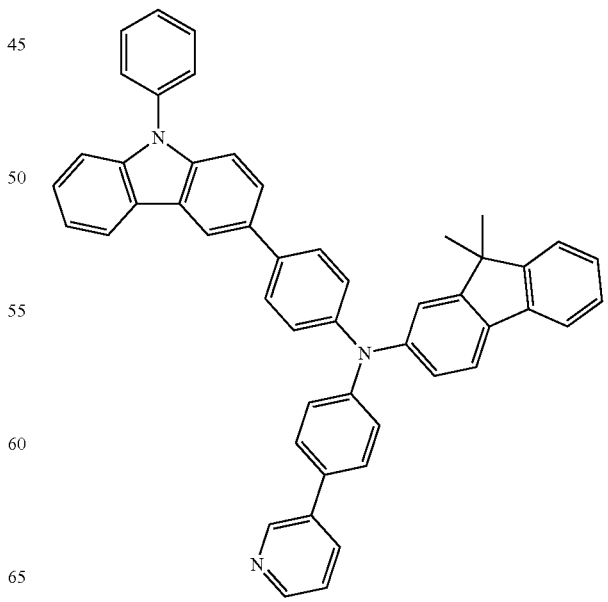

-continued
HT11
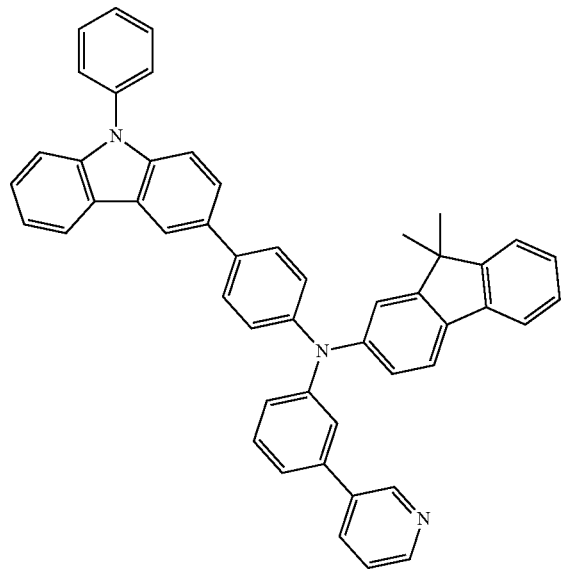
HT12
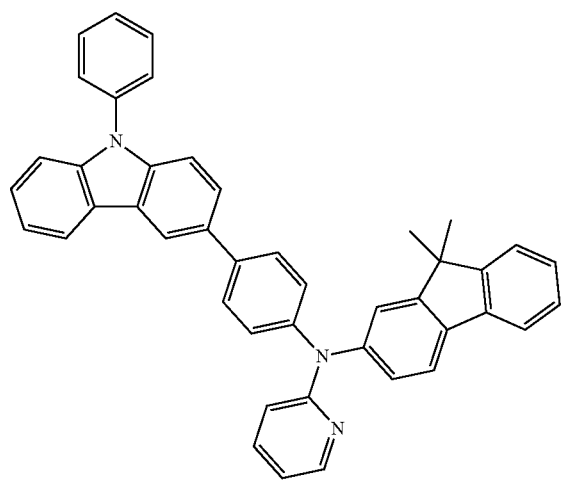
HT13
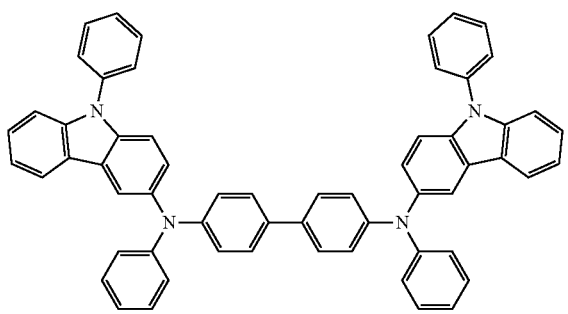
-continued
HT14
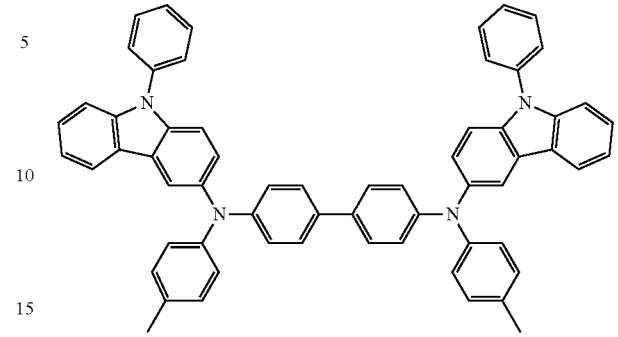
HT15
HT16
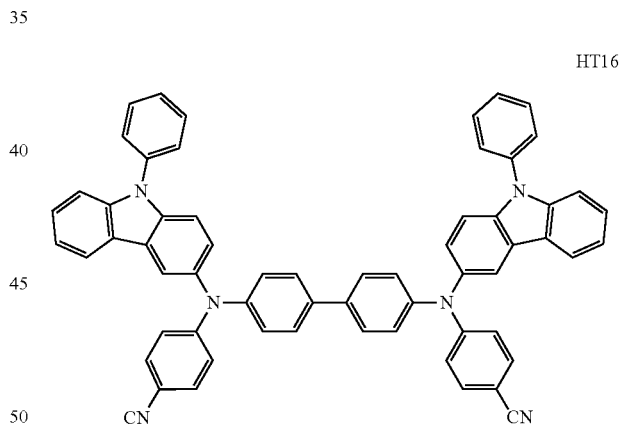
HT17
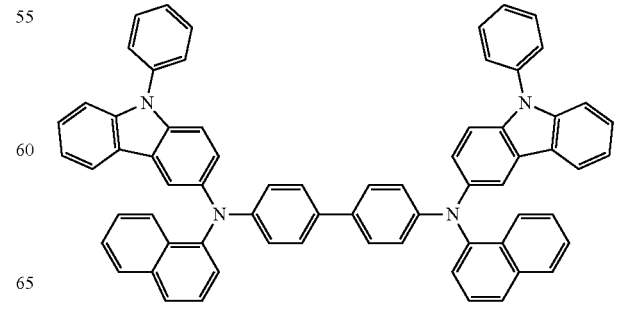

-continued

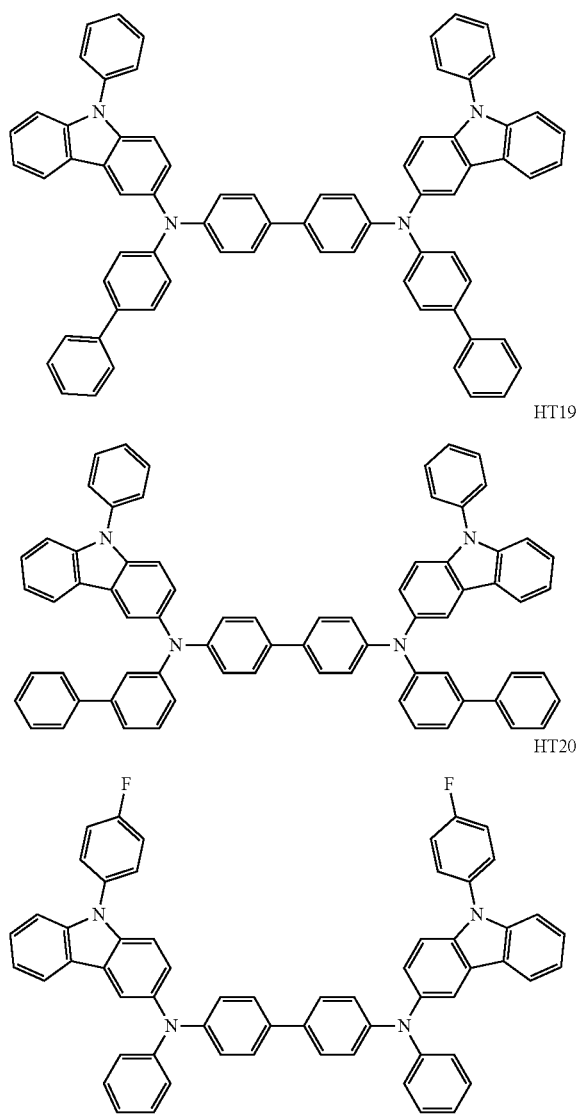

HT18

HT19

HT20

The thickness of the hole transport region may be about 100 Å to about 10,000 Å, for example, about 100 Å to about 1,000 Å. When the hole transport region includes a hole injection layer and a hole transport layer, the thickness of the hole injection layer may be about 100 Å to about 10,000 Å, for example, about 100 Å to about 1,000 Å, and the thickness of the hole transport layer may be about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for improving the conductive properties. The charge-generation material may be homogeneously or non-homogeneously dispersed in the hole transport region.

The charge-generation material may be, for example, a p-dopant. The p-dopant may be one of a quinone derivative, a metal oxide, or a cyano group-containing compound, but is not limited thereto. For example, non-limiting examples of the p-dopant include a quinone derivative (such as tetracyanoquinonedimethane (TCNQ) or tetrafluorotetracyanoquinodimethane (F4-TCNQ)); a metal oxide (such as tungsten oxide or molybdenum oxide); and Compound HATCN (1,4,5,8,9,11-hexaazatriphenylene-hexacarbonitrile) illustrated below.

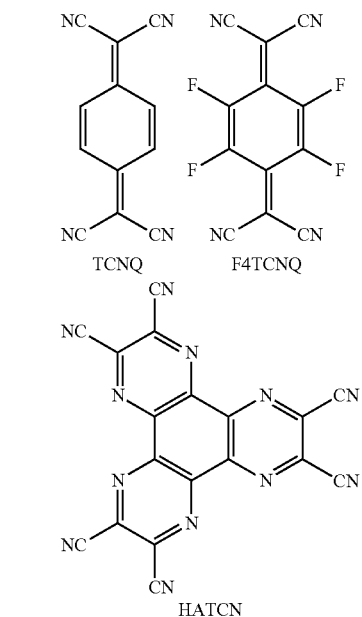

TCNQ  F4TCNQ

HATCN

The hole transport region may further include, in addition to the hole injection layer and the hole transport layer, at least one of a buffer layer and an electron blocking layer. The buffer layer may compensate for an optical resonance distance according to the wavelength of light emitted from the emission layer, and thus, the light-emission efficiency of the resulting organic light-emitting device may be improved. For use as a material of the buffer layer, materials of the hole transport region may be used (utilized). The electron blocking layer reduces or prevents injection of electrons from the electron transport region.

An emission layer is formed on the first electrode 13 or the hole transport region using (utilizing) various suitable methods, such as vacuum deposition, spin coating, casting, an LB method, ink-jet printing, laser-printing, or laser-induced thermal imaging (LWTI). When the emission layer is formed by vacuum deposition or spin coating, the deposition or coating conditions for the emission layer may be similar to the deposition or coating conditions described above for the hole injection layer.

When the organic light-emitting device 10 is a full color organic light-emitting device, the emission layer may be patterned into a red emission layer, a green emission layer, and a blue emission layer. In some embodiments, the emission layer may have a structure in which a red emission layer, a green emission layer, and a blue emission layer are stacked over each other; or a structure in which a red-light emission material, a green-light emission material, and a blue-light emission material are mixed with each other in a single layer to emit white light.

The emission layer may include a host and a dopant.

The host may include at least one of TPBi, TBADN, ADN (also referred to as "DNA"), CBP, CDBP, or TCP:

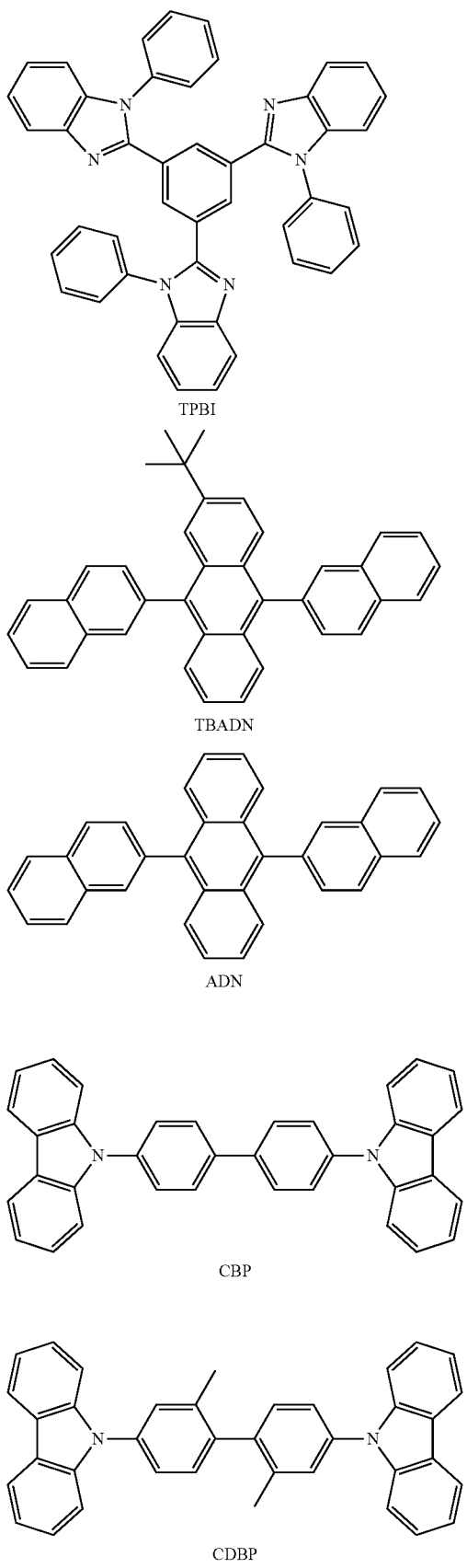

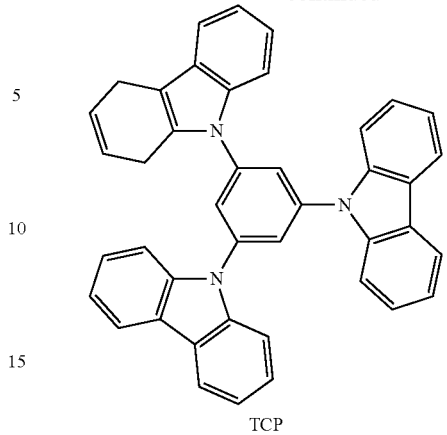

TCP

According to another embodiment of the present invention, the host may include a compound represented by Formula 301 below:

$$Ar_{301}-[(L_{301})_{xb1}-R_{301}]_{xb2} \qquad \text{Formula 301}$$

In Formula 301, $Ar_{301}$ may be:

a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, or an indenoanthracene; or a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, or an indenoanthracene, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent $C_2$-$C_{60}$ non-aromatic condensed polycyclic group, or —Si($Q_{301}$)($Q_{302}$)($Q_{303}$) (where, $Q_{301}$ to $Q_{303}$ are each independently a hydrogen, a $C_1$-$C_{60}$ alkyl group, a $C_2$-$C_{60}$ alkenyl group, a $C_6$-$C_{60}$ aryl group, or a $C_2$-$C_{60}$ heteroaryl group);

$L_{301}$ is the same as $L_{201}$ described above with respect to Formulae 201 and 202;

$R_{301}$ may be:

a $C_1$-$C_{20}$ alkyl group or a $C_1$-$C_{20}$ alkoxy group; or a $C_1$-$C_{20}$ alkyl group or a $C_1$-$C_{20}$ alkoxy group, substituted with at least one of:

a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazol group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group;

xb1 is 0, 1, 2, or 3; and xb2 is 1, 2, 3, or 4.

For example, in Formula 301, $L_{301}$ may be:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, or a chrysenylene group; or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, or a chrysenylene group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, or a chrysenyl group;

$R_{301}$ may be:

a $C_1$-$C_{20}$ alkyl group or a $C_1$-$C_{20}$ alkoxy group; or a $C_1$-$C_{20}$ alkyl group or a $C_1$-$C_{20}$ alkoxy group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, or a chrysenyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, or a chrysenyl group.

For example, the host may include a compound represented by Formula 301A:

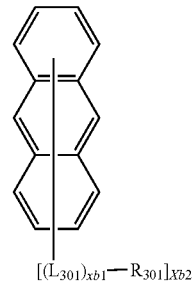

Formula 301A $[(L_{301})_{xb1}\text{—}R_{301}]_{Xb2}$

The substituents in Formula 301A are described above with respect to Formula 301.

Non-limiting examples of compounds represented by Formula 301 include at least one of Compounds H1 to H42 below:

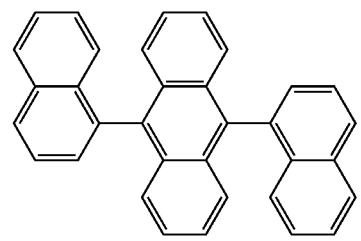

H1

-continued
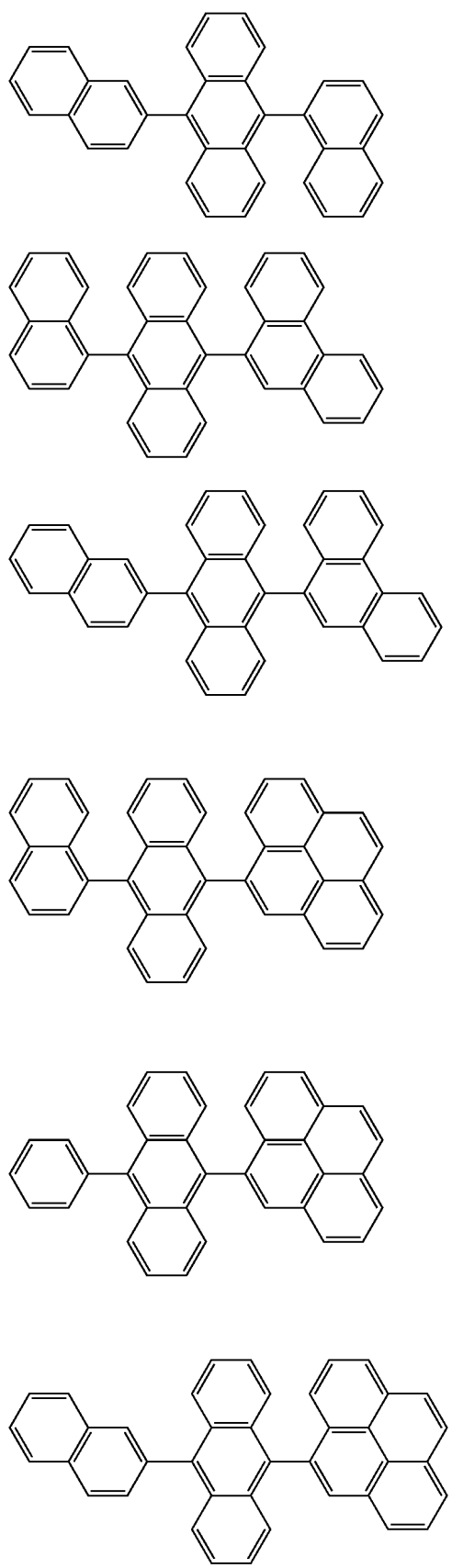
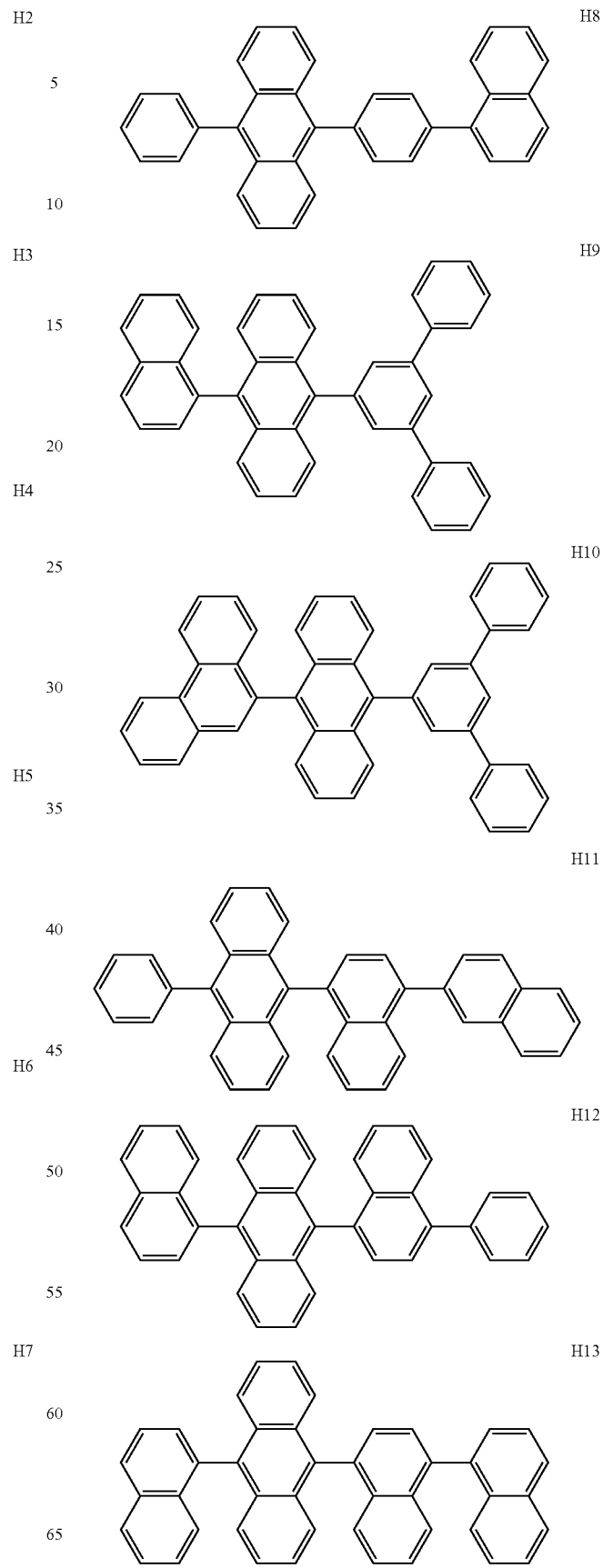

H14
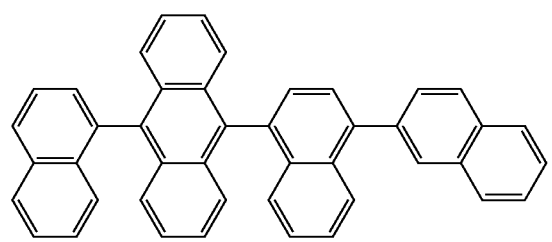
H15
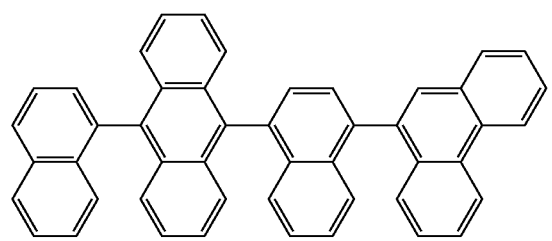
H16
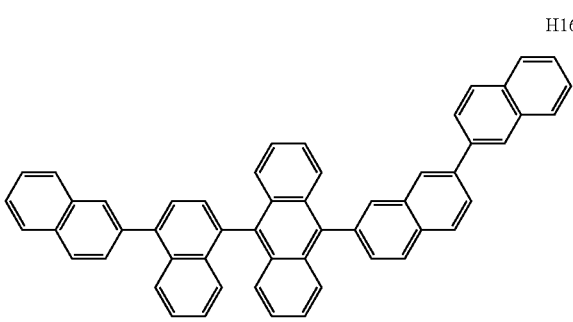
H17
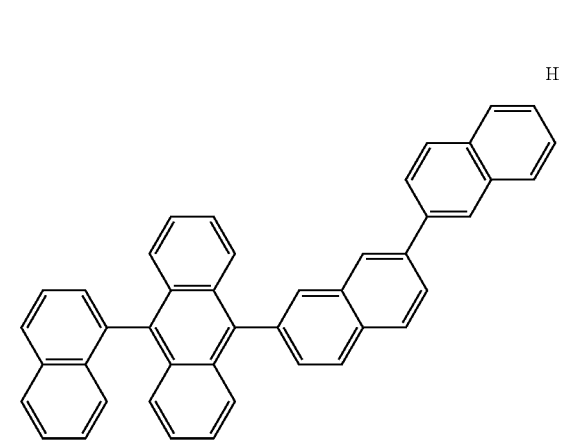
H18
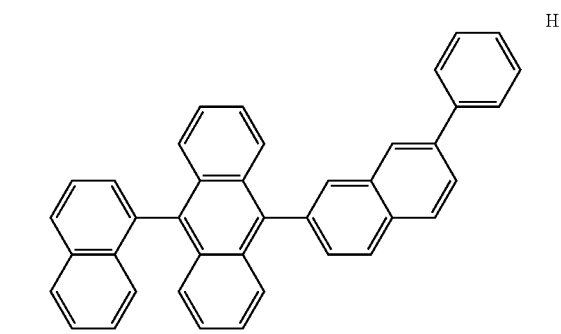
H19
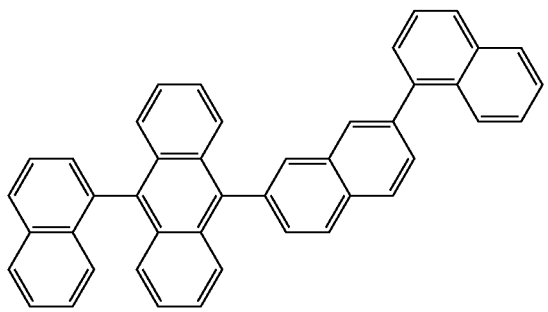
H20
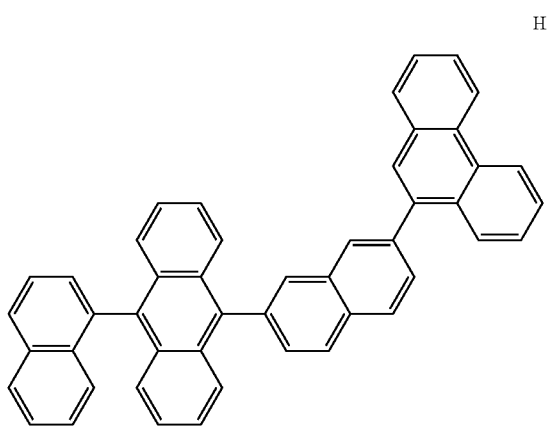
H21
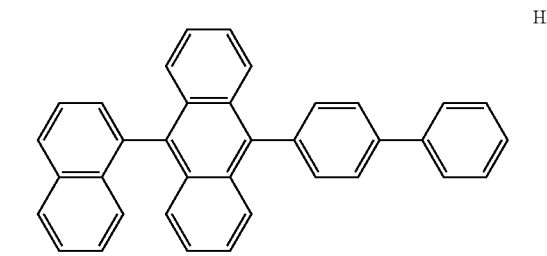
H22
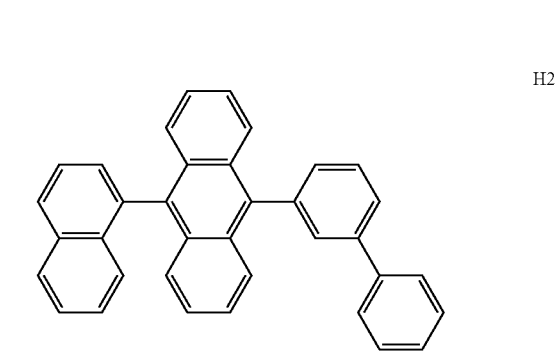
H23
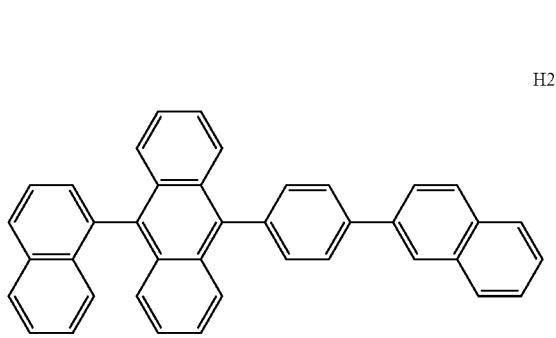

H24
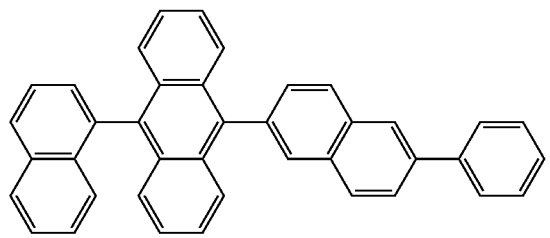
H25
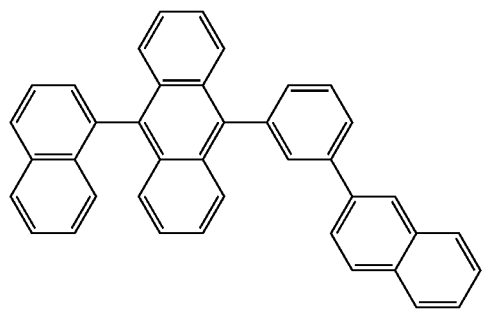
H26
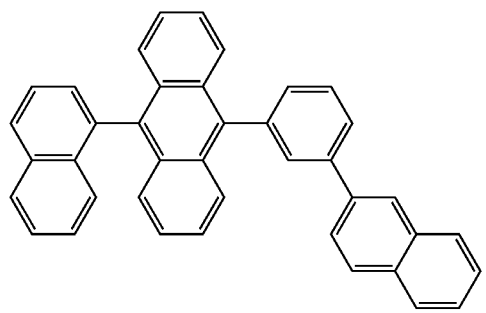
H27
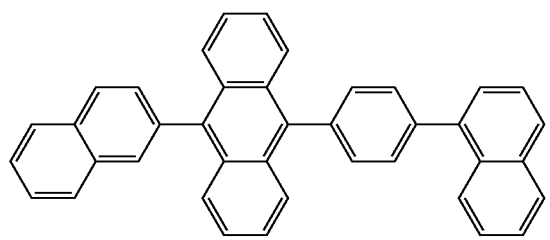
H28
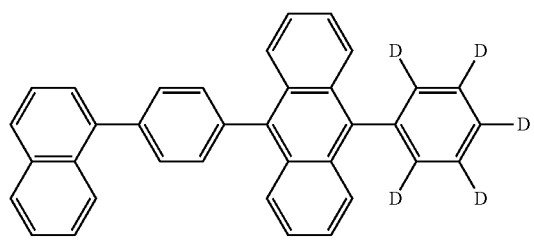
H29
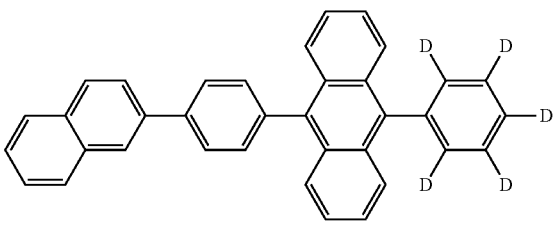
H30
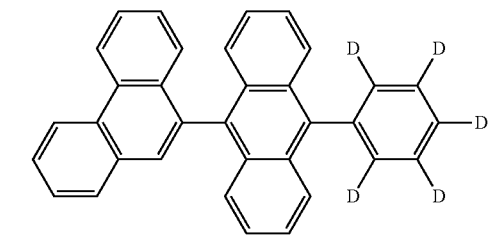
H31
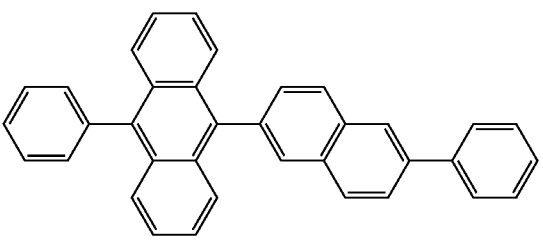
H32
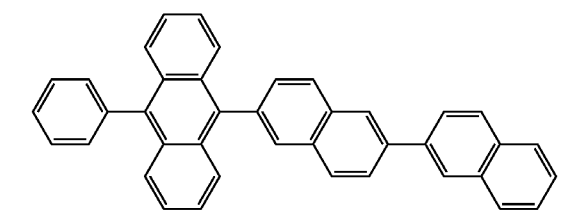
H33
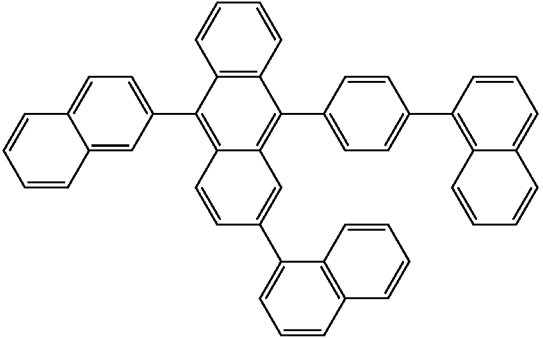

H34
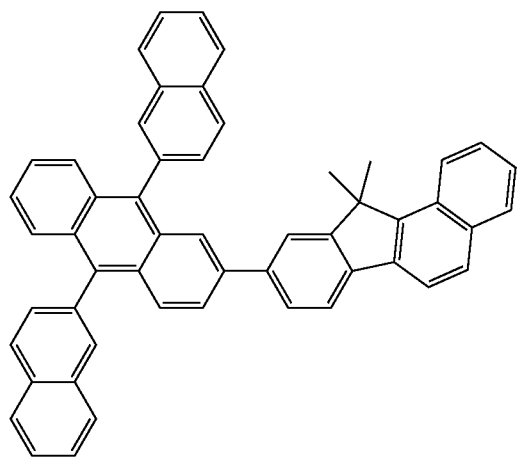
H35
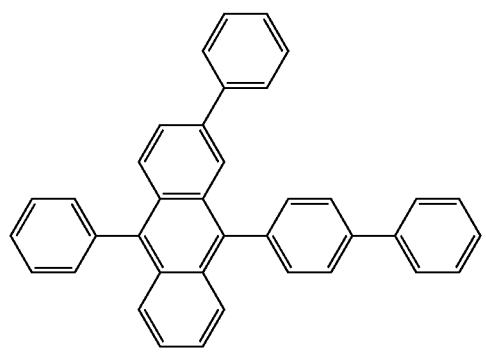
H36
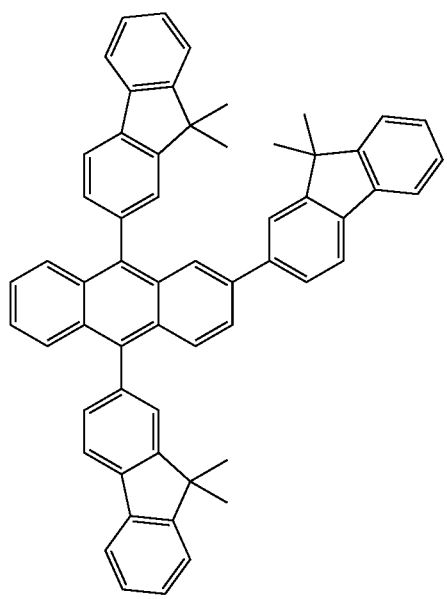
H37
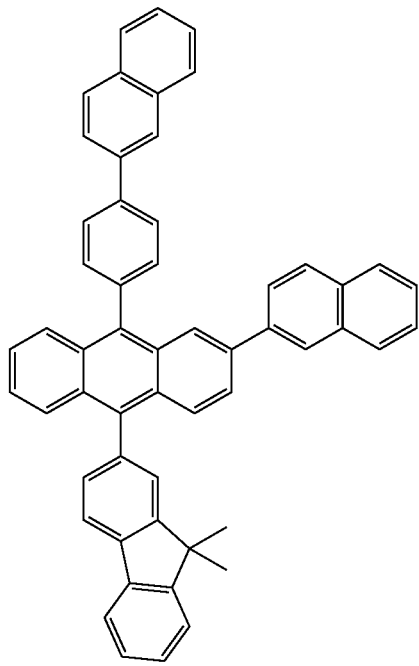
H38
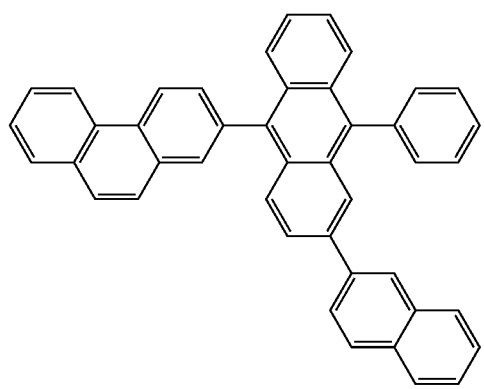
H39
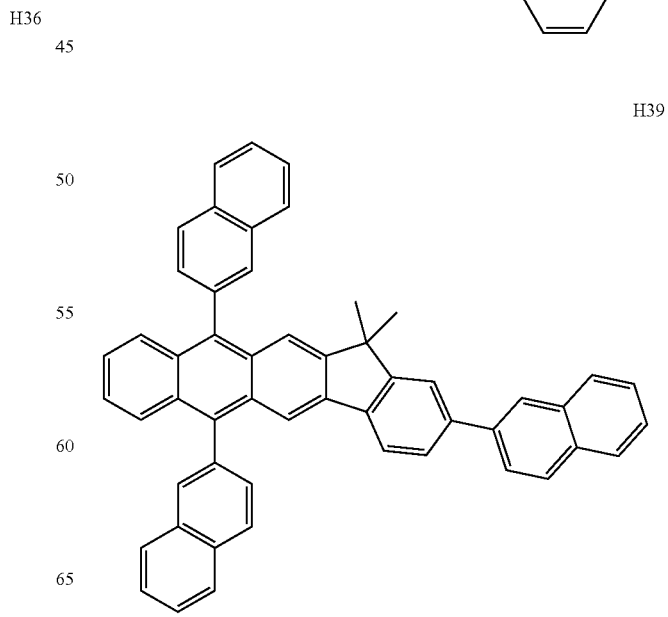

H40
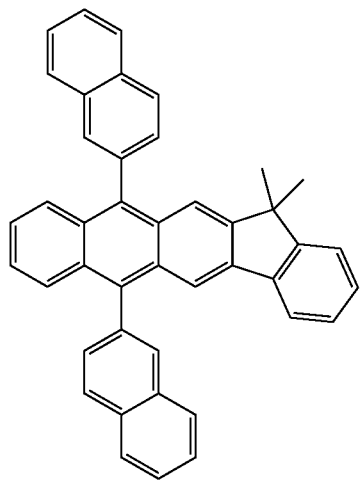
H41
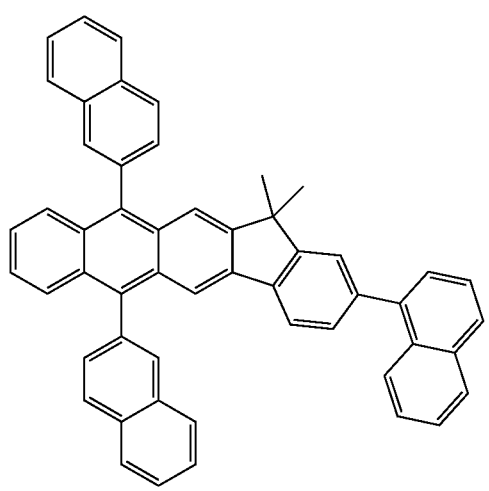
H42
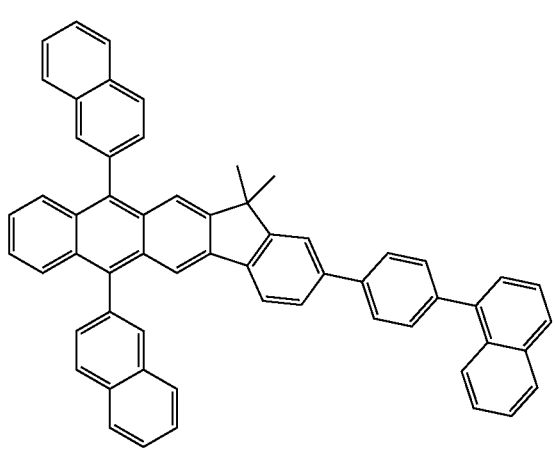
H43
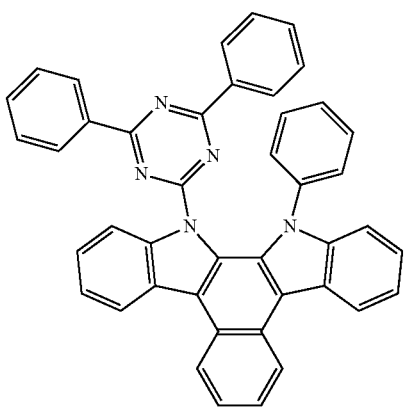
H44
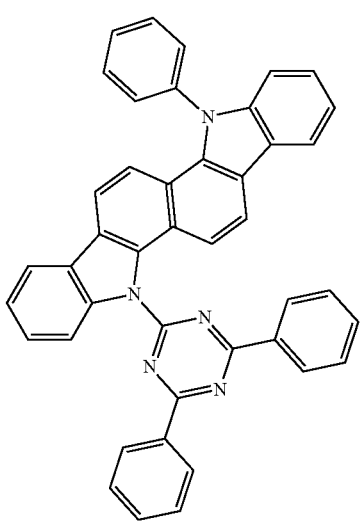
H45
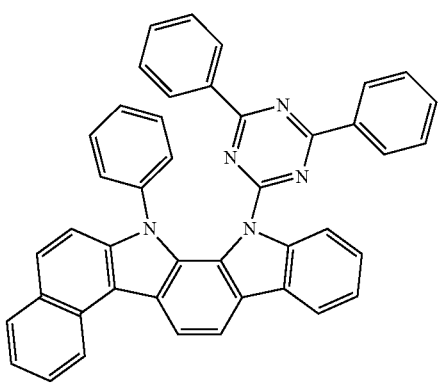
According to another embodiment of the present invention, the host may include at least one of Compounds H43 to H49 below, but the host is not limited thereto:

H46

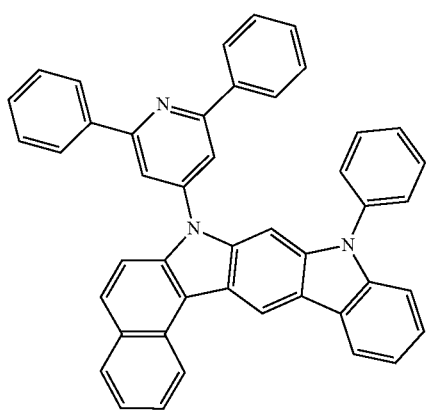

H47

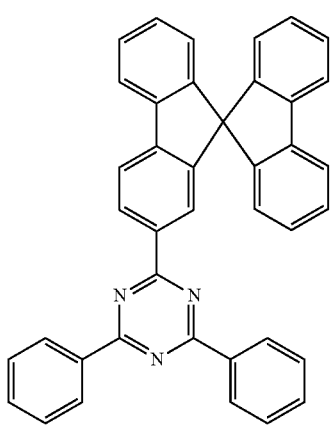

H48

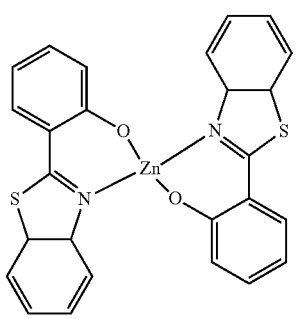

H49

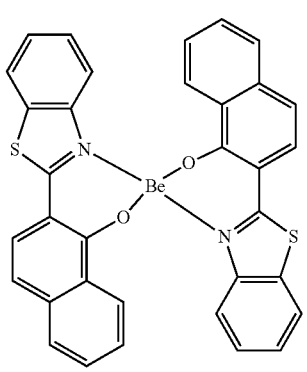

The dopant may be any suitable dopant. For example, the dopant may be at least one of a fluorescent dopant or a phosphorescent dopant. The phosphorescent dopant may be an organic metal complex including Ir, Pt, Os, Re, Ti, Zr, Hf, or a combination thereof, but is not limited thereto.

Non-limiting examples of suitable blue dopants include the compounds below, including bis[3,5-difluoro-2-(2-pyridyl)phenyl](picolinato)iridium(III) ($F_2$Irpic), ($F_2$ppy)$_2$Ir (tmd), Ir(dfppz)$_3$, 4,4'-bis(2,2'-diphenylethen-1-yl)biphenyl (DPVBi), 4,4'-Bis[4-(diphenylamino)styryl]biphenyl (DPAVBi), and 2,5,8,11-tetra-tert-butyl perylene (TBPe).

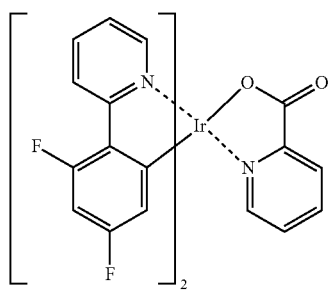

$F_2$Irpic

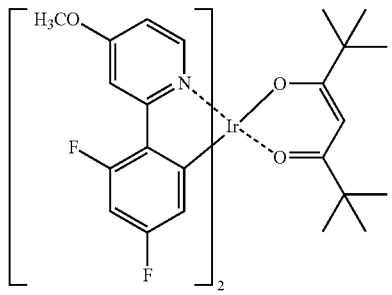

($F_2$ppy)$_2$Ir(tmd)

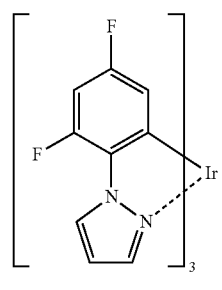

Ir(dfppz)$_3$

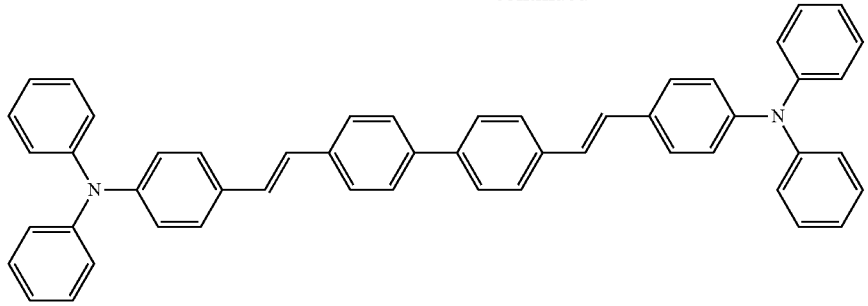
DPAVBi
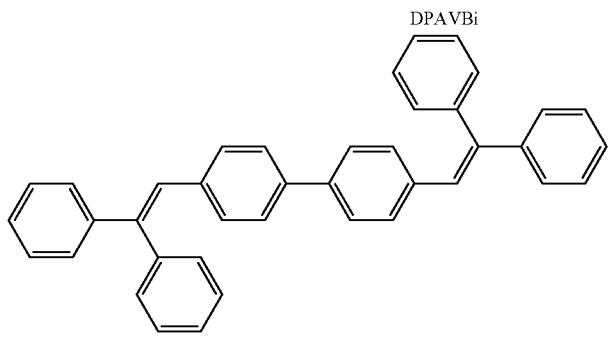
DPABi
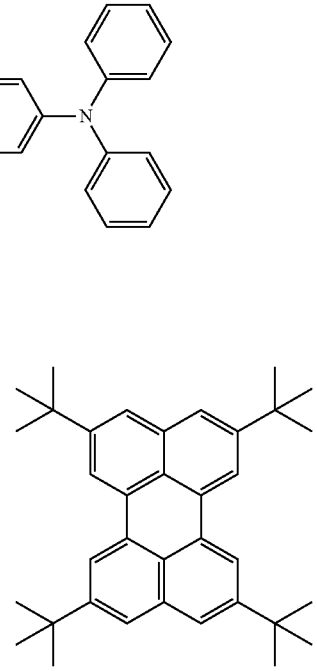
TPBe
Additional non-limiting examples of suitable blue dopants include the compounds below:
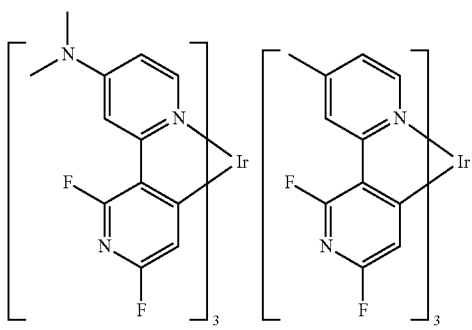
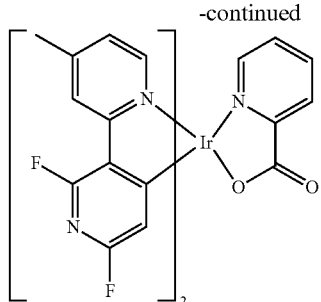
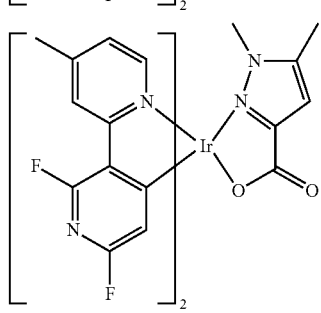
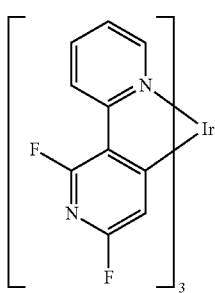
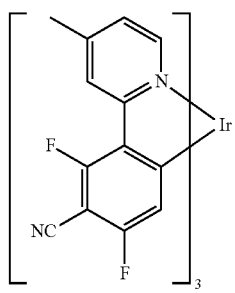

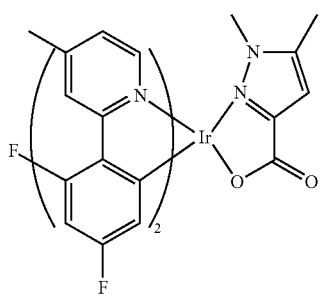

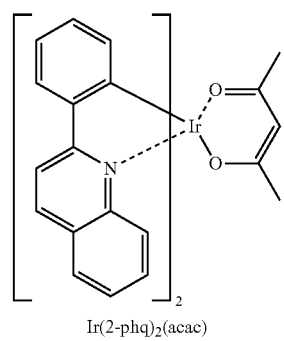

Ir(2-phq)₂(acac)

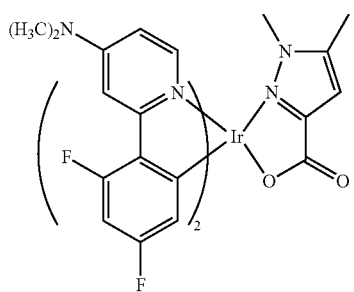

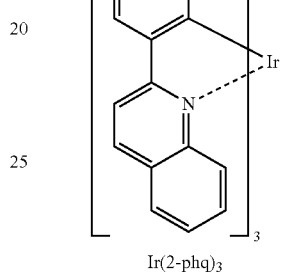

Ir(2-phq)₃

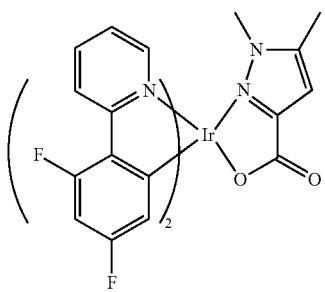

Non-limiting examples of suitable red dopants include the compounds below, including Pt(II) octaethylporphine (PtOEP), tris(2-phenylisoquinoline)iridium (Ir(piq)₃), bis(2-(2'-benzothienyl)-pyridinato-N,C3')iridium(acetylacetonate) (Btp₂Ir(acac)), 4-(Dicyanomethylene)-2-methyl-6-[p-(dimethylamino)styryl]-4H-pyran (DCM), 4-(Dicyanomethylene)-2-tert-butyl-6-(1,1,7,7,-tetramethyl-julolidyl-9-enyl)-4H-pyran (DCJTB), Ir(piq)₂(acac), Ir(2-phq)₂(acac), Ir(2-phq)₃, Ir(flq)₂(acac), or Ir(fliq)₂(acac).

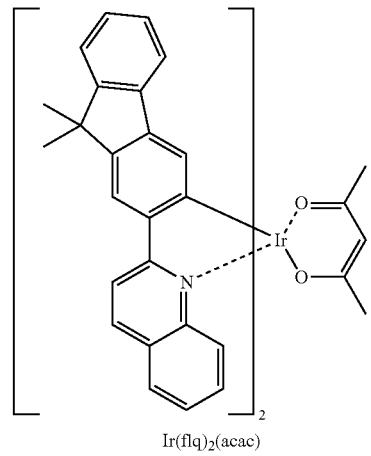

Ir(flq)₂(acac)

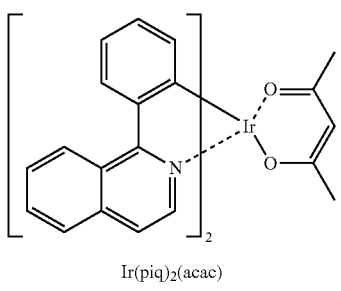

Ir(piq)₂(acac)

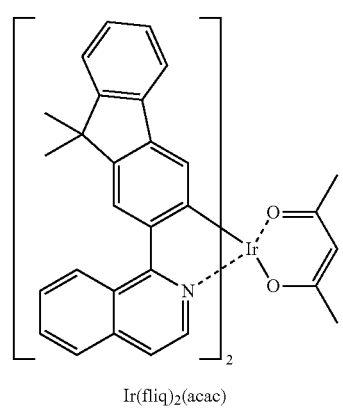

Ir(fliq)₂(acac)

-continued

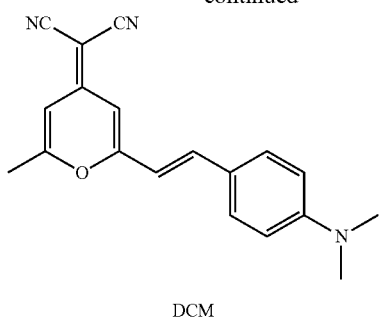

DCM

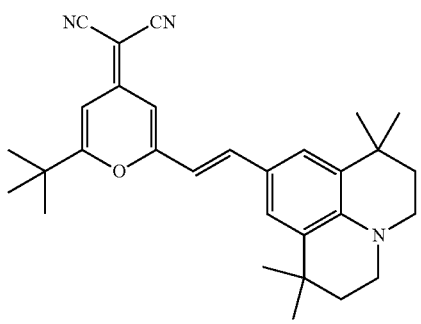

DCJTB

Non-limiting examples of suitable green dopants include the compounds below, including tris(2-phenylpyridine)iridium (Ir(ppy)$_3$), bis(2-phenylpyridine)(Acetylacetonato)iridium(III) (Ir(ppy)$_2$(acac)), tris(2-(4-tolyl)phenylpiridine)iridium (Ir(mppy)$_3$), or 10-(2-benzothiazolyl)-1,1,7,7-tetramethyl-2,3,6,7-tetrahydro-1H,5H,11H-[1]benzopyrano[6,7,8-ij]-quinolizin-11-one (C545T):

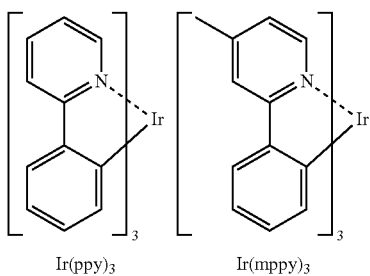

Ir(ppy)$_3$  Ir(mppy)$_3$

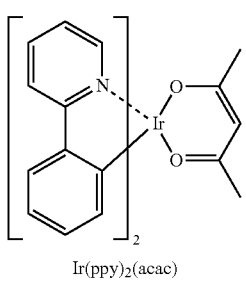

Ir(ppy)$_2$(acac)

-continued

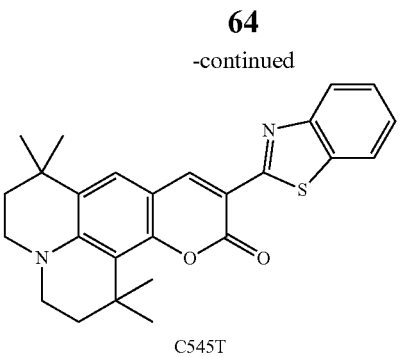

C545T

In some embodiments, the dopant that may be included in the emission layer may be a Pt-complex, non-limiting examples of which include compounds D1 to D50 below:

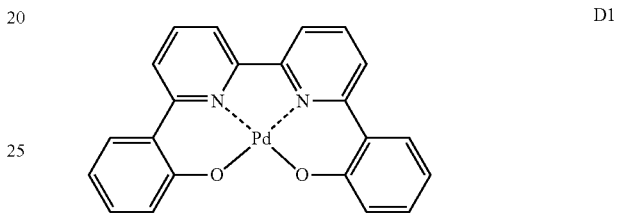

D1

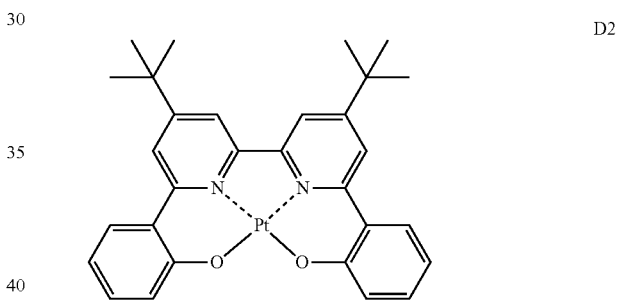

D2

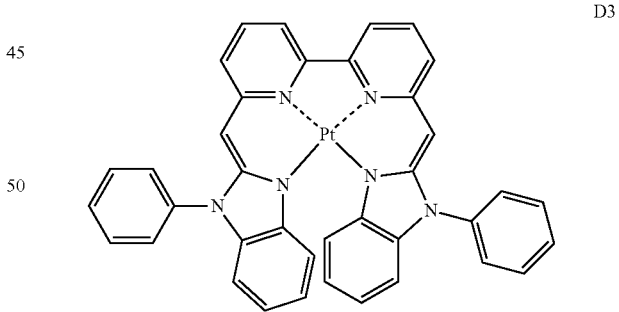

D3

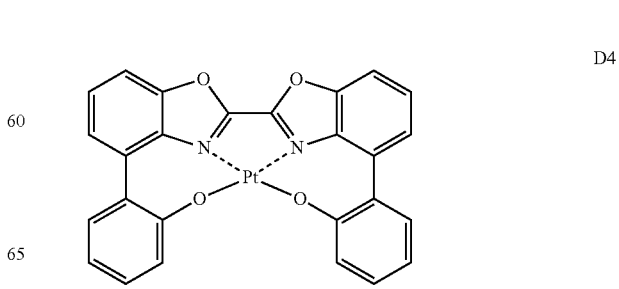

D4

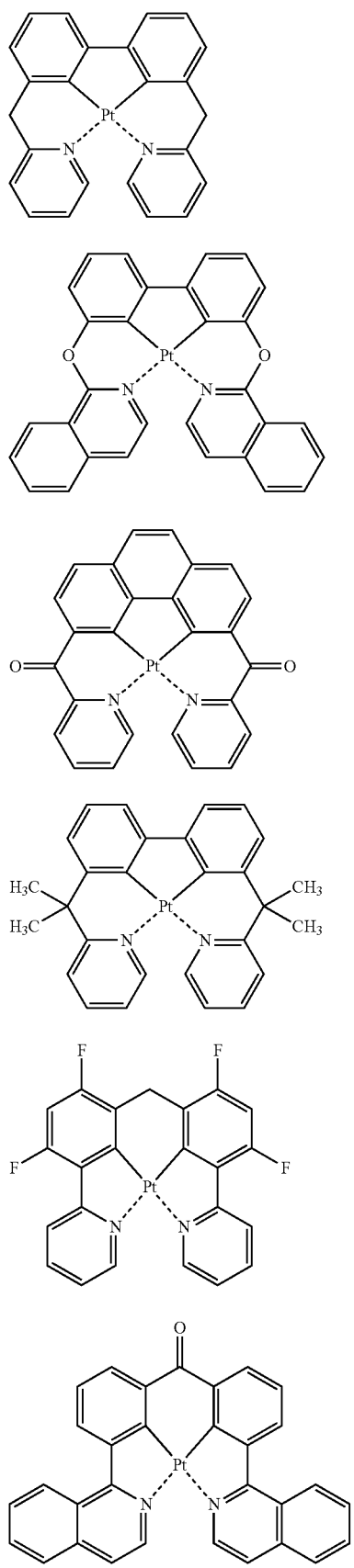
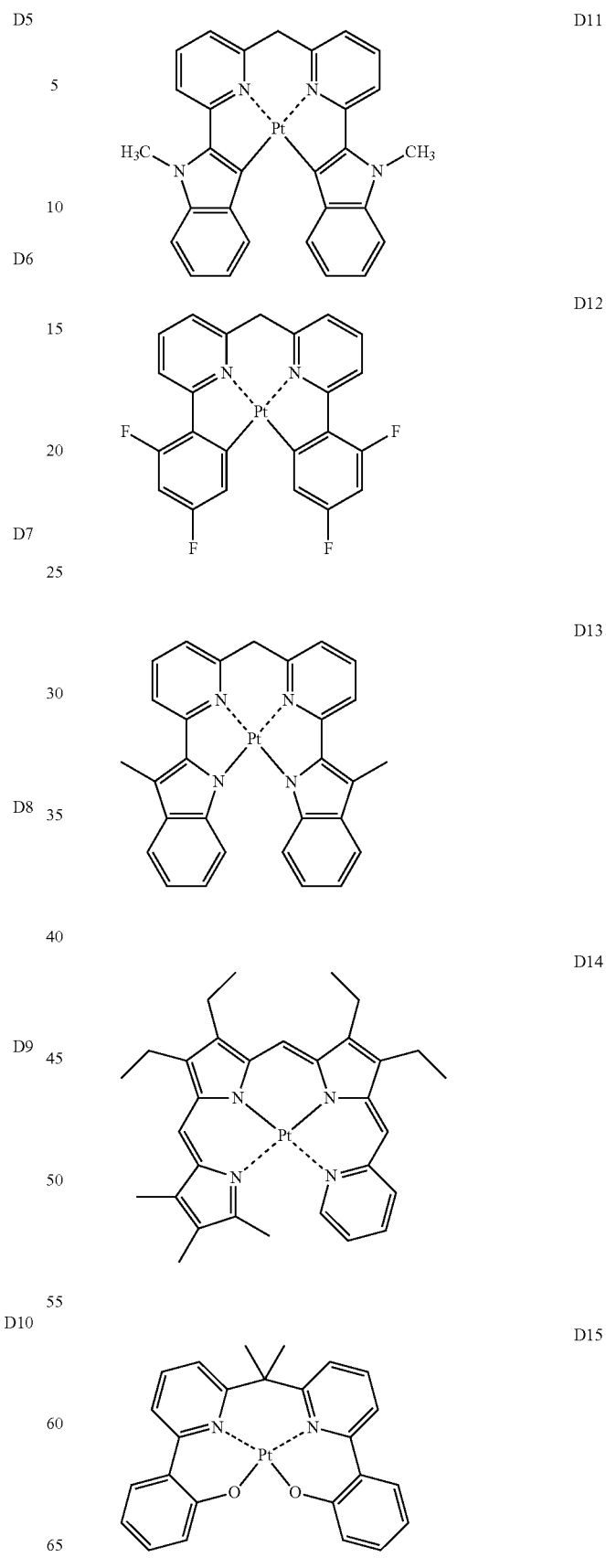

D16
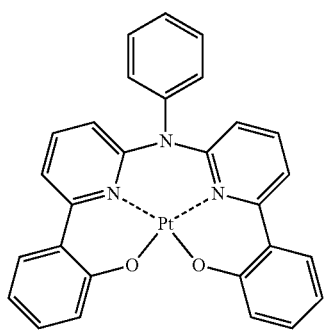
D17
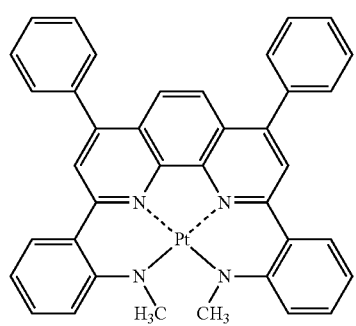
D18
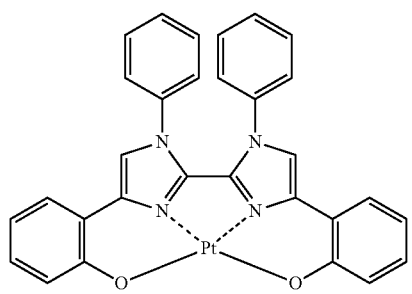
D19
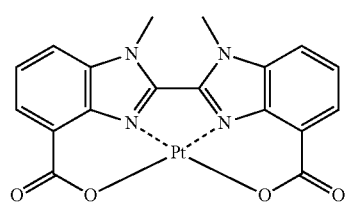
D20
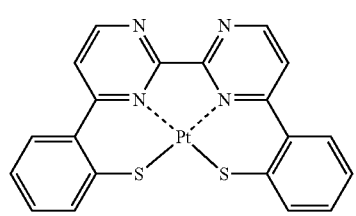
D21
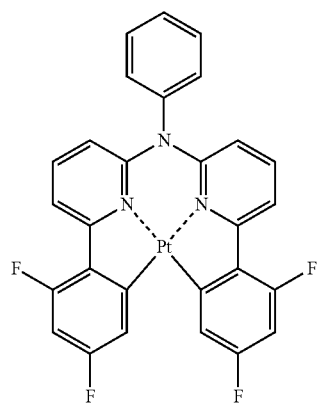
D22
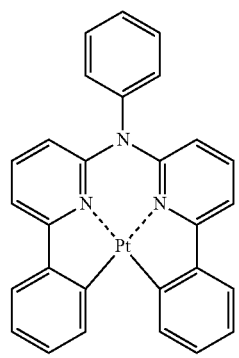
D23
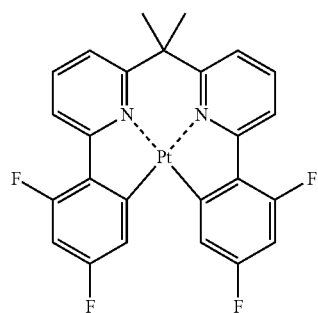
D24
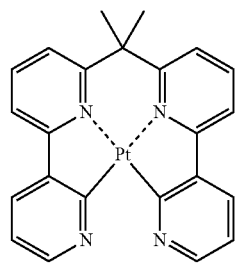
D25
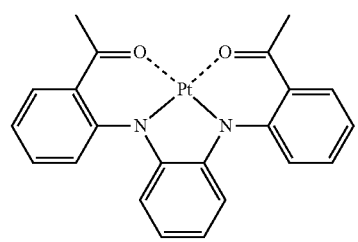

D26 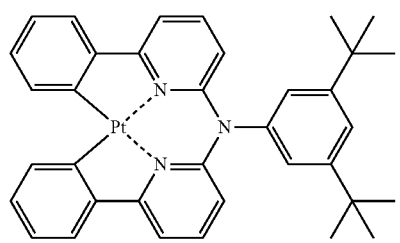
D27 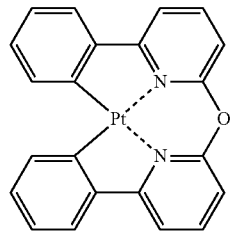
D28 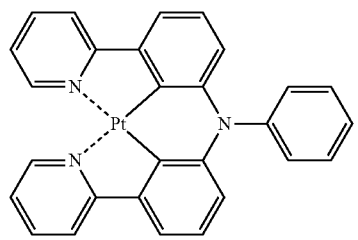
D29 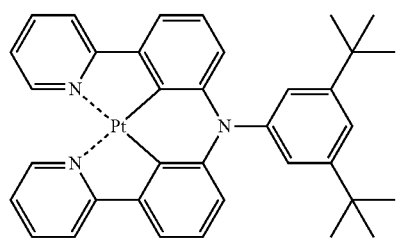
D30 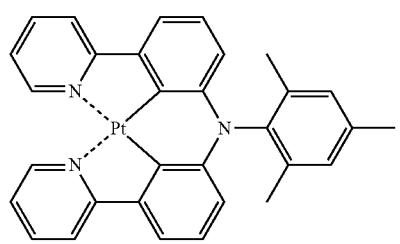
D31 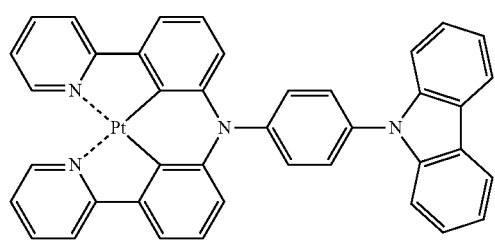
D32 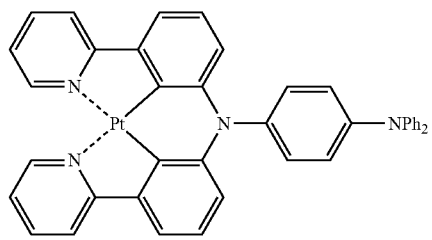
D33 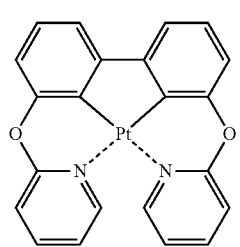
D34 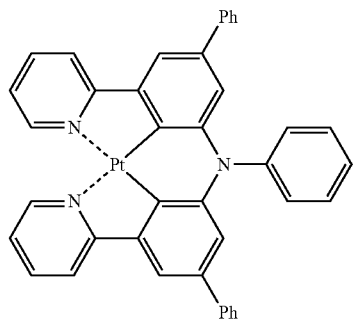
D35 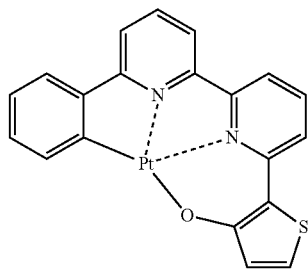
D36 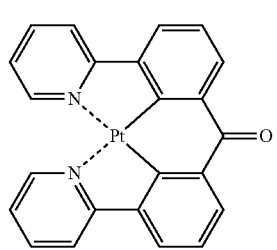

D37 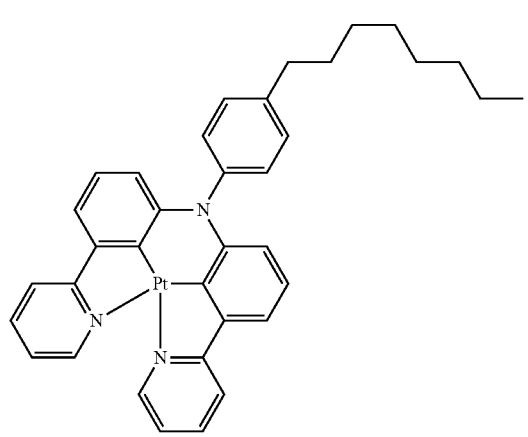
D38 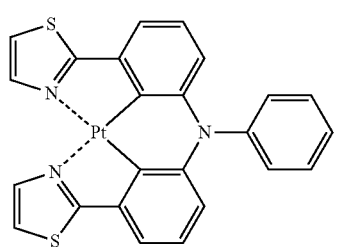
D39 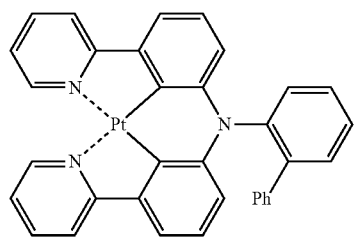
D40 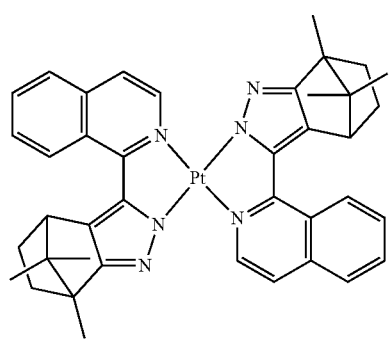
D41 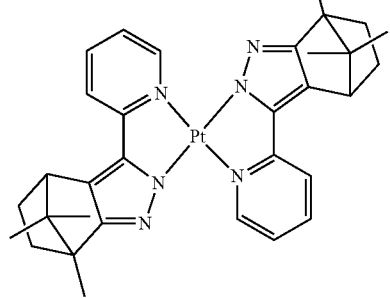
D42 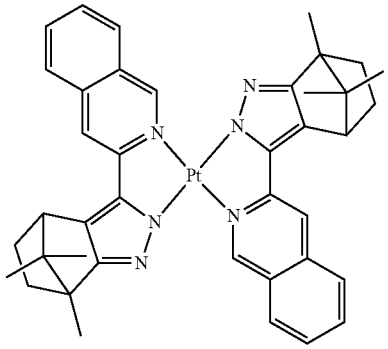
D43 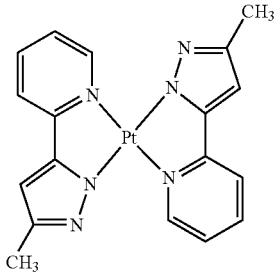
D44 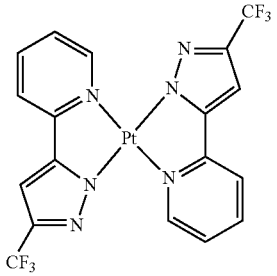
D45 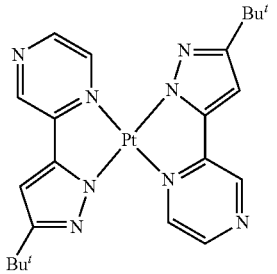
D46 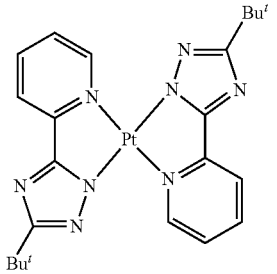

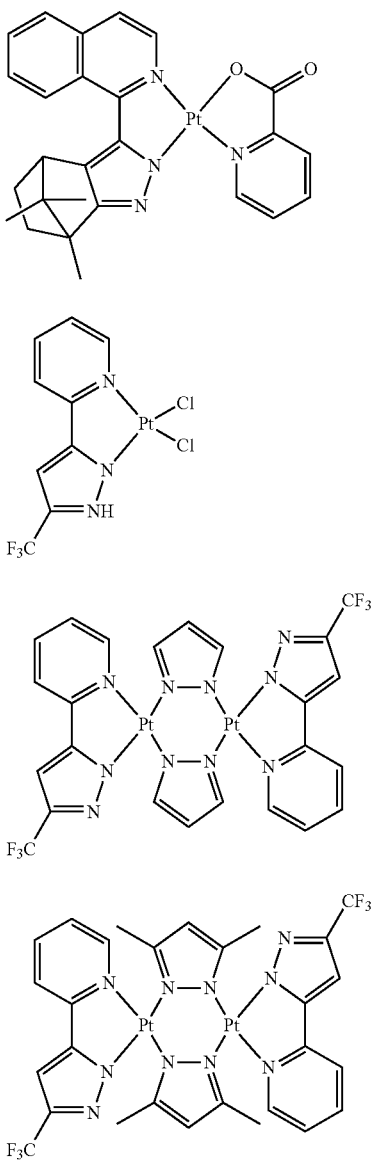

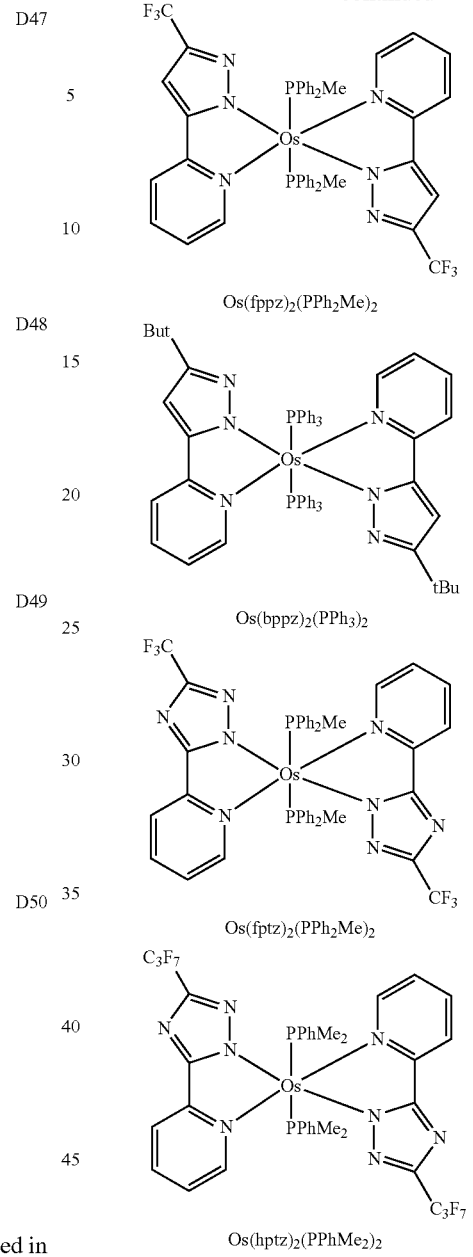

In some embodiments, the dopant that may be included in the emission layer may be an Os-complex, non-limiting examples of which include the following compounds:

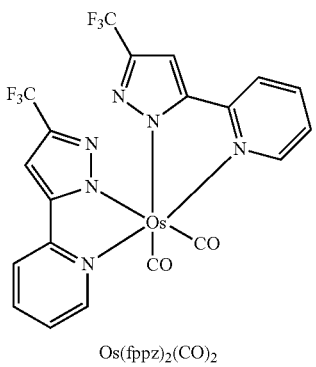

Os(fppz)₂(CO)₂

The amount of the dopant in the emission layer may be, for example, about 0.01 to about 15 parts by weight based on 100 parts by weight of the host, but is not limited thereto.

The thickness of the emission layer may be about 100 Å to about 1,000 Å, for example, about 200 Å to about 600 Å. When the thickness of the emission layer is within these ranges, good light-emission characteristics may be obtained without a substantial increase in driving voltage.

Then, an electron transport region may be disposed on the emission layer.

The electron transport region may include at least one of a hole blocking layer, an electron transport layer (ETL), or an electron injection layer, but is not limited thereto.

For example, the electron transport region may have an electron transport layer/electron injection layer structure, or a hole blocking layer/electron transport layer/electron injection layer structure, where the layers of each structure are sequentially stacked from the emission layer in the stated order, but the electron transport region is not limited thereto.

According to an embodiment of the present invention, the organic layer 15 of the organic light-emitting device 10 includes an electron transport region between the emission layer and the second electrode 17.

The electron transport region may include a hole blocking layer. The hole blocking layer may be formed when the emission layer includes a phosphorescent dopant, and functions to reduce or prevent diffusion of triplet excitons or holes into the electron transport layer.

When the electron transport region includes a hole blocking layer, the hole blocking layer may be formed on the emission layer using (utilizing) various suitable methods, such as vacuum deposition, spin coating, casting, an LB method, ink-jet printing, laser-printing, or laser-induced thermal imaging. When the hole blocking layer is formed by vacuum deposition or spin coating, the deposition or coating conditions for the hole blocking layer may be similar to the deposition or coating conditions described above for the hole injection layer.

The hole blocking layer may include, for example, at least one of BCP or Bphen, but is not limited thereto:

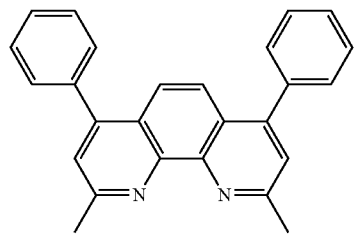

BCP

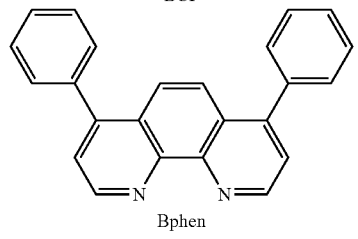

Bphen

The thickness of the hole blocking layer may be about 20 Å to about 1,000 Å, for example, about 30 Å to about 300 Å. When the thickness of the hole blocking layer is within these ranges, the hole blocking layer may have good hole blocking characteristics without a substantial increase in driving voltage.

The electron transport region may include an electron transport layer. The electron transport layer may be formed on the emission layer or the hole blocking layer using (utilizing) various suitable methods, such as vacuum deposition, spin coating, casting, an LB method, ink-jet printing, laser-printing, or laser-induced thermal imaging. When the electron transport layer is formed by vacuum deposition or spin coating, the deposition or coating conditions for the electron transport layer may be similar to the deposition or coating conditions described above for the hole injection layer.

The electron transport layer may further include, in addition to the condensed compound represented by Formula 1, at least one of BCP, Bphen, Alq$_3$, Balq, TAZ, or NTAZ, some of which are illustrated below:

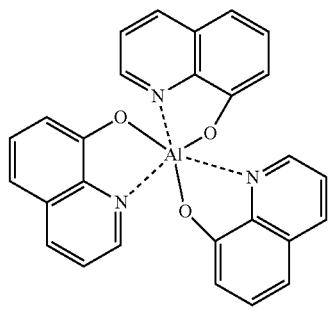

Alq3

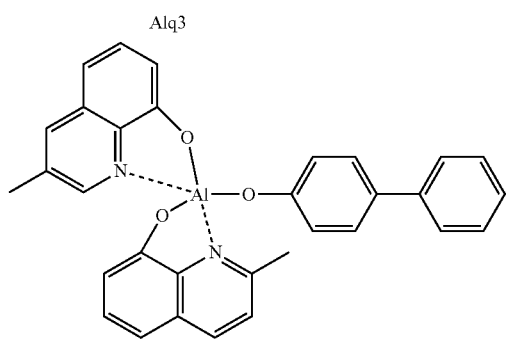

BAlq

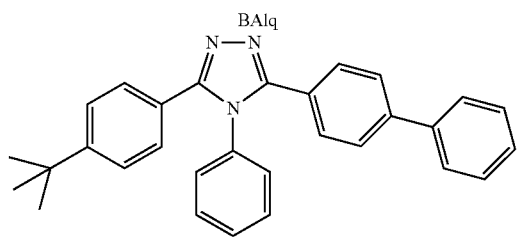

TAZ

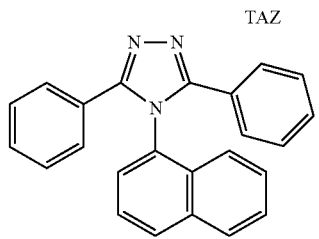

NTAZ

In some embodiments, the electron transport layer may include at least one compound represented by Formula 601:

Ar$_{601}$-[(L$_{601}$)$_{xe1}$-E$_{601}$]$_{xe2}$     Formula 601

In Formula 601,

Ar$_{601}$ is the same as Ar$_{301}$ described above in connection with Formula 301.

L$_{601}$ is the same as L$_{201}$ described above in connection with Formulae 201 and 202;

E$_{601}$ may be:

a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, or a benzocarbazolyl group; or a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, or a dibenzocarbazolyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, or a dibenzocarbazolyl group;

xe1 is 0, 1, 2, or 3; and
xe2 is 1, 2, 3, or 4.

In some embodiments, the electron transport layer may include at least one compound represented by Formula 602 below:

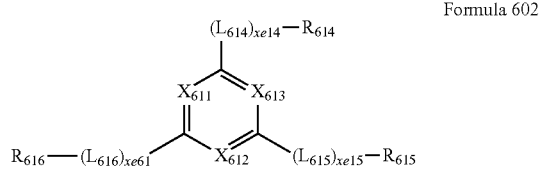

Formula 602

In Formula 602, $X_{611}$ is N or C-$(L_{611})_{xe611}$-$R_{611}$; $X_{612}$ is N or C-$(L_{612})_{xe612}$-$R_{612}$; $X_{613}$ is N or C-$(L_{613})_{xe613}$-$R_{613}$; and at least one of $X_{611}$ to $X_{613}$ is N;

each of $L_{611}$ to $L_{616}$ is the same as $L_{201}$ described above in connection with Formulae 201 and 202;

$R_{611}$ to $R_{616}$ may be each independently:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group; and xe611 to xe616 are each independently 0, 1, 2 or 3.

In some embodiments, the compound represented by Formula 601 and the compound represented by Formula 602 may include at least one of compounds ET1 to ET15 below:

ET1 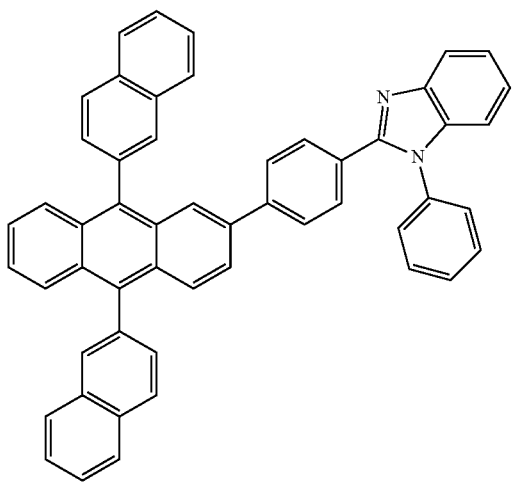
ET2 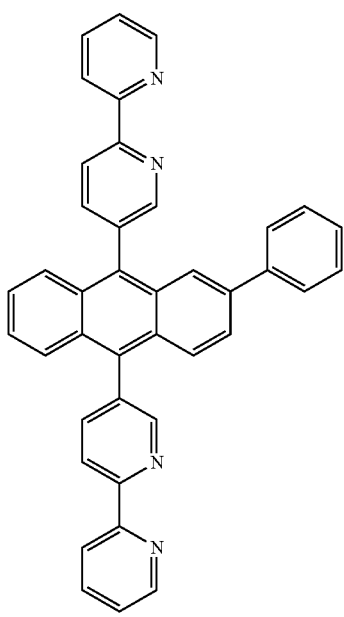
ET3 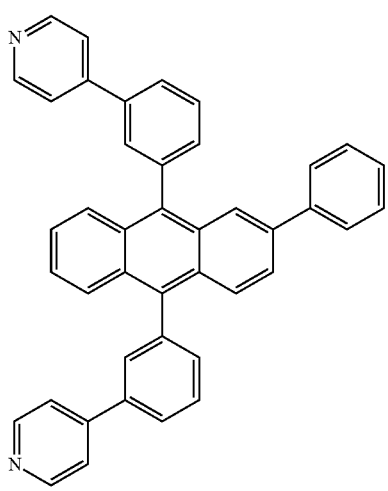
ET4 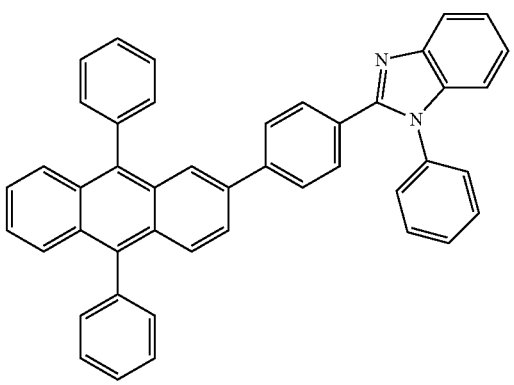
ET5 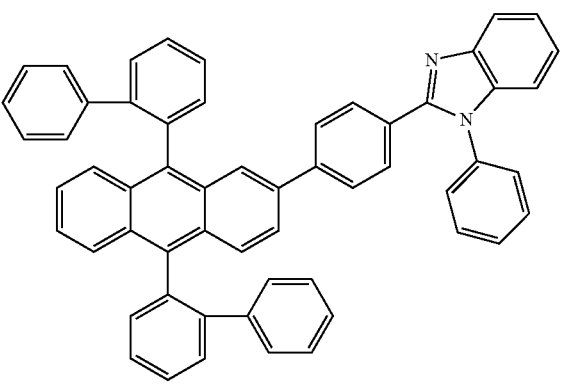
ET6 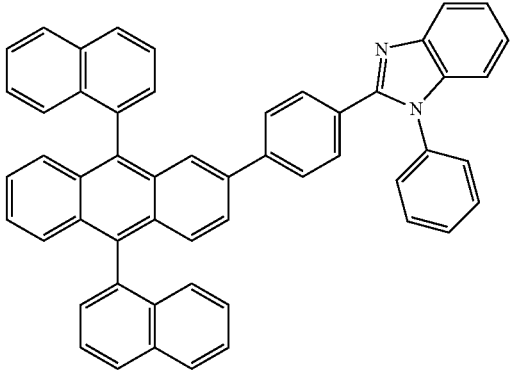

-continued
ET7
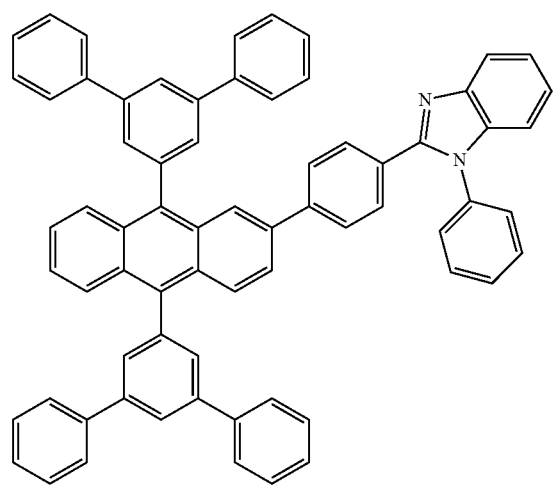
ET8
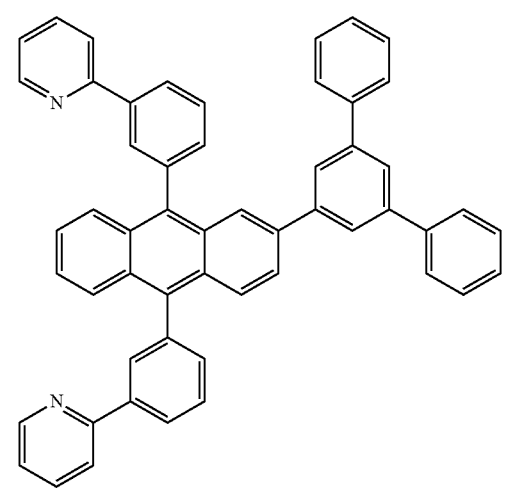
ET9
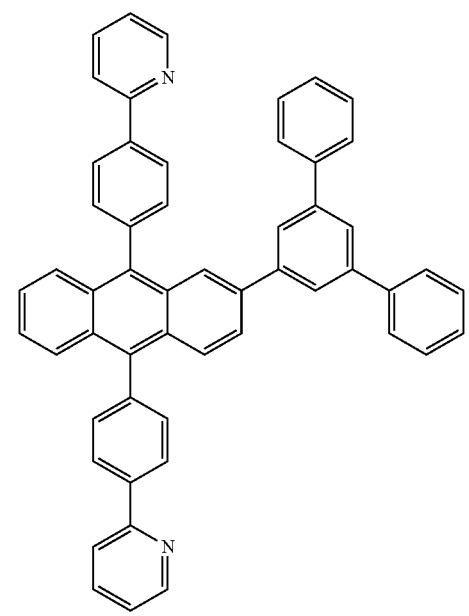
-continued
ET10
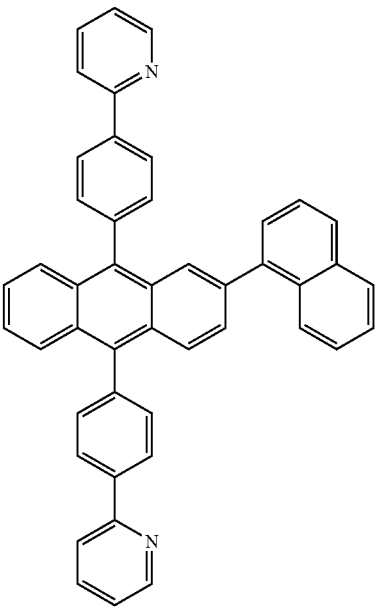
ET11
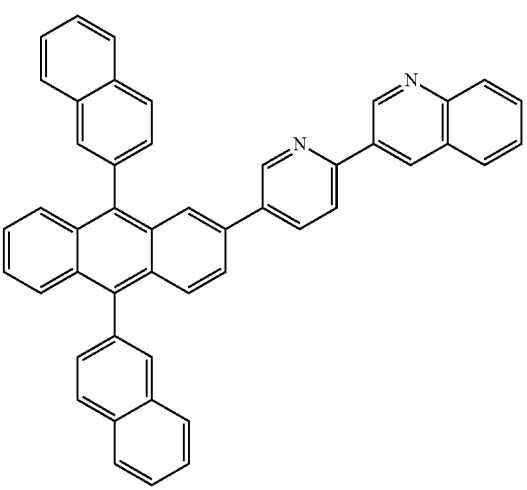
ET12
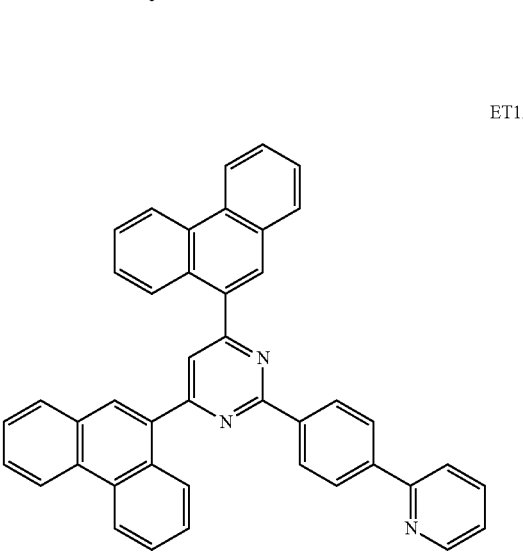

ET13

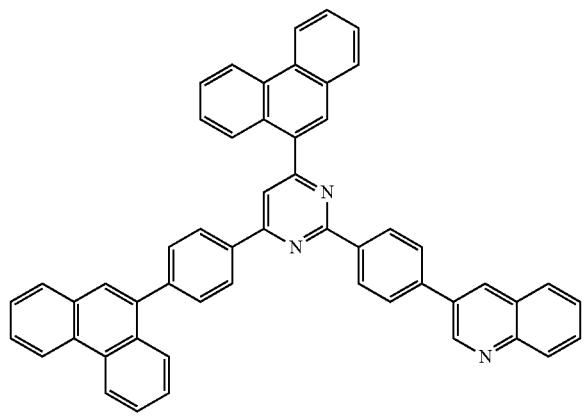

ET14

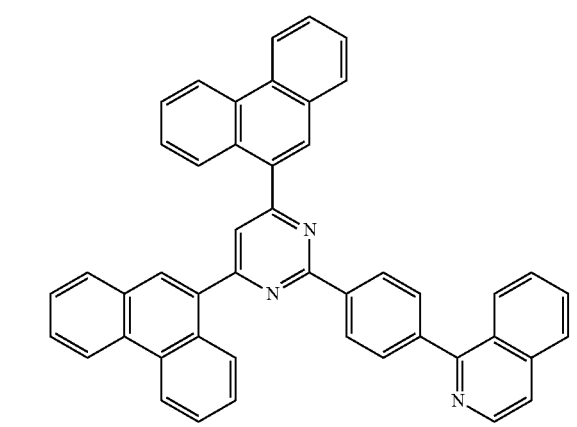

ET15

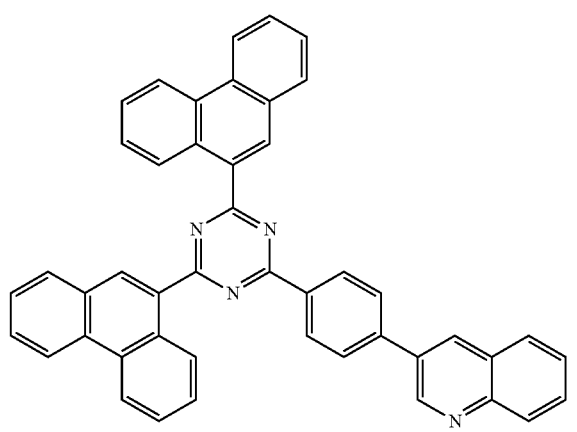

The thickness of the electron transport layer may be about 100 Å to about 1,000 Å, for example, about 150 Å to about 500 Å. When the thickness of the electron transport layer is within the ranges described above, the electron transport layer may have satisfactory electron transportation characteristics without a substantial increase in driving voltage.

Also, the electron transport layer may further include, in addition to the materials described above, a metal-containing material.

The metal-containing material may include a Li complex. The Li complex may include, for example, lithium quinolate (LiQ) or lithium [2-(2-hydroxyphenyl)benzothiazole (LiBTz) below:

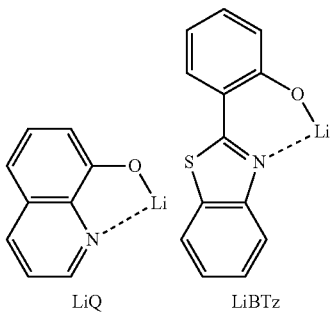

LiQ           LiBTz

The electron transport region may include an electron injection layer that allows electrons to be easily injected from the second electrode 17.

The electron injection layer may be formed on the electron transport layer using (utilizing) various suitable methods, such as vacuum deposition, spin coating, casting, an LB method, ink-jet printing, laser-printing, or laser-induced thermal imaging. When the electron injection layer is formed by vacuum deposition or spin coating, the deposition or coating conditions for the electron injection layer may be similar to the deposition or coating conditions described above for the hole injection layer.

The electron injection layer may include at least one of LiF, NaCl, CsF, $Li_2O$, BaO, or LiQ.

The thickness of the electron injection layer may be about 1 Å to about 100 Å, for example, about 3 Å to about 90 Å. When the thickness of the electron injection layer is within the ranges described above, the electron injection layer may have satisfactory electron transportation characteristics without a substantial increase in driving voltage.

The second electrode 17 is disposed on the organic layer 15. The second electrode 17 may be a cathode (i.e., an electron injection electrode), and a material for forming the second electrode 17 may be a material having a low work function. Such a material may include a metal, an alloy, an electrically conductive compound, or a mixture thereof. Non-limiting examples of the second electrode 17 include lithium (Li), magnesium (Mg), aluminum (Al), aluminum-lithium (Al—Li), calcium (Ca), magnesium-indium (Mg—In), or magnesium-silver (Mg—Ag). According to another embodiment of the present invention, the material for forming the second electrode 190 may be ITO or IZO. The second electrode 17 may be a reflective electrode, a semi-transmissive electrode, or a transmissive electrode.

Hereinbefore, the organic light-emitting device 10 has been described with reference to the drawing, but the organic light-emitting device 10 is not limited thereto. For example, in the organic light-emitting device 10 shown in the drawing, the substrate 11 is disposed underneath the first electrode 13, but the substrate 11 may be disposed above the second electrode 17.

As used herein, the term "alkyl group" refers to a linear or branched monovalent aliphatic hydrocarbon group, and non-limiting examples thereof include a methyl group, an ethyl group, a propyl group, an isobutyl group, a sec-butyl group, a ter-butyl group, a pentyl group, an iso-amyl group, and a hexyl group. As used herein, the term "alkylene group" refers to a linear or branched divalent aliphatic hydrocarbon group, non-limiting examples of which can be easily determined from the examples of the alkyl groups.

As used herein, the term "alkoxy group" refers to a monovalent group represented by $-OA_{101}$ (where $A_{101}$ is a $C_1$-$C_{60}$ alkyl group), and non-limiting examples thereof include a methoxy group, an ethoxy group, and an isopropyloxy group.

As used herein, the term "alkenyl group" refers to a hydrocarbon group having at least one carbon-carbon double bond in the middle or at a terminal end of the alkyl group, and non-limiting examples thereof include an ethenyl group, a propenyl group and a butenyl group. As used herein, the term "alkenylene group" refers to a divalent hydrocarbon group having at least one carbon-carbon double bond, and non-limiting examples of which can be easily determined from the examples of the alkenyl groups.

As used herein, the term "alkynyl group" refers to a hydrocarbon group having at least one carbon-carbon triple bond in the middle or at a terminal end of the alkyl group, and non-limiting examples thereof include an ethynyl group and a propynyl group. As used herein, the term "alkynylene group" refers to a divalent hydrocarbon group having at least one carbon-carbon triple bond in the middle or at a terminal end of the alkyl group, and non-limiting examples of which can be easily determined from the examples of the alkynyl groups.

As used herein, the term "cycloalkyl group" refers to a monovalent hydrocarbon monocyclic group, and non-limiting examples thereof include a cyclopropyl group, a cyclobutyl group, a cyclopentyl group, a cyclohexyl group, and a cycloheptyl group. As used herein, the term "cycloalkylene group" refers to a divalent hydrocarbon monocyclic group, and non-limiting examples of which can be easily determined from the examples of the cycloalkyl groups.

As used herein, the term "heterocycloalkyl group" refers to a monovalent monocyclic group having at least one heteroatom selected from N, O, P, or S as a ring-forming atom, and non-limiting examples thereof include a tetrahydrofuranyl group and a tetrahydrothiophenyl group. As used herein, the term "heterocycloalkylene group" refers to a divalent monocyclic group having at least one heteroatom selected from N, O, P, or S as a ring-forming atom, and non-limiting examples of which can be easily determined from the examples of the heterocycloalkyl groups.

As used herein, the term "cycloalkenyl group" refers to a monovalent monocyclic group that has at least one double bond in the ring thereof and does not have aromacity, and non-limiting examples thereof include a cyclopentenyl group, a cyclohexenyl group, and a cycloheptenyl group. As used herein, the term "cycloalkenylene group" refers to a divalent monocyclic group that has at least one double bond in the ring thereof and does not have aromacity, and non-limiting examples of which can be easily determined from the examples of the cycloalkenyl group.

As used herein, the term "heterocycloalkenyl group" refers to a monovalent monocyclic group that has at least one heteroatom selected from N, O, P, or S as a ring-forming atom and at least one double bond in its ring. Non-limiting examples of the heterocycloalkenyl include a 2,3-hydrofuranyl group and a 2,3-hydrothiophenyl group. As used herein, the term "heterocycloalkenylene group" refers to a divalent monocyclic group that has at least one heteroatom selected from N, O, P, or S as a ring-forming atom and at least one double bond in its ring, and non-limiting examples of which can be easily determined from the examples of the heterocycloalkenyl groups.

As used herein, the term "aryl group" refers to a monovalent group having a carbocyclic aromatic system, and the term "arylene group" refers to a divalent group having a carbocyclic aromatic system. Non-limiting examples of the aryl group include a phenyl group, a naphthyl group, an anthracenyl group, a phenanthrenyl group, a pyrenyl group, and a chrysenyl group. When the aryl group and the arylene group each include two or more rings, the rings may be fused to each other.

As used herein, the term "heteroaryl group" refers to a monovalent group having a carbocyclic aromatic system that has at least one heteroatom selected from N, O, P, or S as a ring-forming atom. As used herein, the term "heteroarylene group" refers to a divalent group having a carbocyclic aromatic system that has at least one heteroatom selected from N, O, P, or S as a ring-forming atom, and 2 to 60 carbon atoms. Non-limiting examples of the heteroaryl group include a pyridinyl group, a pyrimidinyl group, a pyrazinyl group, a pyridazinyl group, a triazinyl group, a quinolinyl group, and an isoquinolinyl group. When the heteroaryl group and the heteroarylene group each include two or more rings, the rings may be fused to each other.

As used herein, the term "aryloxy group" refers to a functional group represented by —$OA_{102}$ (where $A_{102}$ is an aryl group), and the term "arylthio group" refers to a functional group represented by —$SA_{103}$ (where $A_{103}$ is an aryl group).

As used herein, the term "monovalent non-aromatic condensed polycyclic group" refers to a monovalent group that has two or more rings condensed to each other and non-aromacity in the entire molecular structure. As a ring-forming atom, i) only a carbon atom (C) may be included, or ii) a hetero atom selected from N, O, P, or S, other than carbon atoms, may be included. Non-limiting examples of the monovalent non-aromatic condensed polycyclic group include a heptalenyl group and a triquinacenyl group. As used herein, the term "divalent non-aromatic condensed polycyclic group" refers to a divalent group that has two or more rings condensed to each other and non-aromacity in the entire molecular structure, and non-limiting examples of which can be easily determined from the examples of the monovalent non-aromatic condensed polycyclic groups.

As used herein, $C_m$-$C_n$ (min) refers to the number of carbons in the substituents (i.e., m and n refer to the number of carbons). For example, a $C_1$-$C_{10}$ alkyl group refers to an alkyl group having 1 to 10 carbon atoms, and a $C_6$-$C_{30}$ aryl group refers to an aryl group having 6 to 30 carbon atoms.

The term "Ph" used herein refers to a phenyl group; the term "Me" used herein refers to a methyl group; the term "Et" used herein refers to an ethyl group; and the term "ter-Bu" or "t-Bu" used herein refers to a tert-butyl group.

Hereinafter, an organic light-emitting device according to embodiments of the present invention will be described with reference to certain Synthesis Examples and Examples. The wording "B was used (utilized) instead of A" used in the following Synthesis Examples means that the molar equivalent of A was identical to the molar equivalent of B.

SYNTHESIS EXAMPLE

Synthesis Example 1

Synthesis of Compound 101

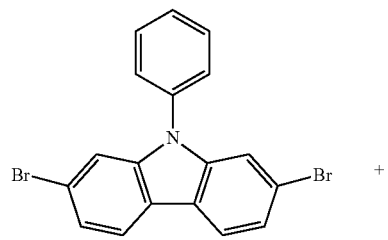 +

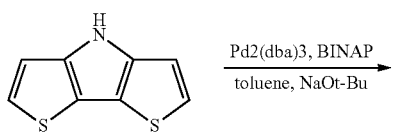

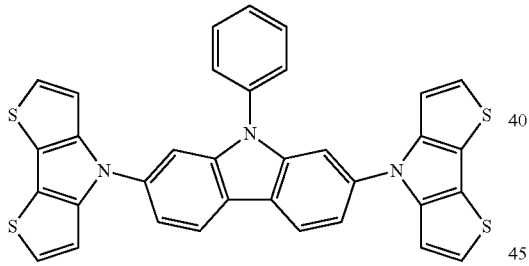

357.3 mg (0.39 mmol) of Pd$_2$(dba)$_3$ and 157.9 mg (0.78 mmol) of t-Bu$_3$P were dissolved in 50 ml of o-xylene, and then, the mixture was stirred at room temperature for 10 minutes. Then, 8.23 g (46 mmol) of 4H-dithieno[3,2-b:2′,3′-d]pyrrole, 7.98 g (20 mmol) of 2,7-dibromo-9-phenyl-9H-carbazole, and 2.25 g (23.41 mmol) of t-BuONa were added thereto and stirred under reflux at a temperature of 160° C. for 48 hours. When the reaction was completed, 20 ml of cold distilled water was added thereto, and then the organic layer was extracted using (utilizing) ethylacetate. The organic layer was dried using (utilizing) magnesium sulfate, filtered, and the solvent was evaporated therefrom. Then, the resultant was purified using (utilizing) silica gel column chromatography to obtain 10.10 g (yield 85%) of Compound 101 (4,4′-(9-phenyl-9H-carbazole-2,7-diyl)bis(4H-dithieno[3,2-b:2′,3′-d]pyrrole)).

$^1$H-NMR (300 MHz, CDCl$_3$): δ=8.45 (1H), 8.10 (1H), 7.88 (2H), 7.88 (d, 2H), 7.58 (2H), 7.54 (1H), 7.50 (2H), 7.23 (1H), 7.20 (4H), 6.96 (4H), APCI-MS (m/z): 597 [M$^+$]

Synthesis Example 2

Synthesis of Compound 135

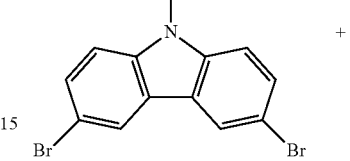 +

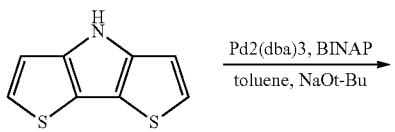

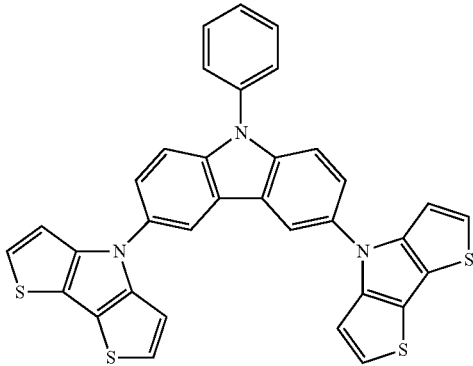

357.3 mg (0.39 mmol) of Pd$_2$(dba)$_3$ and 157.9 mg (0.78 mmol) of t-Bu$_3$P were dissolved in 50 ml of o-xylene and then stirred at room temperature for 10 minutes. 8.23 g (46 mmol) of 4H-dithieno[3,2-b:2′,3′-d]pyrrole, 7.98 g (20 mmol) of 3,6-dibromo-9-phenyl-9H-carbazole, and 2.25 g (23.41 mmol) of t-BuONa were added thereto and then stirred under reflux at a temperature of 160° C. for 48 hours. After the reaction was completed, 20 ml of cold distilled water was added thereto, and then the organic layer was extracted using (utilizing) ethylacetate. The organic layer was dried using (utilizing) magnesium sulfate, filtered, and the solvent was evaporated therefrom. Then, the resultant was purified using (utilizing) silica gel column chromatography to obtain 9.55 g (yield 80%) of Compound 135 (4,4′-(9-phenyl-9H-carbazole-3,6-diyl)bis(4H-dithieno[3,2-b:2′,3′-d]pyrrole)).

$^1$H-NMR: 7.98 (2H), 7.94 (1H), 7.63 (2H), 7.58 (2H), 7.50 (2H), 7.31 (1H), 7.20 (4H), 6.96 (4H), APCI-MS (m/z): 597[M$^+$]

Synthesis Example 3

Synthesis of Compound 104

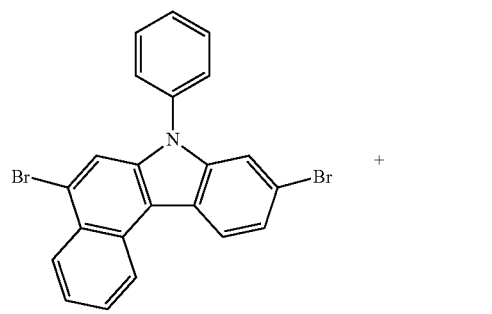

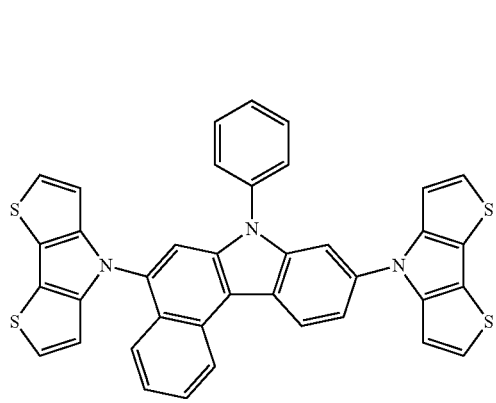

357.3 mg (0.39 mmol) of $Pd_2(dba)_3$ and 157.9 mg (0.78 mmol) of $t-Bu_3P$ were dissolved in 50 ml of o-xylene and then stirred at room temperature for 10 minutes. 8.23 g (46 mmol) of 4H-dithieno[3,2-b:2',3'-d]pyrrole, 8.97 g (20 mmol) of 5,9-dibromo-7-phenyl-7H-benzo[c]carbazole, and 2.25 g (23.41 mmol) of t-BuONa were added thereto and then stirred under reflux at a temperature of 160° C. for 48 hours. After the reaction was completed, 20 ml of cold distilled water was added thereto, and then the organic layer was extracted using (utilizing) ethylacetate. The organic layer was dried using (utilizing) magnesium sulfate, filtered, and the solvent was evaporated therefrom. Then, the resultant was purified using (utilizing) silica gel column chromatography to obtain 9.70 g (yield 75%) of Compound 104 (4,4'-(7-phenyl-7H-benzo[c]carbazole-5,9-diyl)bis(4H-dithieno[3,2-b:2',3'-d]pyrrole)).

$^1$H-NMR: 8.55 (1H), 8.43 (1H), 8.08 (1H), 7.83 (2H), 7.58 (2H), 7.55 (2H), 7.54 (1H) 7.50 (2H), 7.45 (1H), 7.20 (4H), 6.96 (4H), APCI-MS (m/z): 647[M+]

Synthesis Example 4

Synthesis of Compound 143

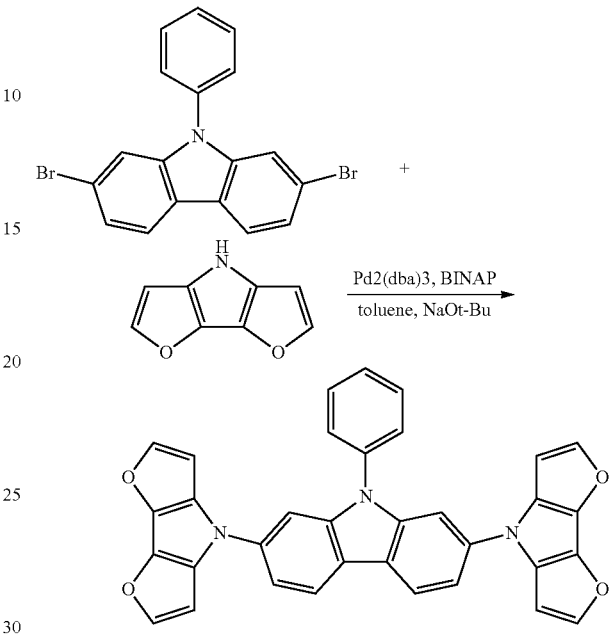

357.3 mg (0.39 mmol) of $Pd_2(dba)_3$ and 157.9 mg (0.78 mmol) of $t-Bu_3P$ were dissolved in 50 ml of o-xylene and then stirred at room temperature for 10 minutes. 6.76 g (46 mmol) of 4H-difuro[3,2-b:2',3'-d]pyrrole, 10.6 g (20 mmol) of 5,9-dibromo-7-phenyl-7H-benzo[c]carbazole, and 2.25 g (23.41 mmol) of t-BuONa were added thereto and then stirred under reflux at a temperature of 160° C. for 48 hours. After the reaction was completed, 20 ml of cold distilled water was added thereto, and then the organic layer was extracted using (utilizing) ethylacetate. The organic layer was dried using (utilizing) magnesium sulfate, filtered, and then the solvent was evaporated therefrom. Then, the resultant was purified using (utilizing) silica gel column chromatography to obtain 8.53 g (yield 82%) of Compound 143 (4,4'-(9-phenyl-9H-carbazole-2,7-diyl)bis(4H-difuro[3,2-b:2',3'-d]pyrrole)).

$^1$H-NMR: 8.43 (1H), 8.13 (4H), 8.08 (1H), 7.83 (2H), 7.58 (2H), 7.55 (1H), 7.50 (2H), 7.23 (1H), 6.30 (4H), APCI-MS (m/z): 533[M+]

EXAMPLE

Example 1

An ITO glass substrate (a product of Corning Co., Ltd) including an ITO layer having a thickness of 15 $\Omega/cm^2$ (1200 Å) was cut to a size of 50 mm×50 mm×0.7 mm, sonicated using (utilizing) isopropyl alcohol and pure water each for 5 minutes, and cleaned by exposure to ultraviolet rays for 30 minutes and then to ozone. Then, the ITO glass substrate was mounted on a vacuum deposition apparatus.

2-TNATA was deposited on the ITO layer (acting as an anode) to form a hole injection layer having a thickness of 600 Å. Compound 101 was deposited on the hole injection layer to form a hole transport layer having a thickness of 300 Å. Then, 95 wt % of ADN and 5 wt % of Compound A-1 below ((E)-N,N'-(ethene-1,2-diylbis(4,1-phenylene))bis(N-(naphthalen-2-yl)naphthalen-2-amine, as a blue dopant) were co-deposited on the hole transport layer to form an emission layer having a thickness of 200 Å.

Thereafter, Compound A-2 (2-(4-(9,10-di(naphthalen-2-yl)anthracen-2-yl)phenyl)-1-phenyl-1H-benzo[d]imidazole) was deposited on the emission layer to form an electron transport layer having a thickness of 300 Å, LiF was deposited on the electron transport layer to form an electron injection layer having a thickness of 10 Å, and Al was deposited on the electron injection layer to form a cathode having a thickness of 3,000 Å, thereby completing the manufacture of an organic light-emitting device.

Compound A-1

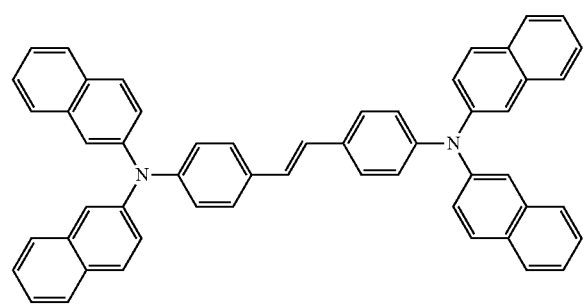

Compound A-2

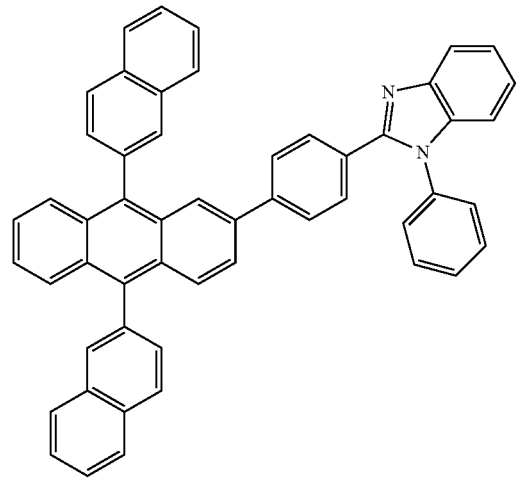

ET1

Example 2

An organic light-emitting device was manufactured as in Example 1, except that Compound 135 was used (utilized) instead of Compound 101 to form the HTL.

Example 3

An organic light-emitting device was manufactured as in Example 1, except that Compound 104 was used (utilized) instead of Compound 101 to form the HTL.

Example 4

An organic light-emitting device was manufactured as in Example 1, except that Compound 143 was used (utilized) instead of Compound A-2 to form the ETL.

Comparative Example 1

An organic light-emitting device was manufactured as in Example 1, except that NPB was used (utilized) instead of Compound 101 to form the HTL.

Comparative Example 2

An organic light-emitting device was manufactured as in Example 1, except that NPB was used (utilized) instead of Compound 101 to form the HTL, and Compound 143 was used (utilized) instead of Compound A-2 to form the ETL.

Evaluation Example

The driving voltage and emission efficiency of each of the organic light-emitting devices manufactured according to Examples 1 to 4 and Comparative Example 1 were measured under the condition of 10 mA/cm$^2$, and the results are shown in Table 1.

TABLE 1

| | Hole transport layer | Electron transport layer | Driving voltage (V) | Brightness (cd/m$^2$) | Emission efficiency (cd/A) | Emission color |
|---|---|---|---|---|---|---|
| Example 1 | Compound 101 | Compound A-2 | 3.9 | 485 | 4.85 | Blue |
| Example 2 | Compound 135 | Compound A-2 | 4.0 | 467 | 4.67 | Blue |
| Example 3 | Compound 104 | Compound A-2 | 3.9 | 477 | 4.77 | Blue |
| Example 4 | Compound 101 | Compound 143 | 3.8 | 437 | 4.37 | Blue |
| Comparative Example 1 | NPB | Compound A-2 | 4.4 | 285 | 2.85 | Blue |
| Comparative Example 2 | NPB | Compound 143 | 4.2 | 321 | 3.21 | Blue |

As shown in Table 1, it was confirmed that the driving voltage, brightness, current efficiency, and half-lifespan of the organic light-emitting devices manufactured according to Examples 1 to 4 had better driving voltage, current density, brightness, efficiency, and half-lifespan than the organic light-emitting devices manufactured according to Comparative Examples 1 and 2.

As described above, according to embodiments of the present invention, an organic light-emitting device including the described condensed cyclic compound may have low driving voltage, high efficiency, high brightness, and a long lifespan.

While certain exemplary embodiments have been illustrated and described, those of ordinary skill in the art will understand that certain modifications can be made to the described embodiments without departing from the spirit and scope of the present invention, as defined in the following claims. Additionally, descriptions of features or aspects within each embodiment should typically be considered as available for other similar features or aspects in other embodiments.

What is claimed is:

1. A condensed cyclic compound represented by Formula 1:

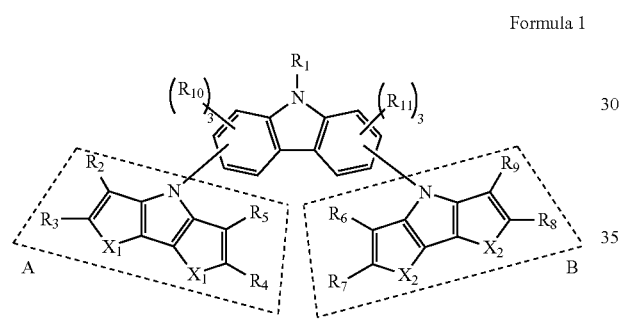

Formula 1 wherein, as shown in Formula 1,
A is represented by

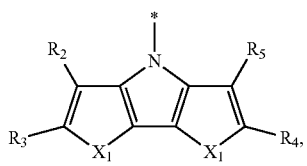

B is represented by

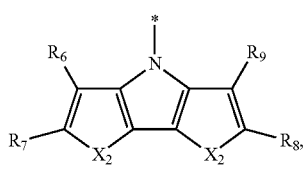

and wherein,
$X_1$ and $X_2$ are each independently an oxygen (O) atom or a sulfur (S) atom;
$R_1$ is a $C_6$-$C_{10}$ aryl group or a $C_3$-$C_{10}$ heteroaryl group;
$R_2$ to $R_{11}$ are each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_2$-$C_{30}$ heteroaryl group, a substituted or unsubstituted $C_6$-$C_{30}$ aryloxy group, a substituted or unsubstituted $C_6$-$C_{30}$ arylthio group, or a monovalent $C_6$-$C_{30}$ non-aromatic condensed polycyclic group;
each of the $R_{10}$s and each of the $R_{11}$s are the same or different;
$R_2$ and $R_3$, $R_4$ and $R_5$, $R_6$ and $R_7$, $R_8$ and $R_9$, or two $R_{10}$s optionally combine to form a substituted or unsubstituted ring;
when one or more of $R_2$ to $R_{11}$ includes a substituted group, at least one substituent of the substituted $C_1$-$C_{10}$ alkyl group, substituted $C_2$-$C_{10}$ alkenyl group, substituted $C_2$-$C_{10}$ alkynyl group, substituted $C_1$-$C_{10}$ alkoxy group, substituted $C_3$-$C_{10}$ cycloalkyl group, substituted $C_3$-$C_{10}$ cycloalkenyl group, substituted $C_3$-$C_{10}$ heterocycloalkyl group, substituted $C_3$-$C_{10}$ heterocycloalkenyl group, substituted $C_6$-$C_{30}$ aryl group, substituted $C_2$-$C_{30}$ heteroaryl group, substituted $C_6$-$C_{30}$ aryloxy group, or substituted $C_6$-$C_{30}$ arylthio group is:
a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, or a $C_1$-$C_{10}$ alkoxy group; or
a $C_1$-$C_{10}$ alkyl group, a $C_2$-$C_{10}$ alkenyl group, a $C_2$-$C_{10}$ alkynyl group, or a $C_1$-$C_{10}$ alkoxy group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, a monovalent $C_6$-$C_{30}$ non-aromatic condensed polycyclic group, —N($Q_{11}$)($Q_{12}$), —Si($Q_{13}$)($Q_{14}$)($Q_{15}$), or —B($Q_{16}$)($Q_{17}$); or
a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, or a monovalent $C_2$-$C_{30}$ non-aromatic condensed polycyclic group; or
a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, or a monovalent $C_6$-$C_{30}$ non-aromatic condensed polycyclic group, substituted with at least one of a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, a $C_6$-$C_{30}$ aryloxy group, a $C_6$-$C_{30}$ arylthio group, a monovalent $C_6$-$C_{30}$ non-aromatic condensed polycyclic group, —N($Q_{21}$)($Q_{22}$), —Si($Q_{23}$)($Q_{24}$)($Q_{25}$), or —B($Q_{26}$)($Q_{27}$); or —Si($Q_{31}$)($Q_{32}$)($Q_{33}$) or —B($Q_{34}$)($Q_{35}$), wherein $Q_{11}$ to $Q_{17}$, $Q_{21}$ to $Q_{27}$, and $Q_{31}$ to $Q_{35}$ are each independently a hydrogen, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_2$-$C_{30}$ heteroaryl group, or a monovalent $C_6$-$C_{30}$ non-aromatic condensed polycyclic group, and, \* indicates a binding site to the carbazole group.

2. The condensed cyclic compound of claim 1, wherein $X_1$ and $X_2$ are identical to each other.

3. The condensed cyclic compound of claim 1, wherein $R_1$ is a phenyl group, a naphthyl group, a pyridyl group, or a triazinyl group.

4. The condensed cyclic compound of claim 1, wherein $R_1$ is represented by one of Formulae 2A to 2E:

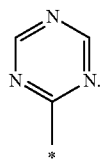

5. The condensed cyclic compound of claim 1, wherein $R_2$ to $R_{11}$ are each independently:

a hydrogen, a methyl group, an ethyl group, a propyl group, a butyl group, a pentyl group, a hexyl group, a heptyl group, an octyl group, a nonyl group, a decyl group, a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a pyridoindolyl group, a dibenzofuryl group, a phenanthridinyl group, a benzoquinolyl group, a phenazinyl group, a dibenzosilolyl group, a dibenzothiophenyl group, a benzocarbazolyl group, or a dibenzacridinyl group; or a methyl group, an ethyl group, a propyl group, a butyl group, a pentyl group, a hexyl group, a heptyl group, an octyl group, a nonyl group, or a decyl group, substituted with at least one of a deuterium, a halogen atom, a hydroxyl group, a cyano group, a nitro group, or an amino group; or a phenyl group, a pentalenyl group, an indenyl group, a naphthyl group, an azulenyl group, an indacenyl group, an acenaphthyl group, a biphenyl group, a heptalenyl group, a phenalenyl group, a fluorenyl group, a phenanthrenyl group, an anthryl group, a fluoranthenyl group, a pyrenyl group, a benzofluorenyl group, a naphthacenyl group, a chrysenyl group, a triphenylenyl group, a terphenyl group, a perylenyl group, a picenyl group, a hexacenyl group, a spiro-fluorenyl group, a pyrrolyl group, a furyl group, a pyrazolyl group, an imidazolyl group, an oxazolyl group, an isoxazolyl group, a triazolyl group, a tetrazolyl group, an oxadiazolyl group, a pyridyl group, a pyrimidinyl group, a pyrazinyl group, a pyridazinyl group, a triazinyl group, a pyranyl group, a thiophenyl group, a thiazolyl group, an isothiazolyl group, a thiopyranyl group, an indolyl group, an isoindolyl group, an indolizinyl group, a benzofuryl group, an isobenzofuryl group, an indazolyl group, a benzimidazolyl group, a benzoxazolyl group, a benzisoxazolyl group, an imidazopyridyl group, a purinyl group, a quinolyl group, an isoquinolyl group, a phthalazinyl group, a quinazolinyl group, a quinoxalinyl group, a naphthyridinyl group, a cinnolinyl group, a benzothiophenyl group, a benzothiazolyl group, a carbazolyl group, a pyridoindolyl group, a dibenzofuryl group, a phenanthridinyl group, a benzoquinolyl group, a phenazinyl group, a dibenzosilolyl group, a dibenzothiophenyl group, or a benzocarbazolyl group, substituted with at least one of a deuterium, a halogen atom, a hydroxyl group, a cyano group, a nitro group, an amino group, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{30}$ aryl group, a $C_4$-$C_{30}$ heteroaryl group, a $C_6$-$C_{30}$ aryloxy group, a $C_6$-$C_{30}$ arylthio group, or —Si($Q_{31}$)($Q_{32}$)($Q_{33}$) wherein $Q_{31}$ to $Q_{33}$ are each independently a hydrogen, a $C_1$-$C_{10}$ alkyl group, a $C_1$-$C_{10}$ alkoxy group, or a $C_6$-$C_{20}$ aryl group.

6. The condensed cyclic compound of claim 1, wherein $R_2$ to $R_{11}$ are each independently:

a hydrogen, a methyl group, an ethyl group, a propyl group, a butyl group, a phenyl group, a naphthyl group, a fluorenyl group, an anthryl group, a pyrenyl group, a chrysenyl group or a triphenylenyl group; or a methyl group, an ethyl group, a propyl group, a butyl group, a phenyl group, a naphthyl group, a fluorenyl group, an anthryl group, a pyrenyl group, a chrysenyl group, or a triphenylenyl group, substituted with at least one of a deuterium, a halogen atom, a hydroxyl group, a cyano group, a nitro group, or an amino group; and $R_2$ and $R_3$, $R_4$ and $R_5$, $R_6$ and $R_7$, $R_8$ and $R_9$, or two $R_{10}$s optionally combine to form a substituted or unsubstituted benzene ring.

7. The condensed cyclic compound of claim 1, wherein, in Formula 1, A and B are each independently represented by one of Formulae 3A to 3E:

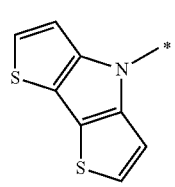

3A

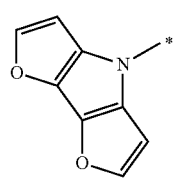

3B

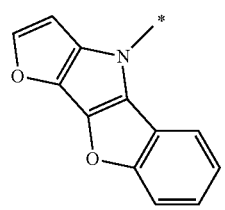

3C

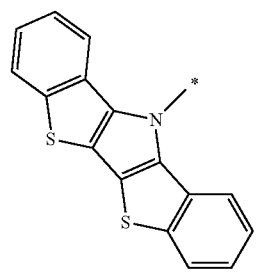

3D

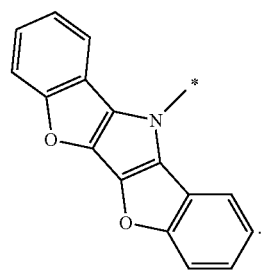

3E

8. The condensed cyclic compound of claim 1, wherein the condensed cyclic compound represented by Formula 1 is represented by one of Formulae 1-1 to 1-3:

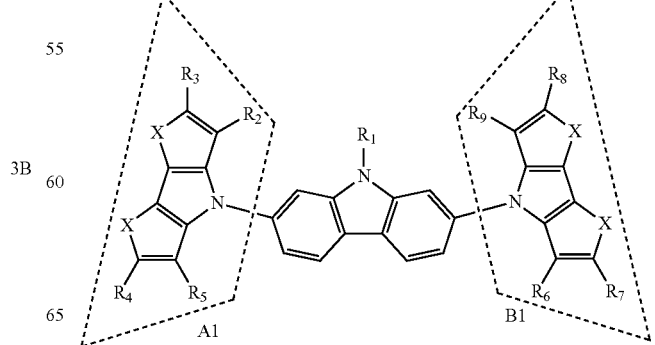

Formula 1-1

Formula 1-2

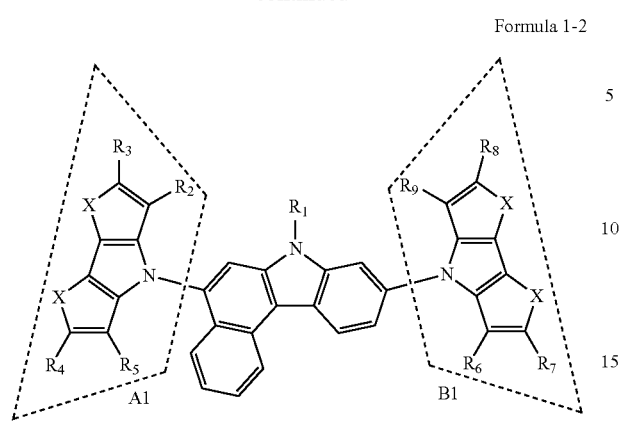

Formula 1-3

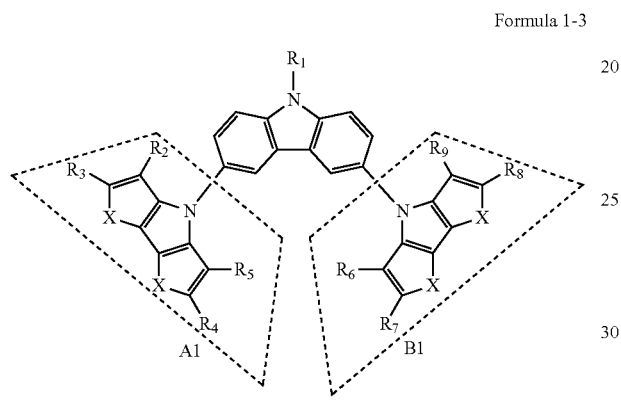

wherein, as shown in Formulae 1-1 to 1-3,

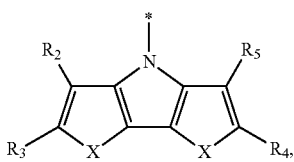

A1 is represented by

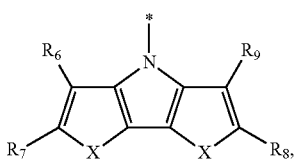

B1 is represented by and wherein,

X is an oxygen (O) atom or a sulfur (S) atom, and

* indicates a binding site to the carbazole group.

9. The condensed cyclic compound of claim 8, wherein R₁ is a phenyl group, a naphthyl group, a pyridyl group, or a triazinyl group.

10. The condensed cyclic compound of claim 8, wherein R₁ is represented by one of Formulae 2A to 2E:

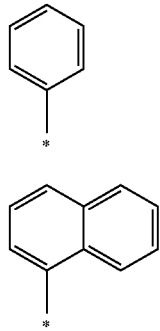
2A

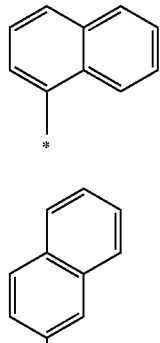
2B

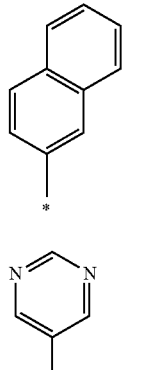
2C

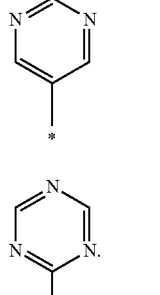
2D

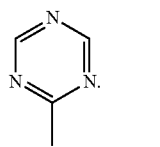
2E

11. The condensed cyclic compound of claim 8, wherein R₂ to R₉ are each independently:
 a hydrogen, a methyl group, an ethyl group, a propyl group, a butyl group, a phenyl group, a naphthyl group, a fluorenyl group, an anthryl group, a pyrenyl group, a chrysenyl group, or a triphenylenyl group; or
 a methyl group, an ethyl group, a propyl group, a butyl group, a phenyl group, a naphthyl group, a fluorenyl group, an anthryl group, a pyrenyl group, a chrysenyl group, or a triphenylenyl group, substituted with at least one of a deuterium, a halogen atom, a hydroxyl group, a cyano group, a nitro group, or an amino group;
 R₂ and R₃, R₄ and R₅, R₆ and R₇, or R₈ and R₉ optionally combine to form a substituted or unsubstituted benzene ring.

12. The condensed cyclic compound of claim 8, wherein A1 and B1 are each independently represented by one of Formulae 3A to 3E:

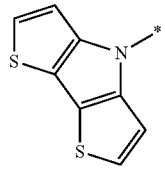
3A

-continued
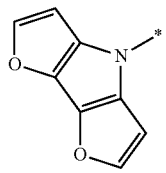
3B
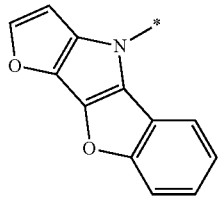
3C
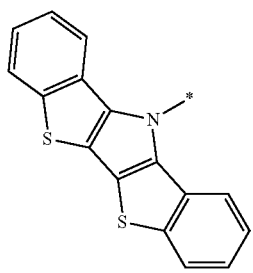
3D
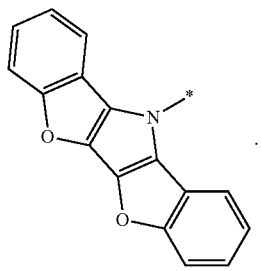
3E
13. The condensed cyclic compound of claim 1, wherein the condensed cyclic compound of Formula 1 is represented by one of Compounds 101 to 148:
101
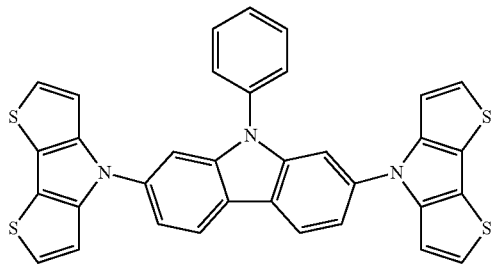
-continued
102
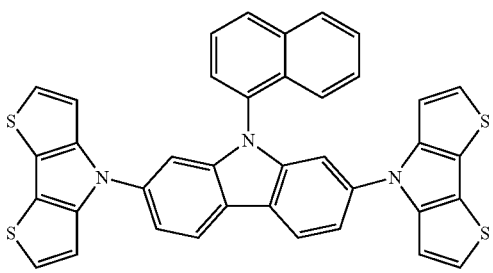
103
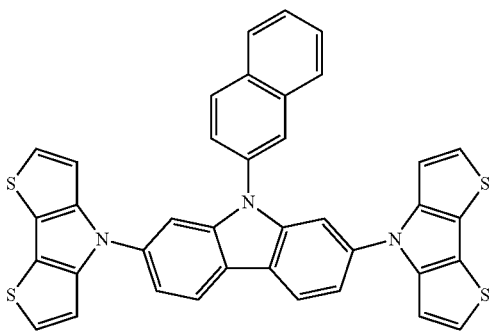
104
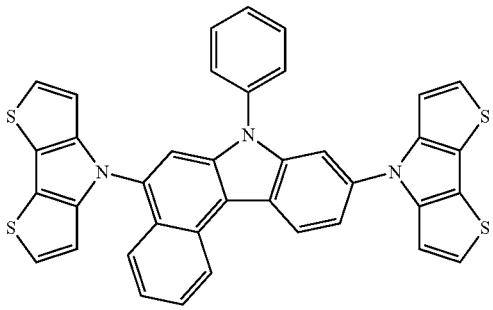
105
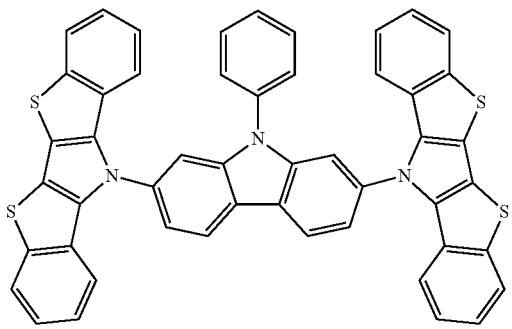

106
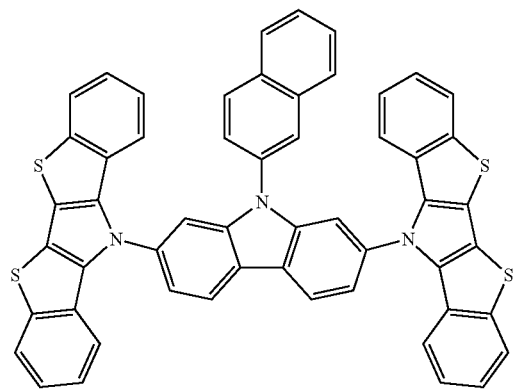
110
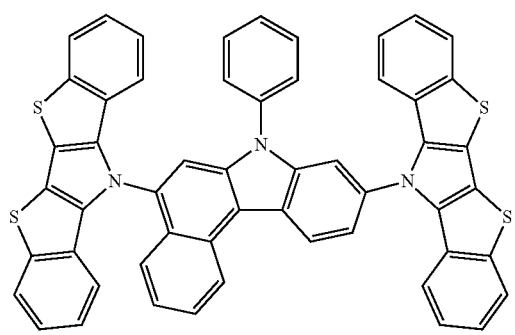
107
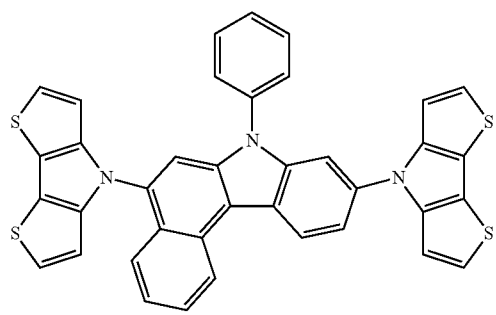
111
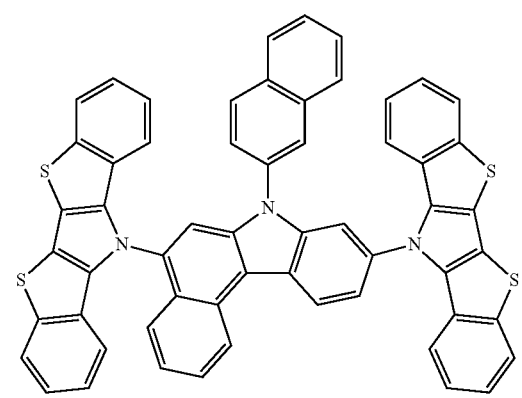
108
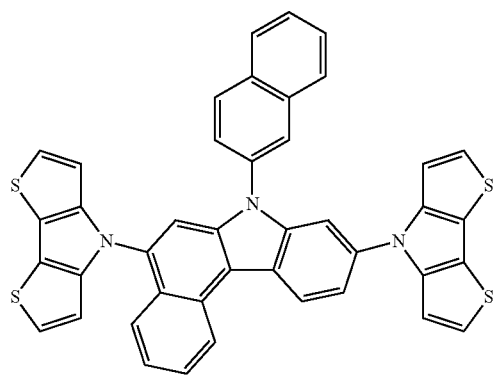
112
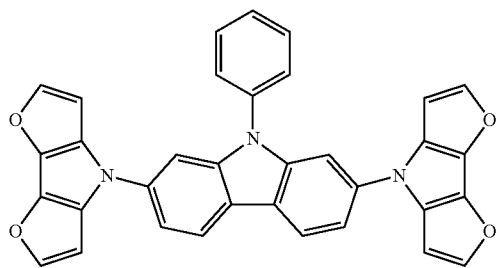
109
113

114
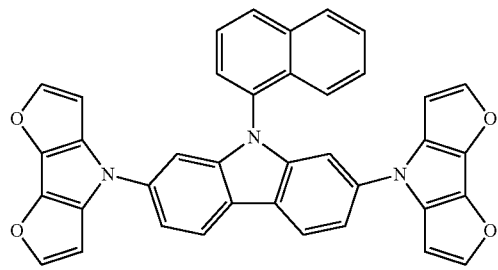
115
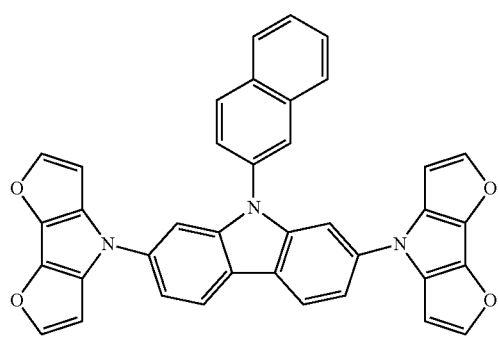
116
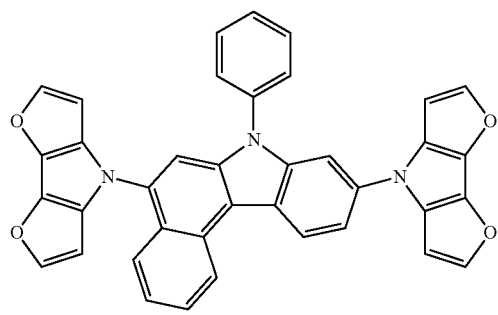
117
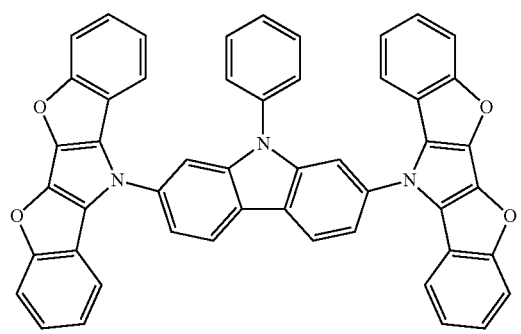
118
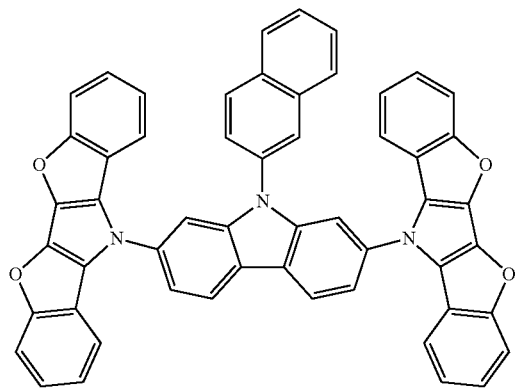
119
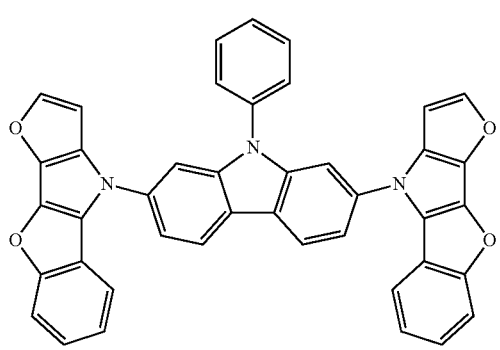
120
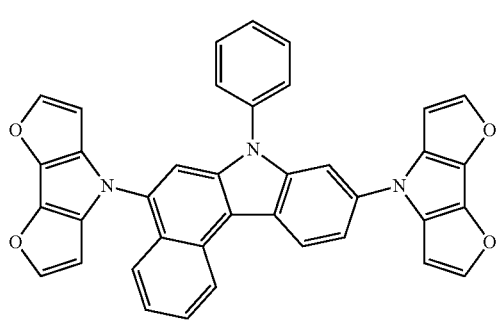
121
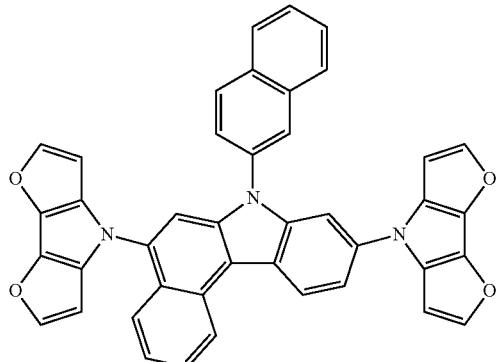

122
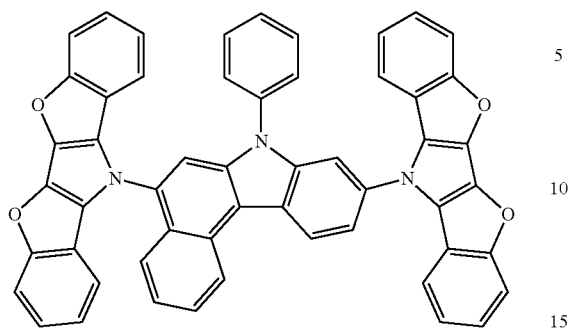
123
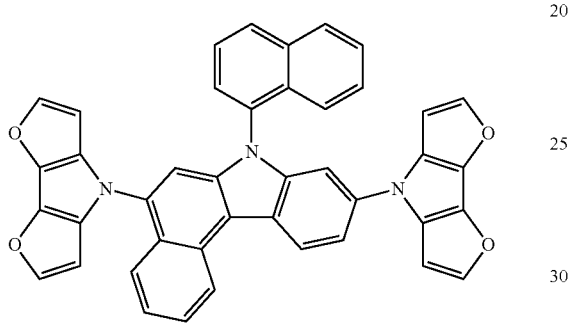
124
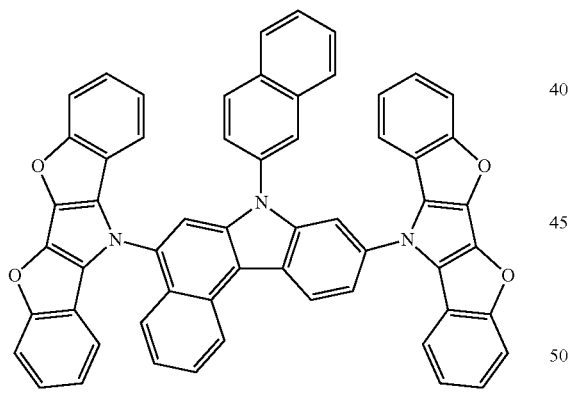
125
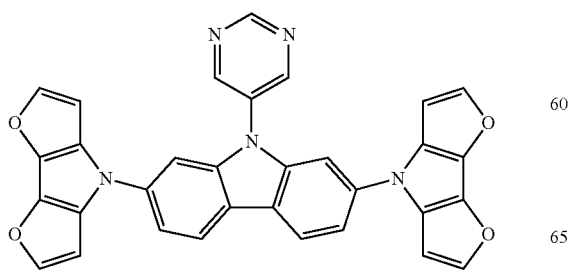
126
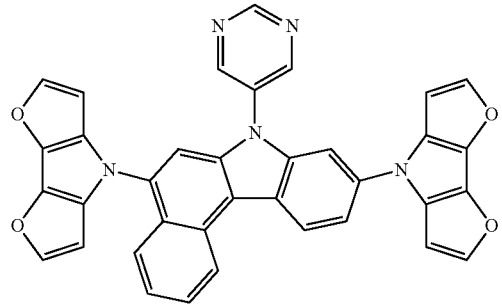
127
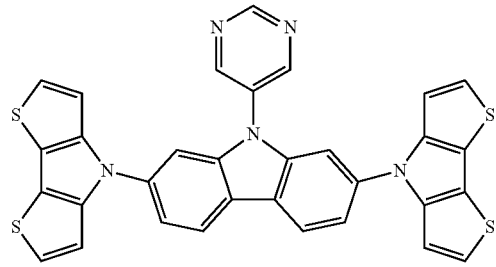
128
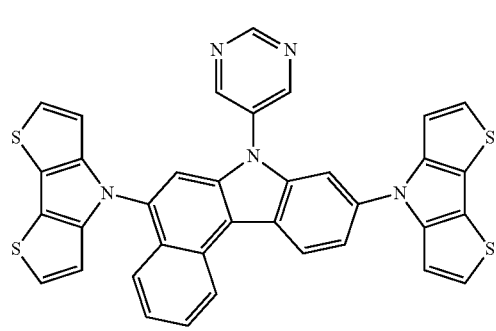
129
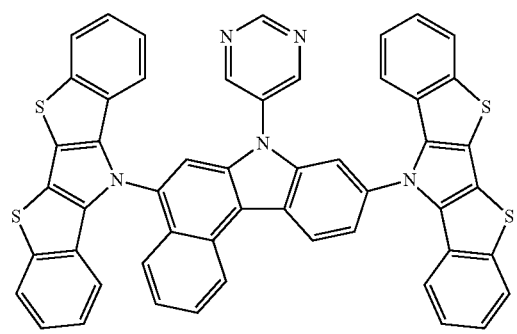

130
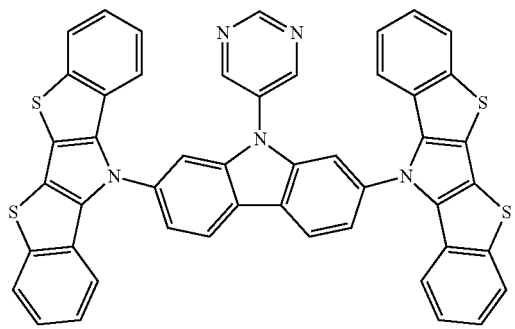
131
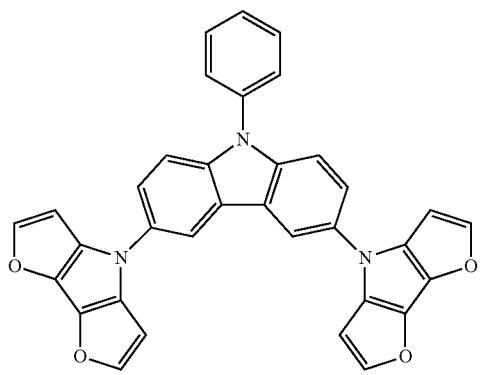
132
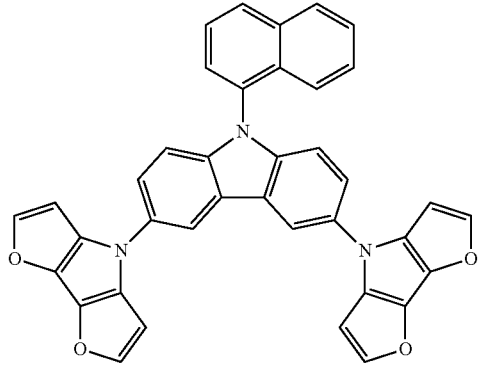
133
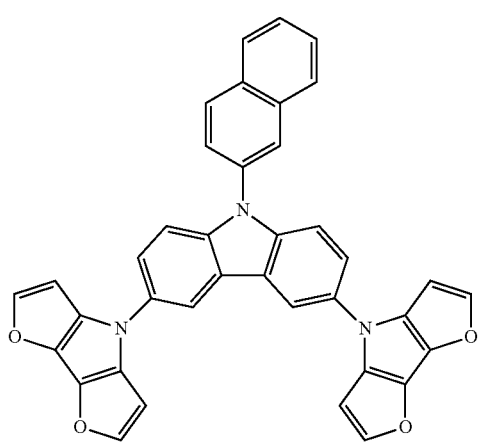
134
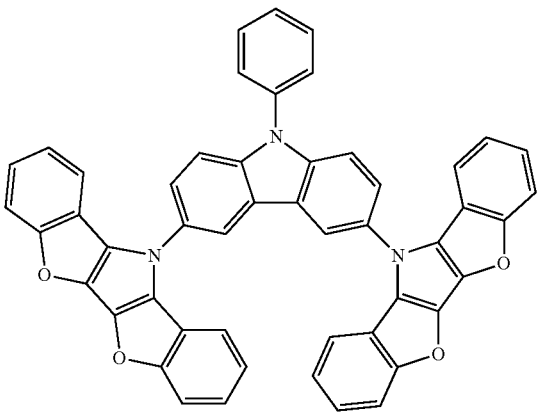
135
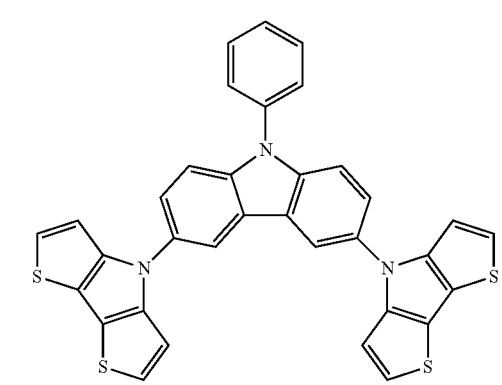
136
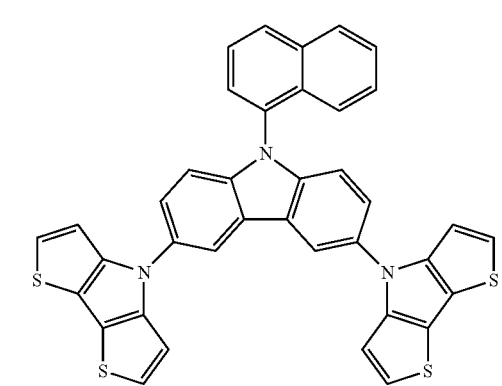
137
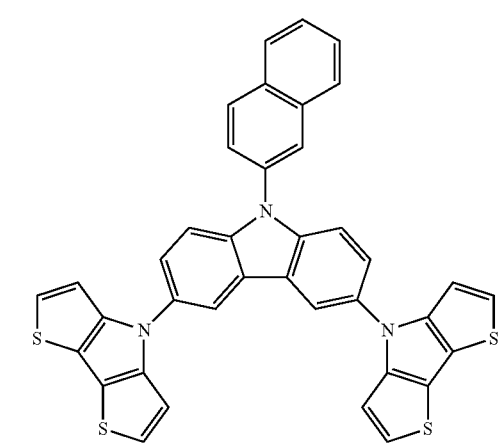

138
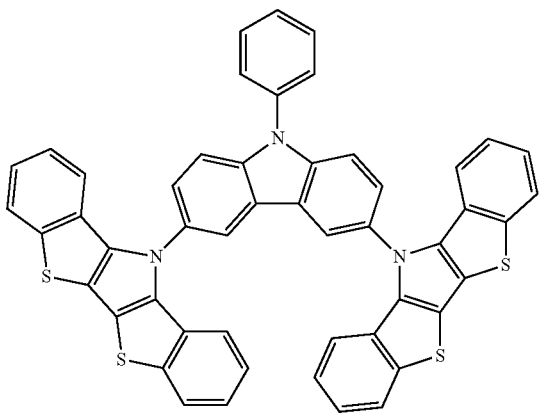
139
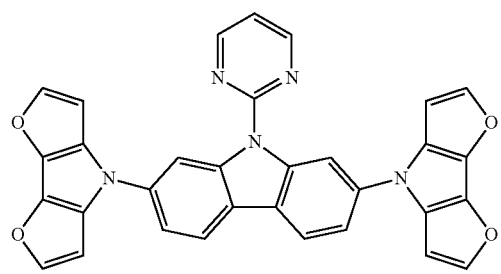
140
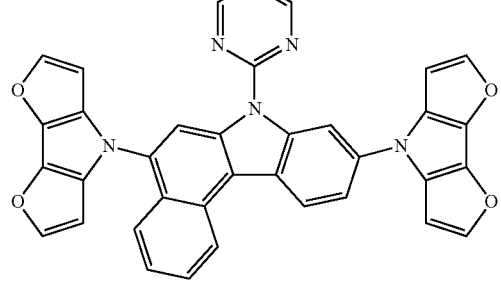
141
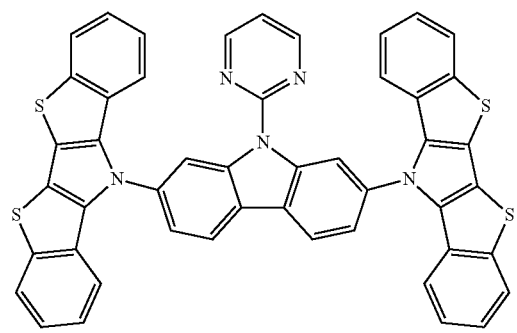
142
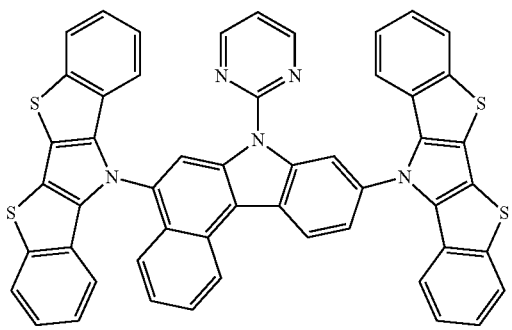
143
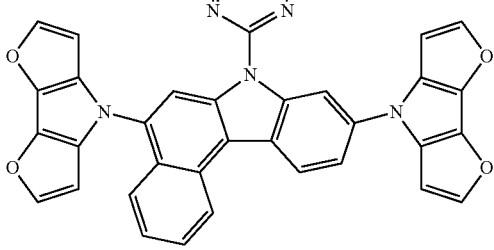
144
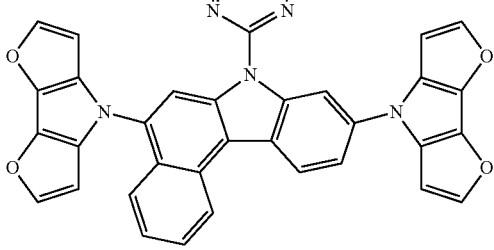
145
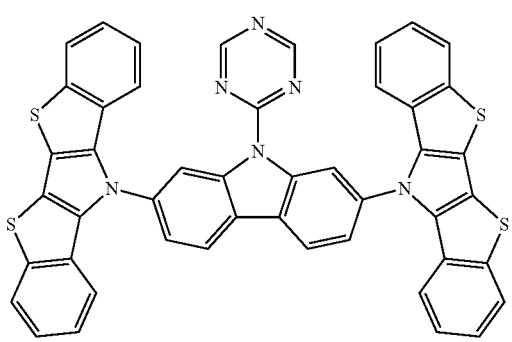

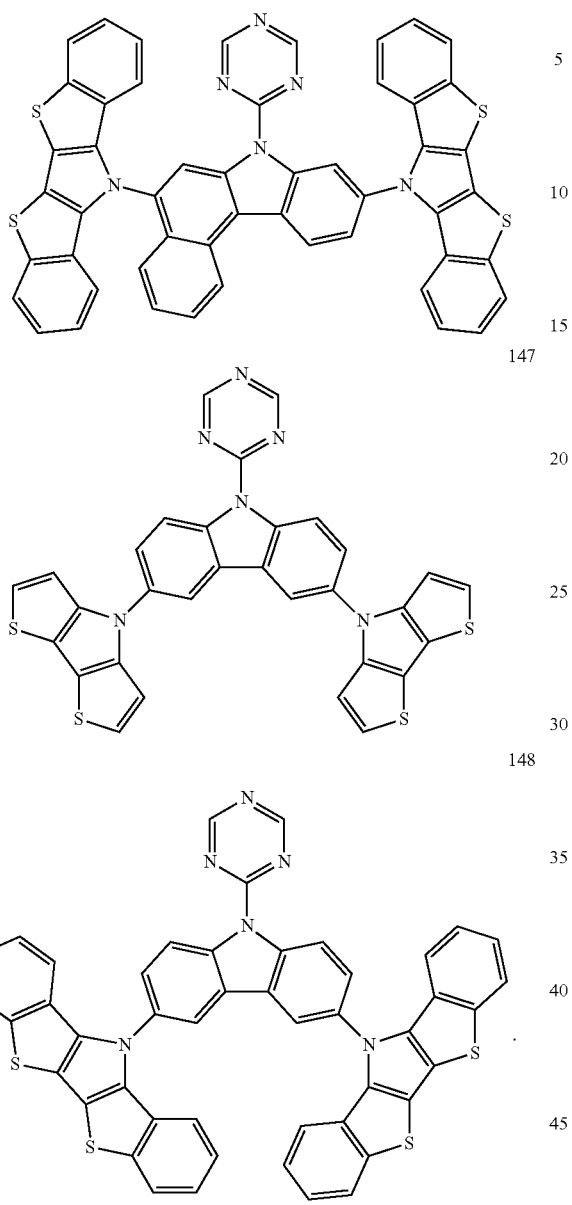
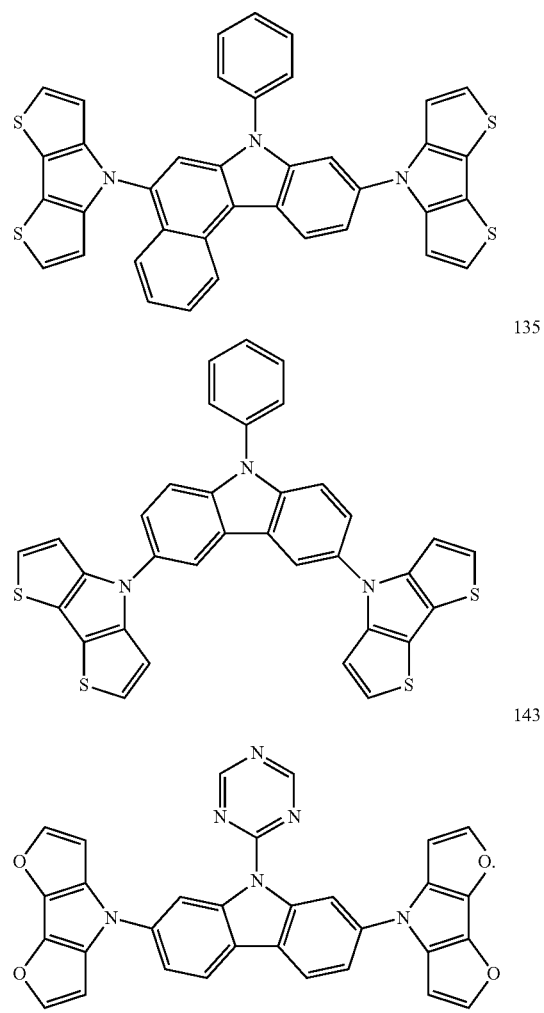

14. The condensed cyclic compound of claim 1, wherein the condensed cyclic compound of Formula 1 is represented by one of Compounds 101, 104, 135, or 143:

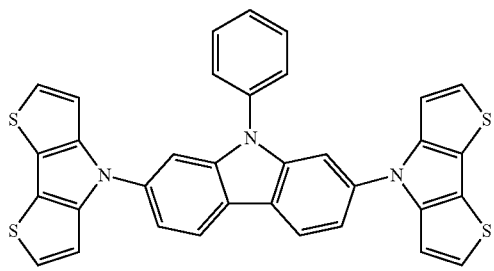

15. An organic light-emitting device comprising:
a first electrode;
a second electrode facing the first electrode; and
an organic layer between the first electrode and the second electrode and comprising an emission layer,
wherein the organic layer comprises the condensed cyclic compound of claim 1.

16. The organic light-emitting device of claim 15, wherein the organic layer further comprises:
a hole transport region between the first electrode and the emission layer; and
an electron transport region between the emission layer and the second electrode.

17. The organic light-emitting device of claim 16, wherein the hole transport region comprises at least one of an electron blocking layer, a hole transport layer, or a hole injection layer.

18. The organic light-emitting device of claim 16, wherein the electron transport region comprises at least one of a hole blocking layer, an electron transport layer or an electron injection layer.

19. The organic light-emitting device of claim 16, wherein the hole transport region comprises the condensed cyclic compound represented by Formula 1.

20. The organic light-emitting device of claim 16, wherein the electron transport region comprises the condensed cyclic compound represented by Formula 1.

\* \* \* \* \*